United States Patent
Hirota

(10) Patent No.: US 9,451,221 B2
(45) Date of Patent: *Sep. 20, 2016

(54) SOLID-STATE IMAGING DEVICE, METHOD FOR PROCESSING SIGNAL OF SOLID-STATE IMAGING DEVICE, AND IMAGING APPARATUS

(71) Applicant: Sony Corporation, Tokyo (JP)

(72) Inventor: Isao Hirota, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/707,729

(22) Filed: May 8, 2015

(65) Prior Publication Data

US 2015/0241611 A1  Aug. 27, 2015

Related U.S. Application Data

(63) Continuation of application No. 14/585,618, filed on Dec. 30, 2014, now Pat. No. 9,083,842, which is a continuation of application No. 13/847,957, filed on Mar. 20, 2013, now Pat. No. 8,947,564, which is a continuation of application No. 12/630,988, filed on Dec. 4, 2009, now Pat. No. 8,436,925.

(30) Foreign Application Priority Data

Dec. 8, 2008 (JP) .................................. 2008-311694
Dec. 8, 2008 (JP) .................................. 2008-311695

(51) Int. Cl.
*H04N 5/225* (2006.01)
*H04N 9/04* (2006.01)
(Continued)

(52) U.S. Cl.
CPC ............. *H04N 9/045* (2013.01); *G02B 5/20* (2013.01); *G02B 13/0015* (2013.01);
(Continued)

(58) Field of Classification Search
CPC .. G02B 5/20; G02B 13/0015; H04N 5/2254; H04N 9/045; H04N 9/646; H04N 9/45; H04N 9/07; H04N 9/077; H04N 11/00; G06T 7/408; H01L 31/02162
See application file for complete search history.

(56) References Cited

U.S. PATENT DOCUMENTS 6,380,539 B1 * 4/2002 Edgar ...................... 250/339.05
8,125,547 B2 * 2/2012 Oda et al. ...................... 348/277
(Continued)

FOREIGN PATENT DOCUMENTS

CN    101222642    7/2008
JP    2008-172289    7/2008

OTHER PUBLICATIONS

Official Action (with English translation) for Chinese Patent Application No. 201410410468.8 dated Nov. 23, 2015, 21 pages.
(Continued)

*Primary Examiner* — Aung S Moe
(74) *Attorney, Agent, or Firm* — Sheridan Ross P.C.

(57) ABSTRACT

A solid-state imaging device includes a color filter unit disposed on a pixel array unit including pixels two-dimensionally arranged in a matrix and a conversion processing unit disposed on a substrate having the pixel array unit thereon. The color filter unit has a color arrangement in which a color serving as a primary component of a luminance signal is arranged in a checkerboard pattern and a plurality of colors serving as color information components are arranged in the other area of the checkerboard pattern. The conversion processing unit converts signals that are output from the pixels of the pixel array unit and that correspond to the color arrangement of the color filter unit into signals that correspond to a Bayer arrangement and outputs the converted signals.

11 Claims, 62 Drawing Sheets

(51) Int. Cl.
G02B 5/20 (2006.01)
G02B 13/00 (2006.01)
G06T 7/40 (2006.01)
H04N 9/64 (2006.01)
H04N 5/3745 (2011.01)
H04N 9/77 (2006.01)

(52) U.S. Cl.
CPC .......... *G06T 7/408* (2013.01); *H04N 5/2254* (2013.01); *H04N 5/37457* (2013.01); *H04N 9/646* (2013.01); *H04N 9/77* (2013.01)

(56) References Cited

U.S. PATENT DOCUMENTS

| | | | |
|---|---|---|---|
| 8,947,564 B2* | 2/2015 | Hirota | 348/279 |
| 2007/0222882 A1* | 9/2007 | Kobayashi | 348/311 |
| 2009/0295973 A1* | 12/2009 | Oshikubo et al. | 348/311 |

OTHER PUBLICATIONS

Official Action (with English translation) for Korean Patent Application No. 10-2009-0121000 mailed Oct. 27, 2015, 9 pages.

* cited by examiner

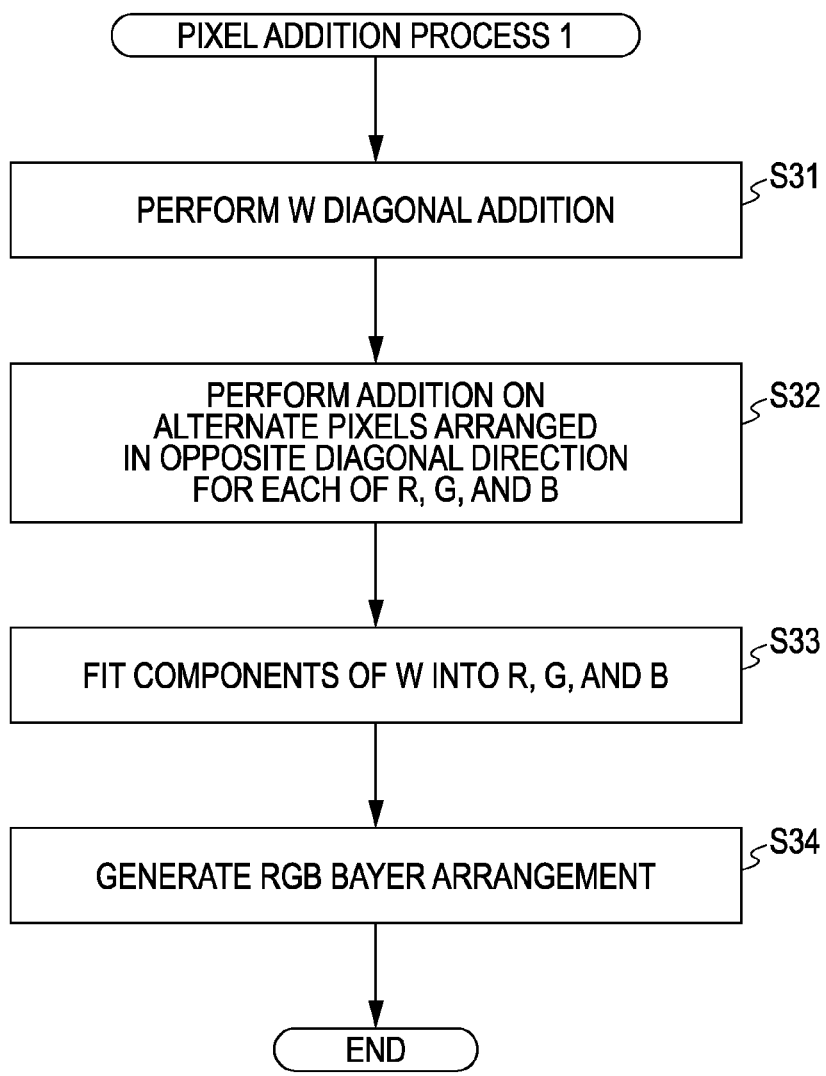

FIG. 40A
FIG. 40B
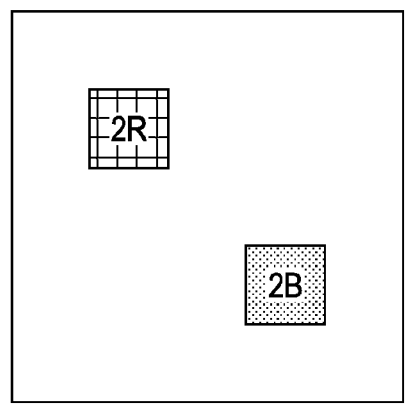
FIG. 40C
FIG. 40D
FIG. 40E
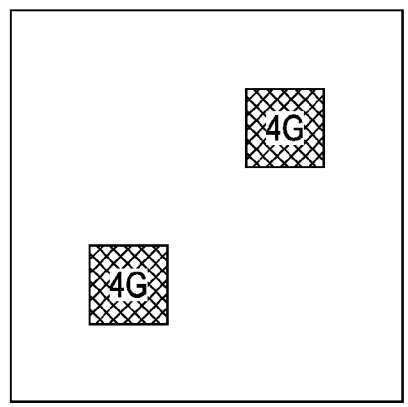
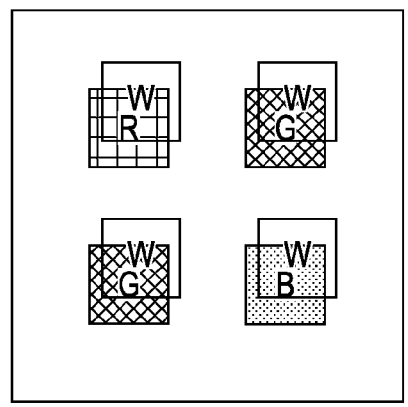

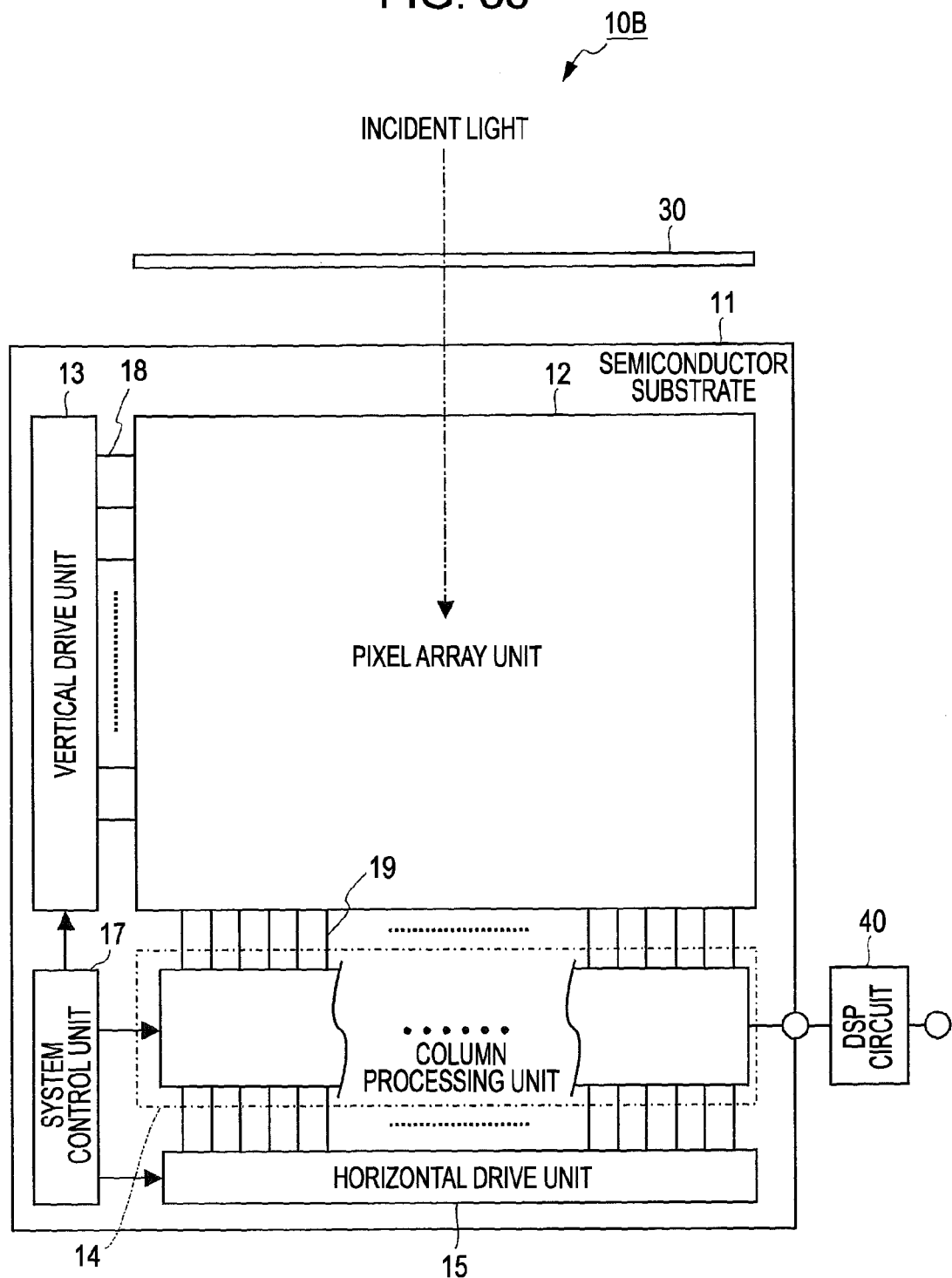

FIG. 55A
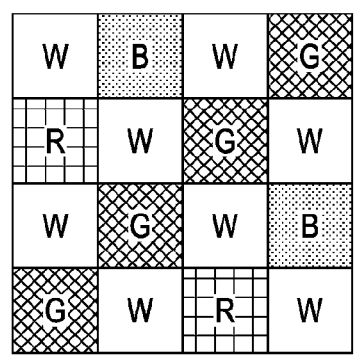
FIG. 55B
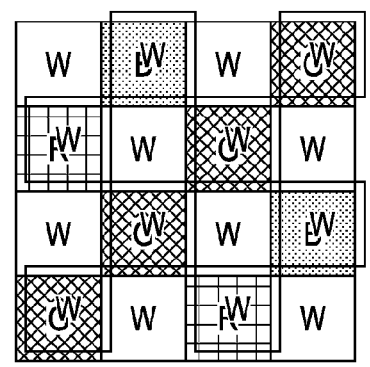
FIG. 55C
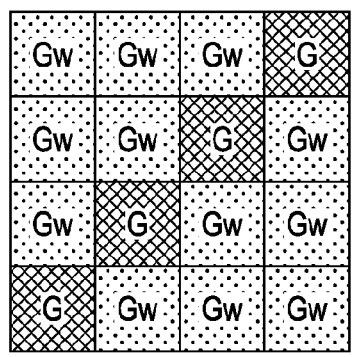 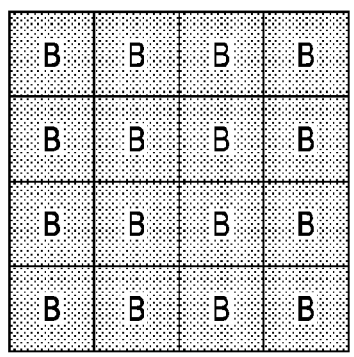 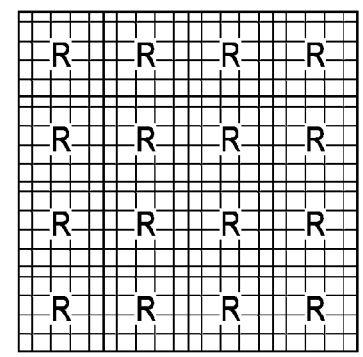

FIG. 61A
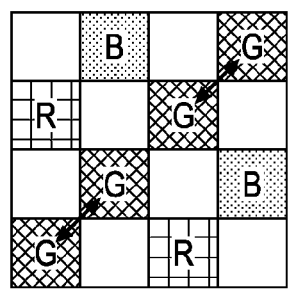 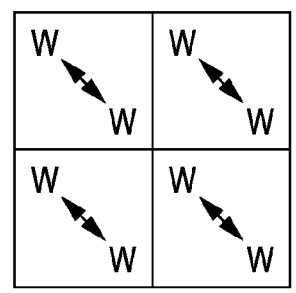
FIG. 61B
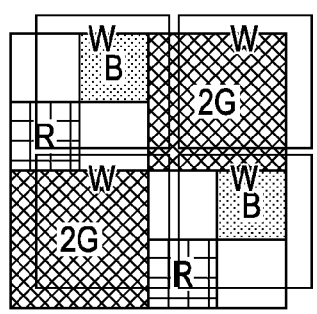 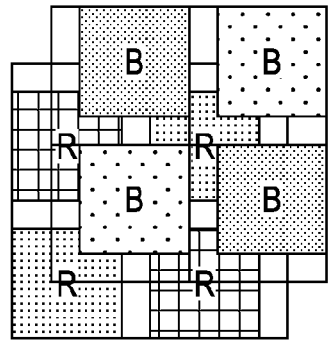 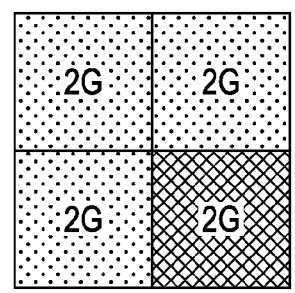
FIG. 61C
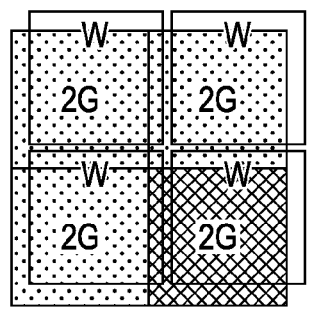 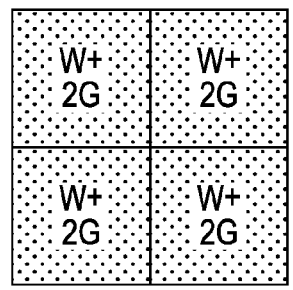

FIG. 64A
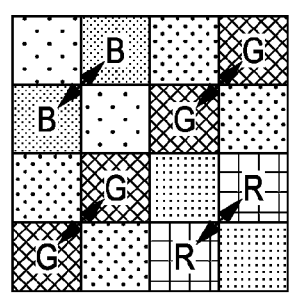 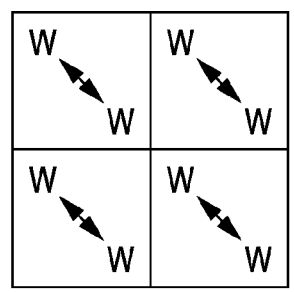
FIG. 64B
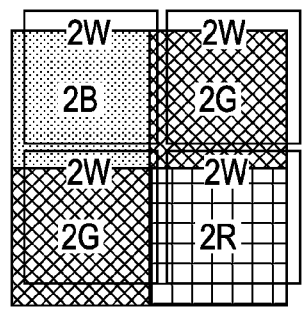 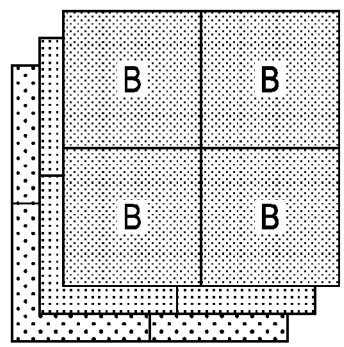

SOLID-STATE IMAGING DEVICE, METHOD FOR PROCESSING SIGNAL OF SOLID-STATE IMAGING DEVICE, AND IMAGING APPARATUS

CROSS-REFERENCE TO RELATED APPLICATIONS

This application is a continuation of U.S. patent application Ser. No. 14/585,618, filed Dec. 30, 2014, which is a continuation of U.S. patent application Ser. No. 13/847,957, filed Mar. 20, 2013, now U.S. Pat. No. 8,947,564, which is a continuation of U.S. patent application Ser. No. 12/630,988, filed Dec. 4, 2009, now U.S. Pat. No. 8,436,925, which claims priority to Japanese Patent Application Nos. 2008-311694 and 2008-311695, filed in the Japan Patent Office on Dec. 8, 2008, the entire disclosures of which are hereby incorporated herein by reference.

BACKGROUND OF THE INVENTION

1. Field of the Invention

The present invention relates to a solid-state imaging device, a method for processing a signal of the solid-state imaging device, and an imaging apparatus.

2. Description of the Related Art

In order to increase the sensitivity of solid-state imaging devices, a plurality of techniques in terms of a color filter array and signal processing of the color filter array have been developed (refer to, for example, Japanese Unexamined Patent Application Publication No. 2007-287891). One of the color filter arrays is a color filter array that uses a color (e.g., white (W)) serving as a primary component of a luminance signal. As color coding using a white color, white checkerboard color coding in which white is arranged in a checkerboard pattern is frequently used.

The output voltage of a color filter array using a white color is higher than that of a color filter array having an RGB Bayer arrangement that has been widely used. Accordingly, the sensitivity of a solid-state imaging device can be increased. Note that, in the RGB Bayer arrangement, green (G) is arranged in a checkerboard pattern. Red (R) and blue (B) are also arranged in a checkerboard pattern in the other area of the checkerboard pattern.

In solid-state imaging apparatuses using a color filter of an RGB Bayer arrangement, in order to convert an RGB signal into a YUV signal (Y: a luminance signal, U and V: color difference signals), computation for generating a Y signal is necessary. In the computation, for example, the following equation can be used:

$$Y = 0.29891 \times R + 0.58661 \times G + 0.11448 \times B$$

In general, this computation is performed by a digital signal processor (DSP) provided outside a substrate (a sensor chip) of the solid-state imaging apparatus. Accordingly, even in the solid-state imaging devices using a color filter array including a white color, computation for generating a luminance signal Y is performed by a DSP provided outside a sensor chip.

SUMMARY OF THE INVENTION

However, in signal processing performed by a solid-state imaging device including a color filter array including a white color, it is difficult to use existing DSPs designed for the RGB Bayer arrangement. Accordingly, it is necessary that a new DSP be developed if color coding is changed. If the DSP designed for the RGB Bayer arrangement is changed to a DSP for a white checkerboard pattern, enormous development cost is necessary. Since this development cost is reflected in the price of a camera module including the DSP, it is difficult to reduce the cost of the camera module. Consequently, the widespread use of color coding including a white color is hampered.

Accordingly, the present invention provides a solid-state imaging device, a method for processing a signal of the solid-state imaging device, and an imaging apparatus capable of using existing RGB Bayer arrangement DSPs when color coding in which a color serving as a primary component of a luminance signal is arranged in a checkerboard pattern is used.

In addition, by using filters of a white color which is a primary component of a luminance signal for a color filter array, the sensitivity of a solid-state imaging device can be increased. Furthermore, by improving the color arrangement or the signal processing method, the sensitivity of the color filter array using a white filter can be increased with a minimal decrease in resolution.

Accordingly, the present invention provides a solid-state imaging device including a color filter array of a novel color arrangement that can increase the sensitivity with a minimal decrease in resolution, a method for processing a signal of the solid-state imaging device, and an imaging apparatus including the solid-state imaging device.

According to an embodiment of the present invention, a solid-state imaging device includes a color filter unit disposed on a pixel array unit including pixels two-dimensionally arranged in a matrix, where the color filter unit has a color arrangement in which a color serving as a primary component of a luminance signal is arranged in a checkerboard pattern and a plurality of colors serving as color information components are arranged in the other area of the checkerboard pattern. The solid-state imaging device has a configuration in which signals that are output from the pixels of the pixel array unit and that correspond to the color arrangement of the color filter unit are converted into signals that correspond to a Bayer arrangement on a substrate having the pixel array unit thereon.

In the above-described configuration, since the color serving as the primary component of a luminance signal is arranged in a checkerboard pattern, signals of other colors of pixels adjacent to the color in the vertical direction and the horizontal direction can be restored using the signal of the color serving as the primary component of a luminance signal. Consequently, the efficiency of conversion from signals corresponding to the color arrangement of the color filter unit into signals corresponding to the Bayer arrangement can be increased. In addition, by outputting the signals corresponding to the Bayer arrangement from the substrate (a sensor chip) having the pixel array unit thereon, an existing DSP for the Bayer arrangement can be used as a downstream signal processing unit.

According to another embodiment of the present invention, a solid-state imaging device includes a color filter unit disposed on a pixel array unit including pixels two-dimensionally arranged in a matrix, where the color filter unit has a color arrangement in which filters of a first color serving as a primary component of a luminance signal are arranged in a checkerboard pattern, and filters of a second color serving as a primary component of the luminance signal for a series of four pixels form a group, and the groups are arranged so as to form a stripe pattern in one of a diagonal direction, a vertical direction, and a horizontal direction. The solid-state imaging device has a configuration to receive signals that are output from the pixels of the pixel array unit and that correspond to the color arrangement of the color filter unit and add a signal of a pixel of a filter of the second color adjacent to the pixel of a filter of the first color to a signal of the pixel of the filter of the first color.

The filters of the first and second colors serving as primary components of a luminance signal have a sensitivity higher than those of the other colors. Accordingly, in the color arrangement in which the filters of the first color are arranged in a checkerboard pattern, a series of four filters of the second color form a group, and the groups are arranged so as to form a stripe pattern in one of a diagonal direction, a vertical direction, and a horizontal direction, by adding the signal of a pixel having the filter of the second color adjacent to a pixel having the filter of the first color to the signal of the pixel having the filter of the first color and using the sum as a primary component of a luminance signal, the intensity of the luminance signal can be increased.

According to the embodiments of the present invention, even when the color coding is changed, an existing DSP for RGB Bayer arrangement can be still used. Accordingly, the development of a new DSP that is significantly costly is not necessary.

In addition, according to the embodiments of the present invention, the signal of a pixel having a filter of a second color adjacent to a pixel having a filter of a first color is added to the signal of the pixel having a filter of the first color, and the sum is used as a primary component of a luminance signal. Thus, the intensity of the luminance signal can be increased. As a result, the sensitivity can be increased with a minimal decrease in resolution.

BRIEF DESCRIPTION OF THE DRAWINGS

FIG. 4 is a color arrangement diagram illustrating color coding according to a first example of the first exemplary embodiment;

FIG. 5 is a color arrangement diagram illustrating color coding according to a second example of the first exemplary embodiment;

FIG. 6 is a color arrangement diagram illustrating color coding according to a third example of the first exemplary embodiment;

FIG. 7 is a color arrangement diagram illustrating color coding according to a fourth example of the first exemplary embodiment;

FIG. 8 is a color arrangement diagram illustrating color coding according to a fifth example of the first exemplary embodiment;

FIG. 9 is a color arrangement diagram illustrating color coding according to a sixth example of the first exemplary embodiment;

FIG. 10 is a color arrangement diagram illustrating color coding according to a seventh example of the first exemplary embodiment;

FIG. 11 is a color arrangement diagram illustrating color coding according to an eighth example of the first exemplary embodiment;

FIG. 17 is a flowchart illustrating an exemplary process flow of a pixel addition process 1 in the case of the color coding according to the first example of the first exemplary embodiment;

FIGS. 40A to 40E are schematic illustrations of a pixel addition process performed in the case of the color coding according to the seventh example of the first exemplary embodiment;

FIG. 45 is a color arrangement diagram illustrating color coding according to a first example of the second exemplary embodiment;

FIG. 46 is a color arrangement diagram illustrating color coding according to a second example of the second exemplary embodiment;

FIG. 53 is a schematic illustration of an exemplary system configuration of a CMOS image sensor according to a third exemplary embodiment of the present invention;

FIGS. 55A to 55C are schematic illustrations of the color conversion process 1 performed at a time of full scanning in the case of the color coding according to the first example of the third exemplary embodiment;

FIGS. 61A to 61C are schematic illustrations of the pixel addition process 2 performed in the case of the color coding according to the first example of the third exemplary embodiment;

FIGS. 62A and 62B are schematic illustrations of a color conversion process 1 performed in the case of the color coding according to a second example of the third exemplary embodiment;

FIGS. 64A and 64B are schematic illustrations of a pixel addition process 1 performed in the case of the color coding according to the second example of the third exemplary embodiment;

FIG. 66 is a color arrangement diagram illustrating color coding according to a modification of the first example;

FIG. 67 is a color arrangement diagram illustrating color coding according to a modification of the second example.

DESCRIPTION OF THE PREFERRED EMBODIMENTS

Various exemplary embodiments of the present invention are described in detail below with reference to the accompanying drawings. The descriptions are made in the following order:

1. Exemplary Embodiment
1-1. System Configuration
1-2. Color Coding of Color Filter Array
1-3. Example of Color Coding
1-4. Sensitivity Ratio W:G:R:B
1-5. Color Conversion Process
2. Example of Application (Imaging Apparatus)

1. First Exemplary Embodiment

1-1. System Configuration

Figure 1:
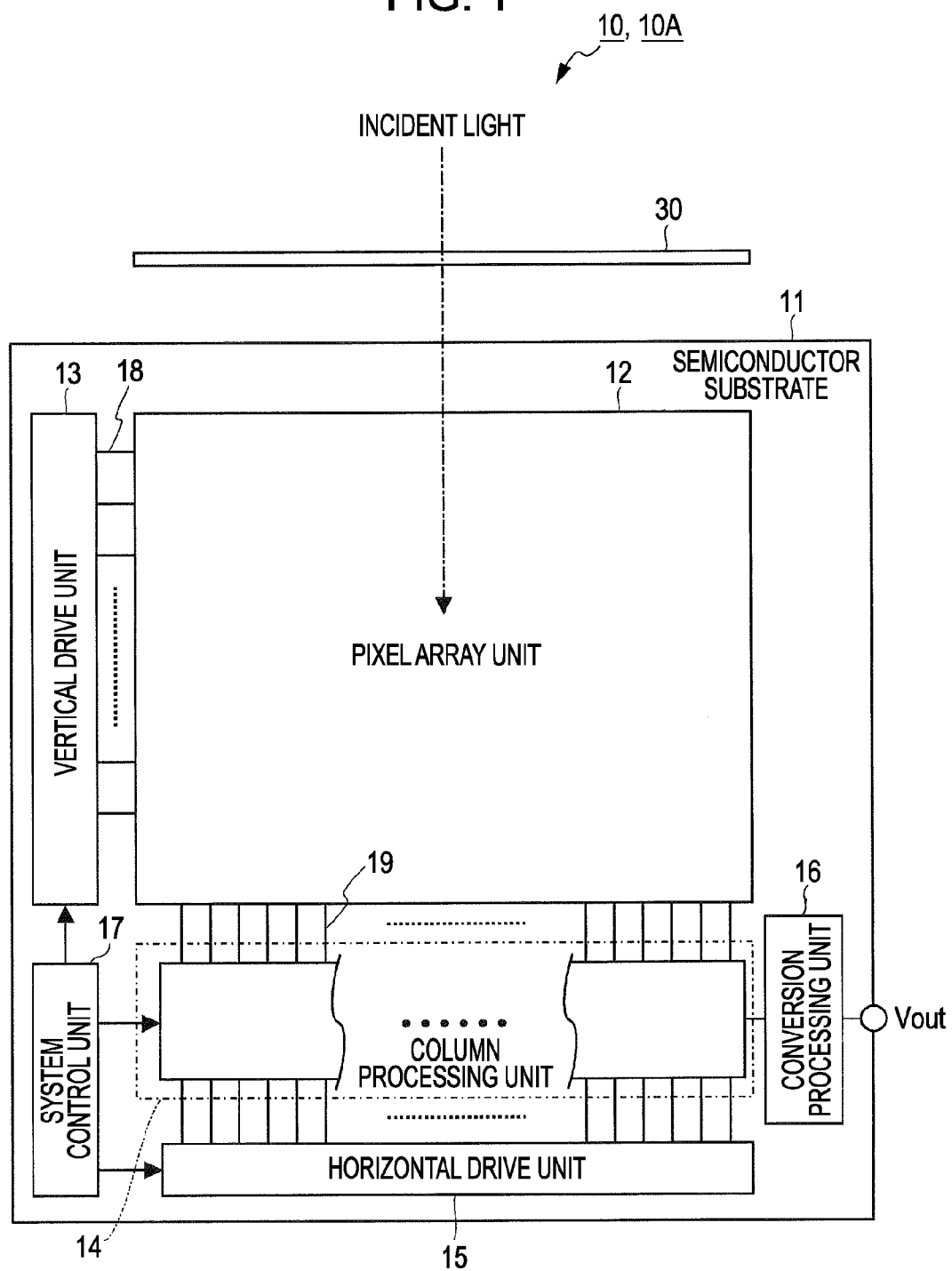
FIG. 1 is a schematic illustration of an exemplary system configuration of a CMOS image sensor according to first and second exemplary embodiments of the present invention.

FIG. 1 is a schematic illustration of an exemplary system configuration of a solid-state imaging device (e.g., a CMOS image sensor, which is an example of an X-Y addressing solid-state imaging device) according to a first exemplary embodiment of the present invention.

According to the first embodiment, a CMOS image sensor 10 includes a semiconductor substrate (hereinafter also referred to as a "sensor chip") 11. The sensor chip 11 includes a pixel array unit 12 formed thereon and a peripheral circuit unit integrated thereon. For example, the peripheral circuit unit includes a vertical drive unit 13, a column processing unit 14, a horizontal drive unit 15, a conversion processing unit 16, and a system control unit 17.

The pixel array unit 12 includes a plurality of unit pixels (not shown), each including a photoelectric conversion element, two-dimensionally arranged in an array. The unit pixel (hereinafter also simply referred to as a "pixel") photoelectrically converts visible light incident thereon into electrical charge in accordance with the intensity of the visible light. A color filter array 30 is provided on the pixel array unit 12 on the side of a light receiving surface (a light incident surface). One of the key features of the present exemplary embodiment is the color coding of the color filter array 30. The color coding of the color filter array 30 is described in more detail below.

Furthermore, in the pixel array unit 12, a pixel drive line 18 is disposed in the left-right direction of FIG. 1 (a direction in which the pixels of a pixel row are arranged or the horizontal direction) for each of the rows of the pixel array. Similarly, a vertical signal line 19 is disposed in the up-down direction of FIG. 1 (a direction in which the pixels of a pixel column are arranged or the vertical direction) for each of the columns of the pixel array. In FIG. 1, while only one pixel drive line 18 is illustrated, the number of the pixel drive lines 18 is not limited to one. One end of the pixel drive line 18 is connected to an output terminal corresponding to one of the rows of the vertical drive unit 13.

For example, the vertical drive unit 13 includes a shift register and an address decoder. Although the detailed configuration thereof is not shown in FIG. 1, the vertical drive unit 13 includes a readout scanning system and a sweeping scanning system. The readout scanning system sequentially scans the unit pixels from which signals are read by a row-by-row basis.

In contrast, prior to the readout scanning operation of the readout row performed by the readout scanning system by the time determined by a shutter speed, the sweeping scanning system performs sweeping scanning so that unnecessary electrical charge is swept (reset) out of the photoelectric conversion elements of the unit pixels in the readout row. By sweeping (resetting) the unnecessary electrical charge using the sweeping scanning system, a so-called electronic shutter operation is performed. That is, in the electronic shutter operation, the photocharges of the photoelectric conversion element is discarded, and a new exposure operation (accumulation of light electrical charge) is started.

A signal read through a readout operation performed by the readout scanning system corresponds to the amount of light made incident after the immediately previous readout operation or electronic shutter operation is performed. In addition, a period of time from a readout time point of the immediately previous readout operation or a sweeping time point of the electronic shutter operation to the readout time point of the current readout operation corresponds to an accumulation time (an exposure time) of the light electrical charge in the unit pixel.

A signal output from each of the unit pixels in the pixel row selected and scanned by the vertical drive unit 13 is supplied to the column processing unit 14 via the corresponding one of the vertical signal lines 19. For each of the pixel columns of the pixel array unit 12, the column processing unit 14 performs predetermined signal processing on the analog pixel signal output from the pixel in the selected row.

An example of the signal processing performed by the column processing unit 14 is a correlated double sampling (CDS) process. In the CDS process, the reset level and the signal level output from each of the pixels in the selected row are retrieved, and the difference between the levels is computed. Thus, the signals of the pixels in one of the rows are obtained. In addition, fixed pattern noise of the pixels is removed. The column processing unit 14 may have an analog-to-digital (A/D) conversion function for converting the analog pixel signal into a digital format.

For example, the horizontal drive unit 15 includes a shift register and an address decoder. The horizontal drive unit 15 sequentially selects and scans a circuit portion corresponding to a pixel column of the column processing unit 14. Each of the pixel columns is sequentially processed by the column processing unit 14 through the selection scanning operation performed by the horizontal drive unit 15 and is sequentially output.

The conversion processing unit 16 performs computation and converts signals corresponding to the color arrangement of the color filter array (the color filter unit) 30 and output from the pixels of the pixel array unit 12 into signals corresponding to the Bayer arrangement. Another of the key features of the present embodiment is that the conversion processing unit 16 is mounted on the substrate on which the pixel array unit 12 is formed, that is, the sensor chip 11, a color conversion process is performed in the sensor chip 11, and a signal corresponding to the Bayer arrangement is output from the sensor chip 11. The color conversion process performed by the conversion processing unit 16 is described in more detail below.

As widely used, the term "Bayer arrangement" represents a color arrangement in which a color serving as a primary color information component of a luminance signal for high resolution is arranged in a checkerboard pattern, and the other two colors serving as color information components of the luminance signal for not-so-high resolution are arranged in the other area of the checkerboard pattern. In a basic color coding form of the Bayer arrangement, green (G) that has high contribution of the luminance signal is arranged in a checkerboard pattern, and red (R) and blue (B) are arranged in the other area of the checkerboard pattern.

The system control unit 17 receives a clock provided from outside the sensor chip 11 and data for indicating an operating mode. In addition, the system control unit 17 outputs data representing internal information of the CMOS image sensor 10. Furthermore, the system control unit 17 includes a timing generator that generates a variety of timing signals. The system control unit 17 controls driving of the vertical drive unit 13, the column processing unit 14, the horizontal drive unit 15, and the conversion processing unit 16 using the variety of timing signals generated by the timing generator.

Circuit Configuration of Unit Pixel

Figure 2:
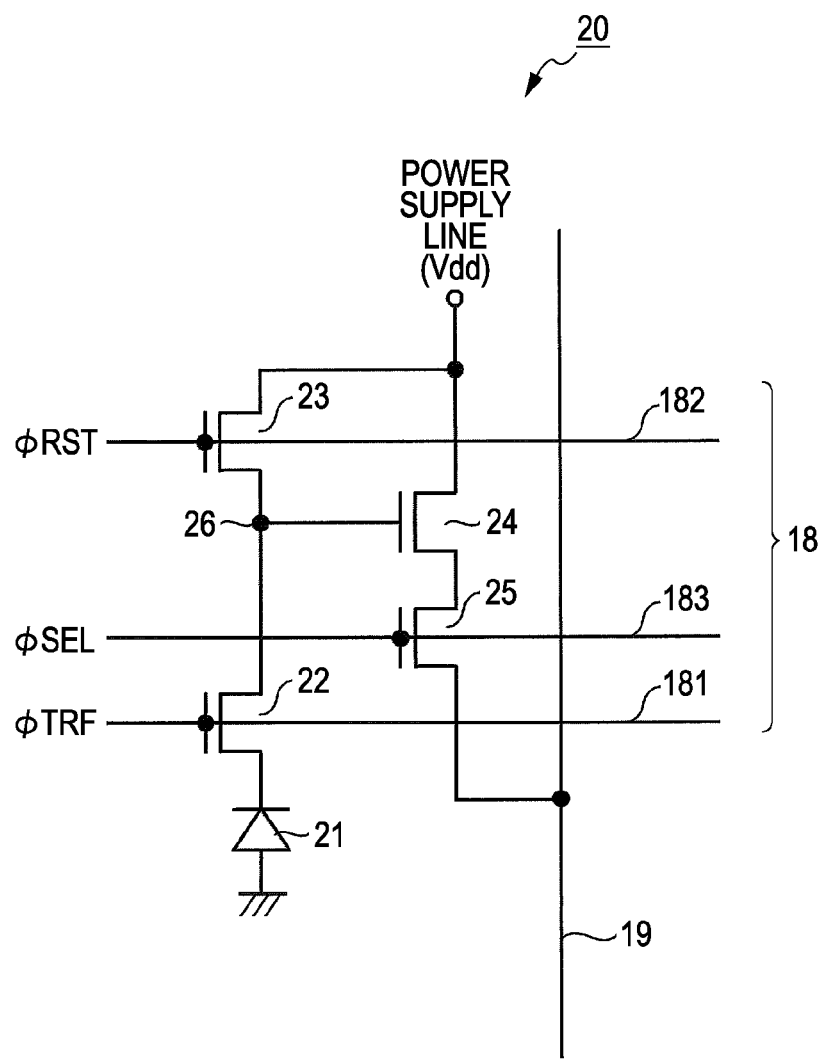
FIG. 2 is a circuit diagram illustrating an exemplary circuit configuration of a unit pixel.

FIG. 2 is an exemplary circuit diagram of a unit pixel 20. As shown in FIG. 2, the unit pixel 20 illustrated in the exemplary circuit diagram includes a photoelectric conversion element (e.g., a photodiode 21) and four transistors (e.g., a transfer transistor 22, a reset transistor 23, an amplifying transistor 24, and a selection transistor 25).

In this example, N-channel MOS transistors are used for the transfer transistor 22, the reset transistor 23, the amplifying transistor 24, and the selection transistor 25. However, the combination of a conductive type using the transfer transistor 22, the reset transistor 23, the amplifying transistor 24, and the selection transistor 25 is only an example, and the combination is not limited thereto.

For example, as the pixel drive line 18, three drive lines, that is, a transfer line 181, a reset line 182, and a selection line 183 are provided to each of the unit pixels 20 in the same pixel row. One end of the transfer line 181, one end of the reset line 182, and one end of the selection line 183 are connected to an output terminal corresponding to one of the pixel rows of the vertical drive unit 13.

An anode electrode of the photodiode 21 is connected to a negative power supply (e.g., the ground). The photodiode 21 photoelectrically converts received light into photocharges (photoelectrons in this exemplary embodiment) in accordance with the amount of received light. A cathode electrode of the photodiode 21 is connected to the gate electrode of the amplifying transistor 24 via the transfer transistor 22. A node 26 electrically connected to the gate electrode of the amplifying transistor 24 is referred to as a "floating diffusion (FD) unit".

The transfer transistor 22 is connected between the cathode electrode of the photodiode 21 and the FD unit 26. When a transfer pulse φTRF having an active high level (e.g., a Vdd level) (hereinafter referred to as a "high active transfer pulse") is supplied to a gate electrode of the transfer transistor 22 via the transfer line 181, the transfer transistor 22 is turned on. Thus, the transfer transistor 22 transfers the photocharges photoelectrically converted by the photodiode 21 to the FD unit 26.

A drain electrode of the reset transistor 23 is connected to a pixel power supply Vdd. The source electrode of the reset transistor 23 is connected to the FD unit 26. Before the signal charge is transferred from the photodiode 21 to the FD unit 26, a high active reset pulse φRST is supplied to a gate electrode of the reset transistor 23 via the reset line 182. When the reset pulse φRST is supplied to the reset transistor 23, the reset transistor 23 is turned on. Thus, the reset transistor 23 resets the FD unit 26 by discarding the electrical charge of the FD unit 26 to the pixel power supply Vdd.

The gate electrode of the amplifying transistor 24 is connected to the FD unit 26. A drain electrode of the amplifying transistor 24 is connected to the pixel power supply Vdd. After the FD unit 26 is reset by the reset transistor 23, the amplifying transistor 24 outputs the potential of the FD unit 26 in the form of a reset signal (a reset level) Vreset. In addition, after the signal charge is transferred by the transfer transistor 22, the amplifying transistor 24 outputs the potential of the FD unit 26 in the form of a light accumulation signal (a signal level) Vsig.

For example, a drain electrode of the selection transistor 25 is connected to the source electrode of the amplifying transistor 24. The source electrode of the selection transistor 25 is connected to the vertical signal line 17. When a high active selection pulse φSEL is supplied to the gate electrode of the selection transistor 25 via the selection line 163, the selection transistor 25 is turned on. Thus, the selection transistor 25 causes the unit pixel 20 to enter a selected mode so that a signal output from the amplifying transistor 24 is relayed to the vertical signal line 17.

Note that a circuit configuration in which the selection transistor 25 is connected between the pixel power supply Vdd and the drain of the amplifying transistor 24 may be employed.

It should be noted that the pixel structure of the unit pixel 20 is not limited to the above-described four-transistor pixel structure. For example, the unit pixel 20 may have a three-transistor pixel structure in which the functions of the amplifying transistor 24 and the selection transistor 25 are performed by one transistor. Thus, any configuration of a pixel circuit can be employed.

In general, in order to increase a frame rate when a moving image is captured, pixel addition in which signals output from a plurality of neighboring pixels are summed and read out is performed. The pixel addition is performed in a pixel, signal lines, the column processing unit 14, or a downstream signal processing unit. In the present embodiment, for example, a pixel structure in which four pixels arranged so as to be adjacent to one another in the vertical direction and the horizontal direction is described.

Figure 3:
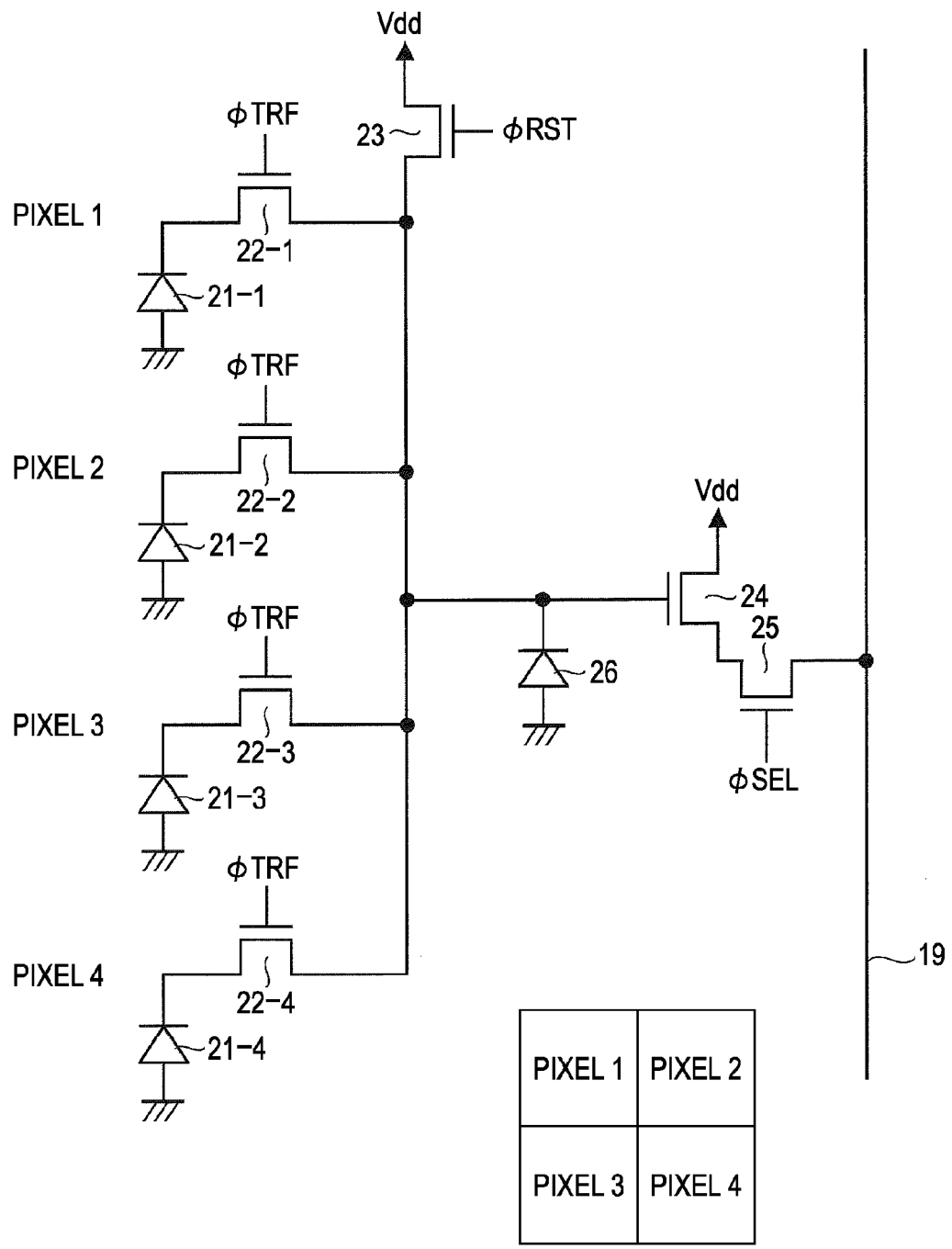
FIG. 3 is a circuit diagram illustrating an exemplary configuration of a circuit that allows pixel addition for four neighboring pixels to be performed in the pixels.

FIG. 3 is a circuit diagram of an exemplary configuration of a circuit that allows pixel addition for four neighboring pixels to be performed in the pixels. The same numbering will be used in describing FIG. 3 as was utilized above in describing FIG. 2, where appropriate.

In FIG. 3, the photodiodes 21 of the four pixels arranged so as to be adjacent to one another in the vertical direction and the horizontal direction are denoted as photodiodes 21-1, 21-2, 21-3, and 21-4. Four transfer transistors 22-1, 22-2, 22-3, and 22-4 are provided to the photodiodes 21-1, 21-2, 21-3, and 21-4, respectively. In addition, the one reset transistor 23, the one amplifier transistor 24, and the one selection transistor 25 are used.

That is, one of the electrodes of the transfer transistor 22-1, one of the electrodes of the transfer transistor 22-2, one of the electrodes of the transfer transistor 22-3, and one of the electrodes of the transfer transistor 22-4 are connected to the cathode electrode of the photodiode 21-1, the cathode electrode of the photodiode 21-2, the cathode electrode of the photodiode 21-2, and the cathode electrode of the photodiode 21-2, respectively. The other electrode of the transfer transistor 22-1, the other electrode of the transfer transistor 22-2, the other electrode of the transfer transistor 22-3, and the other electrode of the transfer transistor 22-4 are commonly connected to the gate electrode of the amplifier transistor 24. In addition, the FD unit 26 that is shared by the photodiodes 21-1, 21-2, 21-3, and 21-4 is electrically connected to the gate electrode of the amplifier transistor 24. The drain electrode of the reset transistor 23 is connected to the pixel power supply Vdd, and the source electrode of the reset transistor 23 is connected to the FD unit 26.

In the above-described pixel structure that supports the pixel addition for four neighboring pixels, by providing the transfer pulse φTRF to the four transfer transistors 22-1, 22-2, 22-3, and 22-4 at the same time, pixel addition for four neighboring pixels can be performed. That is, the signal charges transferred from the photodiodes 21-1, 21-2, 21-3, and 21-4 to the FD unit 26 by the four transfer transistors 22-1, 22-2, 22-3, and 22-4 are summed by the FD unit 26.

In contrast, by providing the transfer pulse φTRF to the four transfer transistors 22-1, 22-2, 22-3, and 22-4 at different points of time, signal output can be performed on a pixel-by-pixel basis. That is, when a moving image is captured, the frame rate can be increased by performing pixel addition. In contrast, when a still image is captured, the resolution can be increased by independently reading the signals of all of the pixels.

1-2. Color Coding of Color Filter Array

The color coding of the color filter array 30 which is one of the features of the present exemplary embodiment is described next.

According to the present exemplary embodiment, the color filter array 30 employs color coding in which a color serving as a primary color information component of a luminance signal is arranged in a checkerboard pattern, and a plurality of the other colors are arranged in the other area of the checkerboard pattern. In the present embodiment, the primary color of a luminance signal is, for example, one of white (W), green (G), and another spectral component of the luminance signal.

Since a W filter has a sensitivity about twice that of a G filter (the output level of a W filter is higher than that of a G filter), a high S/N ratio can be obtained. However, since a W filter contains various color information, a false color which is different from the original color of a subject tends to appear. In contrast, although a G filter has sensitivity lower than that of a W filter, a G filter produces few false colors. That is, there is a trade-off between the sensitivity and generation of a false color.

When W filters serving as filters of a primary color information component are arranged in a checkerboard pattern, R, G, and B filters are arranged in the other areas of the checkerboard pattern as filters of the other color information components. In contrast, when G filters serving as filters of a primary color information component are arranged in a checkerboard pattern, R and B filters are arranged in the other areas of the checkerboard pattern as filters of the other color information components.

In this way, by using, for the color filter array 30, color coding in which W filters for the primary color of a luminance signal are arranged in a checkerboard pattern, the sensitivity of the CMOS image sensor 10 can be increased, since the W filter has a sensitivity higher than that of a filter of another color. In contrast, by using, for the color filter array 30, color coding in which G filters for the primary color of a luminance signal are arranged in a checkerboard pattern, the color reproducibility of the CMOS image sensor 10 can be increased, since the G filter produces few false colors.

In addition, when the color filter array 30 using either one of the color coding methods is used, a signal corresponding to the color arrangement is converted into a signal corresponding to the Bayer arrangement by the sensor chip 11. At that time, since the color serving as the primary component of a luminance signal is arranged in a checkerboard pattern, signals of other colors of pixels adjacent to the color in the vertical direction and the horizontal direction can be restored using the signal of the color serving as the primary component of a luminance signal. Consequently, the efficiency of color conversion performed by the conversion processing unit 16 can be increased.

Furthermore, by outputting the signals corresponding to the Bayer arrangement from the sensor chip 11, an existing DSP for the Bayer arrangement can be used as a downstream signal processing unit. Basically, the DSP for the Bayer arrangement generates a luminance signal Y and two color difference signals U(B−Y) and V(R−Y) using the signal output from the sensor chip 11 and corresponding to the Bayer arrangement.

In this way, since an existing DSP for the Bayer arrangement can be used, development of a new DSP that is significantly costly is not necessary even when the color coding of the color filter array 30 is changed. Accordingly, a camera module including a DSP can be produced at a low cost. As a result, the widespread use of the color filter array 30 using, in particular, a W filter can be expected.

1-3. Examples of Color Coding of Color Filter Array

Examples of color coding that facilitate conversion from a signal corresponding to a color arrangement in which filters of a color serving as a primary component of a luminance signal are arranged in a checkerboard pattern to a signal corresponding to an RGB Bayer arrangement are described in detail below.

First Example of First Exemplary Embodiment

Figures 4, 5:
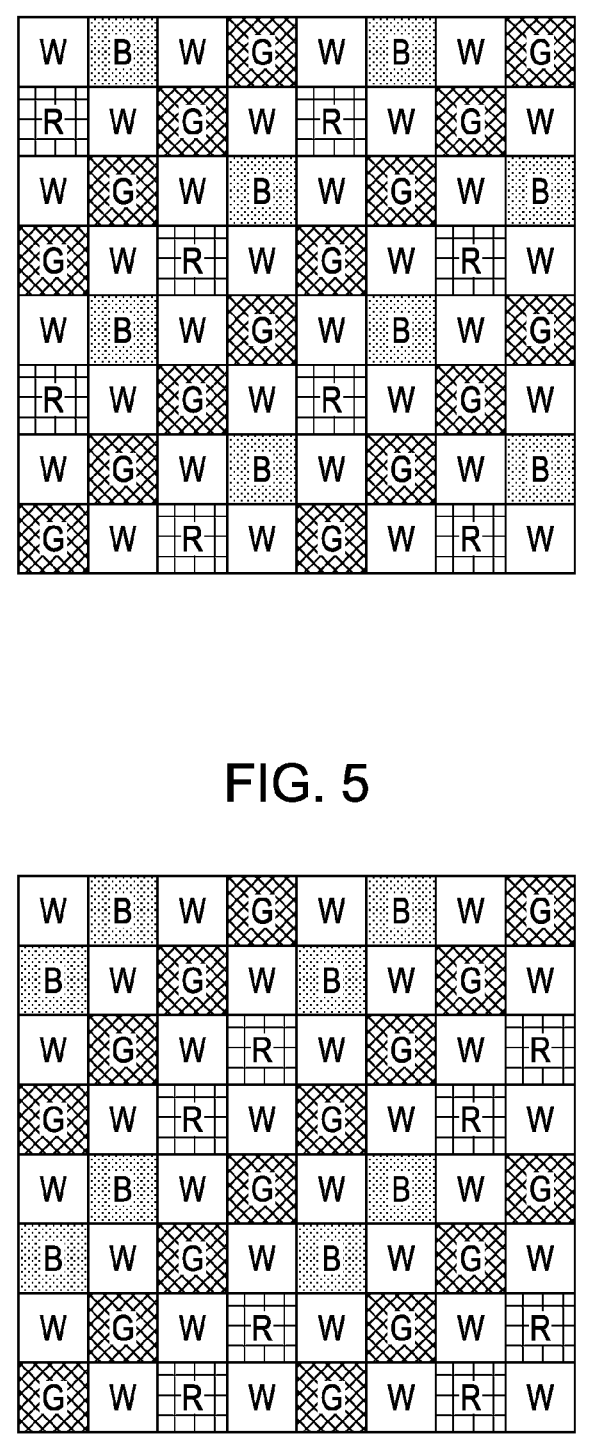

FIG. 4 is a color arrangement diagram illustrating color coding according to a first example of the first exemplary embodiment. As shown in FIG. 4, in the color coding according to the first example of the first exemplary embodiment, W filters that maximize the output level are arranged in a checkerboard pattern. R filters are arranged in a checkerboard pattern at a two-pixel pitch in the vertical direction and the horizontal direction. Similarly, B filters are arranged in a checkerboard pattern at a two-pixel pitch in the vertical direction and the horizontal direction. Each of the R filters is diagonally shifted from one of the B filters by one pixel. In addition, G filters are arranged in the other area of the checkerboard pattern.

More specifically, in a 4×4 pixel block, W filters are arranged in a checkerboard pattern. R filters are arranged in the second row and first column and in the fourth row and third column. B filters are arranged in the first row and second column and in the third row and fourth column. This array is the checkerboard pattern having a two-pixel pitch. In addition, G filters are arranged in the other area of the checkerboard pattern. At that time, the G filters form a diagonal stripe pattern.

Second Example of First Exemplary Embodiment

FIG. 5 is a color arrangement diagram illustrating color coding according to a second example of the first exemplary embodiment. As shown in FIG. 5, in the color coding according to the second example of the first exemplary embodiment, W filters are arranged in a checkerboard pattern. R filters are squarely arranged in the pattern at a four-pixel pitch in the vertical direction and the horizontal direction. Similarly, B filters are squarely arranged in the pattern at a four-pixel pitch in the vertical direction and the horizontal direction. In addition, each of the R filters is diagonally shifted from one of the B filters by one pixel. In addition, G filters are arranged in the other area in the checkerboard pattern.

More specifically, in a 4×4 pixel block, W filters are arranged in a checkerboard pattern. An R filter is disposed in the second row and third column. A B filter is disposed in the third row and second column. This array is the square array having a four-pixel pitch in the vertical direction and the horizontal direction. In addition, G filters are arranged in the other area of the checkerboard pattern. At that time, the G filters form a diagonal stripe pattern.

Third Example of First Exemplary Embodiment

Figures 6, 7:
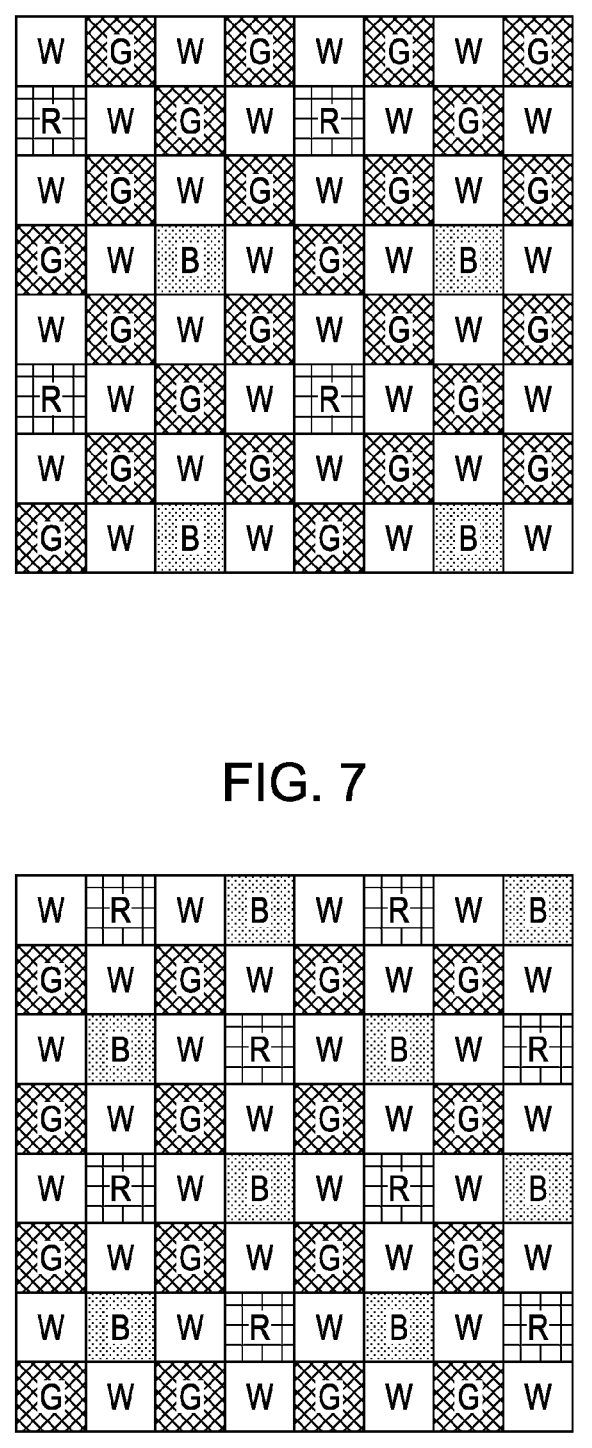

FIG. 6 is a color arrangement diagram illustrating color coding according to a third example of the first exemplary embodiment. As shown in FIG. 6, in the color coding according to the third example of the first exemplary embodiment, W filters are arranged in a checkerboard pattern. R filters are squarely arranged in a checkerboard pattern at a four-pixel pitch in the vertical direction and the horizontal direction. Similarly, B filters are squarely arranged in a checkerboard pattern at a four-pixel pitch in the vertical direction and the horizontal direction. In addition, each of the R filters is diagonally shifted from one of the B filters by two pixels. In addition, G filters are arranged in the other area in the checkerboard pattern.

More specifically, in a 4×4 pixel block, W filters are arranged in a checkerboard pattern. An R filter is disposed in the second row and first column. A B filter is disposed in the fourth row and third column. This array is the square array having a four-pixel pitch in the vertical direction and the horizontal direction. In addition, G filters are arranged in the other area of the checkerboard pattern. At that time, the G filters form a diagonal stripe pattern.

Fourth Example of First Exemplary Embodiment

FIG. 7 is a color arrangement diagram illustrating color coding according to a fourth example of the first exemplary embodiment. As shown in FIG. 7, in the color coding according to the fourth example of the first exemplary embodiment, W filters are arranged in a checkerboard pattern. Filters of each of R and B are arranged in a checkerboard pattern at a two-pixel pitch in the vertical direction and the horizontal direction. In addition, each of the R filters is diagonally shifted from one of the B filters by one pixel. In addition, G filters are arranged in the other area in the checkerboard pattern.

More specifically, in a 4×4 pixel block, W filters are arranged in a checkerboard pattern. R filters are disposed in the first row and second column and in the third row and fourth column. B filters are disposed in the third row and second column and in the first row and fourth column. This array is the checkerboard array having a two-pixel pitch in the vertical direction and the horizontal direction. In addition, G filters are arranged in the other area of the checkerboard pattern.

Fifth Example of First Exemplary Embodiment

Figures 8, 9:
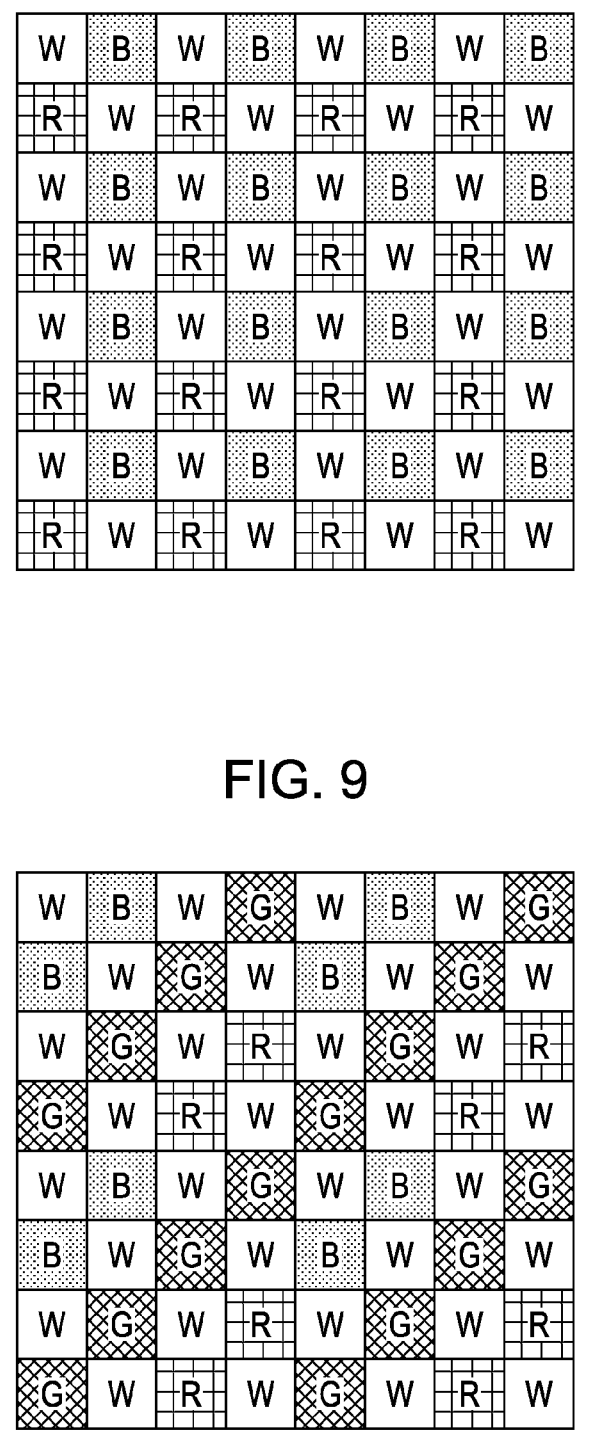

FIG. 8 is a color arrangement diagram illustrating color coding according to a fifth example of the first exemplary embodiment. As shown in FIG. 8, in the color coding according to the fifth example of the first exemplary embodiment, W filters are arranged in a checkerboard pattern. R filters are squarely arranged in a checkerboard pattern at a two-pixel pitch in the vertical direction and the horizontal direction. Similarly, B filters are squarely arranged in a checkerboard pattern at a two-pixel pitch in the vertical direction and the horizontal direction. In addition, each of the R filters is diagonally shifted from one of the B filters by one pixel.

More specifically, in a 4×4 pixel block, W filters are arranged in a checkerboard pattern. R filters are disposed in the second row and first column, the second row and third column, the fourth row and first column, and the fourth row and third column. B filters are disposed in the first row and second column, the first row and fourth column, the third row and second column, and the third row and fourth column. This array is the square array having a two-pixel pitch in the vertical direction and the horizontal direction.

Sixth Example of First Exemplary Embodiment

FIG. 9 is a color arrangement diagram illustrating color coding according to a sixth example of the first exemplary embodiment. As shown in FIG. 9, in the color coding according to the sixth example of the first exemplary embodiment, W filters are arranged in a checkerboard pattern. R filters are squarely arranged in a checkerboard pattern at a four-pixel pitch in the vertical direction and the horizontal direction. Similarly, B filters are squarely arranged in a checkerboard pattern at a four-pixel pitch in the vertical direction and the horizontal direction. In addition, each of the R filters is diagonally shifted from one of the B filters by two pixels. Furthermore, G filters are arranged in the other area of the checkerboard pattern.

More specifically, in a 4×4 pixel block, W filters are arranged in a checkerboard pattern. R filters are disposed in the third row and fourth column and in the fourth row and third column. B filters are disposed in the first row and second column and in the second row and first column. This array is the square array having a four-pixel pitch in the vertical direction and the horizontal direction. In addition, G filters are arranged in the other area of the checkerboard pattern. At that time, the G filters form a diagonal stripe pattern.

The color coding methods according to the above-described first to sixth examples of the first exemplary embodiment use a color arrangement in which W filters having a color serving as a primary component of a luminance signal that maximizes the output level are arranged in a checkerboard pattern. Since the filters of a white color (W) that includes R, G, and B color components are arranged in a checkerboard pattern, the accuracy of conversion into signals corresponding to the RGB Bayer arrangement can be increased.

The key feature of these color coding methods is that if the W filters are replaced with G filters during the color conversion process described below, the locations of the R and B filters are coincident with those of the Bayer arrangement. In addition, for the locations at which colors are not coincident, information regarding pixels of the W filters can be used. Thus, R and B pixel information can be restored. As a result, conversion efficiency can be significantly increased.

Another of the key features of the color coding methods according to the first to third examples and the sixth example of the first exemplary embodiment is that the W filters are arranged in a checkerboard pattern, and a series of four G filters arranged in a diagonal direction repeatedly appears so that a diagonal stripe pattern is formed. In such color coding methods, by summing the signals of pixels of G filters adjacent to a pixel of a W filter and the signal of the W filter and using the sum as a primary component of a luminance signal, the intensity of the luminance signal can be increased. Accordingly, the sensitivity (the S/N ratio) can be increased.

In particular, in the color coding method according to the first example of the first embodiment, each of the R filters is diagonally shifted from one of the B filters by one pixel. Accordingly, the efficiency of conversion into a signal corresponding to the Bayer arrangement can be increased. In addition, in the color coding method according to the second example of the first embodiment, R filters are arranged so as to form a square array having a four-pixel pitch in the vertical direction and the horizontal direction, and B filters are arranged so as to form a square array having a four-pixel pitch in the vertical direction and the horizontal direction. Furthermore, the each of the R filters is diagonally shifted from one of the B filters by two pixels. Accordingly, the efficiency of conversion can be increased. Still furthermore, in the color coding method according to the second example of the first embodiment, the number of G filters can be large. Thus, the efficiency of conversion into the G color can be increased.

In the color coding methods according to the first and sixth examples of the first embodiment, a series of four G filters arranged in a diagonal direction repeatedly appears so that a diagonal stripe pattern is formed. Accordingly, in such color coding methods, by adding the signal of a G pixel or the signals of two G pixels adjacent to a W pixel to the signal of the W pixel and using the sum signal as a primary component of a luminance signal, a high sensitivity (a high S/N rate) can be provided without a decrease in resolution. This advantage can be provided not only when a series of four G filters arranged in a diagonal direction repeatedly appears so that a diagonal stripe pattern is formed, but also when a series of four G filters arranged in the vertical direction or the horizontal direction repeatedly appears so that a stripe pattern is formed.

Seventh Example of First Exemplary Embodiment

Figures 10, 11:
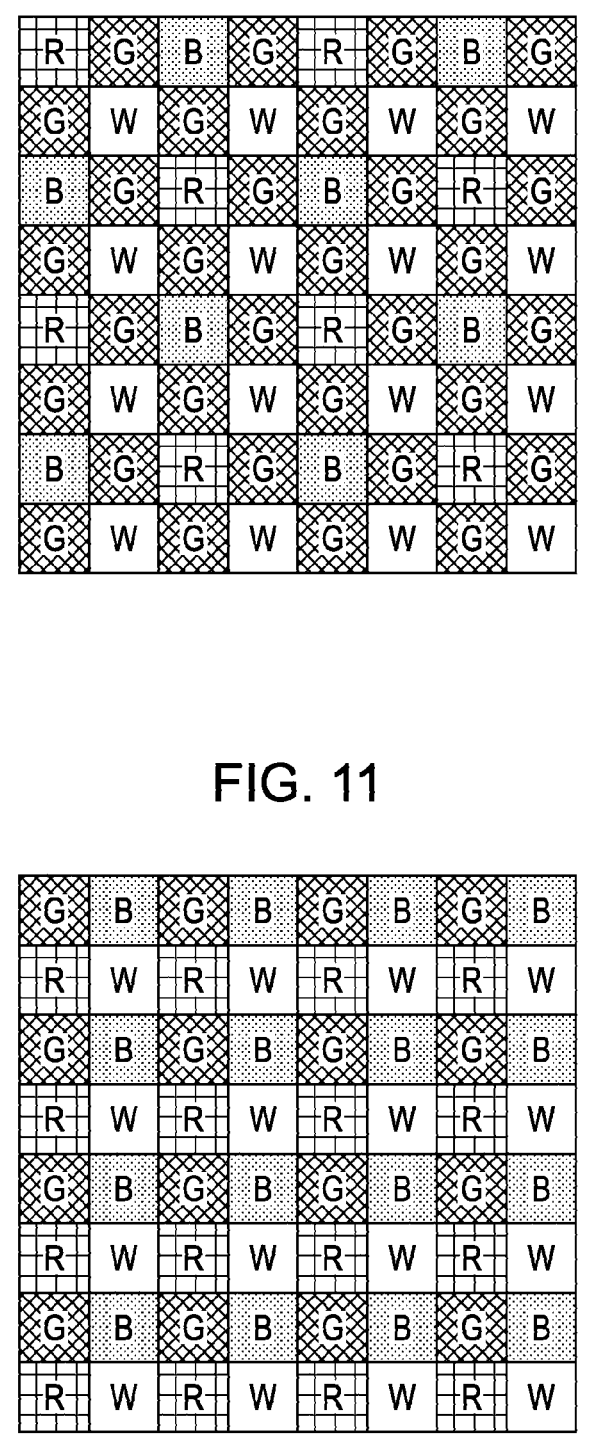

FIG. 10 is a color arrangement diagram illustrating color coding according to a seventh example of the first exemplary embodiment. As shown in FIG. 10, in the color coding according to the seventh example of the first exemplary embodiment, G filters serving as color filters of a primary component of a luminance signal are arranged in a checkerboard pattern. R filters and B filters are arranged in a checkerboard pattern at a two-pixel pitch in the vertical direction and the horizontal direction. Each of the R filters is diagonally shifted from one of the B filters by two pixels. In addition, W filters are arranged in the other area of the checkerboard pattern.

More specifically, in an array including four pixels in each of the vertical direction and the horizontal direction, G filters are arranged in a checkerboard pattern. R filters are arranged in the first row and first column and in the third row and third column. B filters are arranged in the first row and third column and in the third row and first column. This array is the checkerboard pattern having a two-pixel pitch in each of the vertical direction and the horizontal direction. In addition, W filters are arranged in the other area of the checkerboard pattern.

In the color coding methods according to the first to seventh examples of the first embodiment, W or G filters serving as color filters of a primary component of a luminance signal are arranged in a checkerboard pattern. However, in order to easily convert a signal corresponding to the RGB Bayer arrangement using the conversion processing unit 16 on the sensor chip 11, color coding is not limited to the color coding in which W or G filters are arranged in a checkerboard pattern. Color coding in which W or G filters are not arranged in a checkerboard pattern is described below with reference to eighth and ninth examples of the first exemplary embodiment.

Eighth Example of First Exemplary Embodiment

FIG. 11 is a color arrangement diagram illustrating color coding according to an eighth example of the first exemplary embodiment. As shown in FIG. 11, in the color coding according to the eighth example of the first exemplary embodiment, each of 2×2 pixel blocks includes W, R, G, and B filters, and a pattern having a two-pixel pitch in the vertical direction and the horizontal direction is formed. More specifically, each of the W filters is disposed in an even row and an even column, each of the R filters is disposed in an even row and an odd column, each of the G filters is disposed in an odd row and an odd column, and each of the B filters is disposed in an odd row and an even column.

Ninth Example of First Exemplary Embodiment

Figure 12:
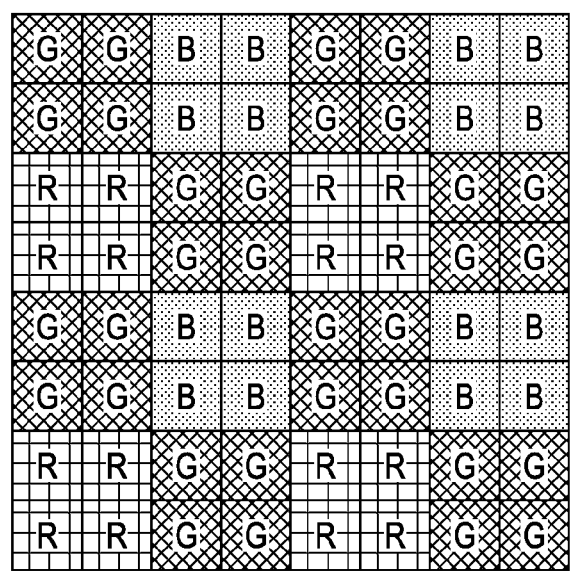
FIG. 12 is a color arrangement diagram illustrating color coding according to a ninth example of the first exemplary embodiment.

FIG. 12 is a color arrangement diagram illustrating color coding according to a ninth example of the first exemplary embodiment. As shown in FIG. 12, in the color coding according to the ninth example of the first exemplary embodiment, each of 2×2 pixel blocks includes R, G, or B filters, and these pixel blocks form the Bayer arrangement. More specifically, G filters are disposed in first and second rows and first and second columns and in third and fourth rows and third and fourth rows, B filters are disposed in the first and second rows and the third and fourth columns, and R filters are disposed in third and fourth rows and the first and second columns.

1-4. Sensitivity Ratio W:G:R:B

A sensitivity ratio W:G:R:B is described next. In color coding including W filters, a W filter pixel that has a high output signal level is saturated earlier than a pixel of other color filters. Accordingly, it is necessary that a sensitivity balance among W, G, R, and B pixels be sustained, that is, the sensitivity ratio W:G:R:B be adjusted by decreasing the sensitivity of the W filter pixel and increasing the sensitivities of the other color filter pixel relative to the sensitivity of the W filter pixel.

In order to adjusting the sensitivity ratio, widely used exposure control techniques can be used. More specifically, by adjusting the size of an on-chip microlens provided outside the color filter array 30 for each of the pixels of the color filter array 30, the balance among the amounts of light made incident on individual color pixels is sustainable (refer to, for example, Japanese Unexamined Patent Application Publication No. 9-116127). By using this technique and decreasing the size of an on-chip microlens for a W color to a size smaller than that for each of the other colors, the sensitivity of the W filter pixel can be decreased. In this way, the sensitivity of one of the other color filter pixel can be relatively increased.

Alternatively, an exposure light control technique in which, in color coding including a W filter, the difference between the sensitivities can be reduced by removing an on-chip microlens for a W pixel, and a color S/N can be improved by increasing the color sensitivity can be used (refer to, for example, Japanese Unexamined Patent Application Publication No. 2007-287891). By using this technique, the sensitivity of the W filter pixel can be decreased. In this way, the sensitivity of one of the other color filter pixel can be relatively increased.

Still alternatively, in order to preventing the improper color balance, a technique of performing shutter exposure control in which the exposure time of a G filter pixel is decreased compared with that for an R or B filter pixel can be used (refer to, for example, Japanese Unexamined Patent Application Publication No. 2003-60992). By combining such a shutter exposure control technique with control of light-receiving area, the sensitivity of the W filter pixel can be decreased. In this way, the sensitivity of one of the other color filter pixel can be relatively increased. Furthermore, in particular, the occurrence of a colored outline of a moving subject can be eliminated. As a result, an achromatizing process performed by an external signal processing unit (a DSP) is not necessary.

Note that the above-described three exposure control techniques used for adjusting the sensitivity ratio are only examples. The exposure control technique is not limited thereto.

For example, the size of the on-chip microlens for a W pixel is set in such a manner that the output levels of the W, G, B, and R pixels are substantially in the proportion 2:1:0.5:0.5.

For 1.1-μm pixels, when the size of an on-chip microlens for a W pixel is varied by ±0.1 μm, the area is doubled and halved. Therefore, the sensitivity is doubled or halved. Accordingly, the output level of a W pixel having an area the same as that of a G pixel and having an output level double that of the G pixel can be adjusted so that the output levels are the same. Even when the size of the on-chip microlens is varied by ±0.05 μm, the area is ±1.42 times the original area and, therefore, the sensitivity of the W pixel can be reduced to 1.42 times that of the G pixel. In such a case, the further adjustment of the sensitivity may be performed by shutter exposure control.

1-5. Color Conversion Process

A process for converting a signal into a signal corresponding to the RGB Bayer arrangement (i.e., a color conversion process) performed by the conversion processing unit 16 is described in more detail next.

The following two types of color conversion process are provided: a color conversion process performed when a still image is captured (at a time of full scanning in which all of the pixels are scanned) and a color conversion process performed when a moving image is captured (at a time of pixel addition in which signals of a plurality of pixels neighboring a given pixel is added to the signal of the given pixel). In the case of color coding according to the first and sixth examples of the first exemplary embodiment, a color conversion process with a high sensitivity can be performed. Accordingly, a low luminance mode can be used and, therefore, the color conversion process performed at a time of full scanning can be divided into two color conversion processes.

One of the two color conversion processes is performed when the luminance of incident light is higher than a predetermined reference luminance. This color conversion process is referred to as a "color conversion process 1". The other color conversion process is performed when the luminance of incident light is lower than or equal to the predetermined reference luminance. This color conversion process is referred to as a "color conversion process 2". In addition, the color conversion process performed at a time of pixel addition can be divided into a plurality of color conversion processes in accordance with the combinations of the pixels to be added.

Note that, in the case of the color coding at a time of full scanning according to the examples other than the first and sixth examples, it is difficult to use a low luminance mode. Accordingly, only a high luminance mode is used. That is, in the case of the color coding at a time of full scanning according to the second to fifth examples and the seventh to ninth examples, the color conversion process 1 used in the first and sixth examples for high luminance is used.

Color Coding According to First Example of First Exemplary Embodiment

A color conversion process performed for the color coding according to the first example of the first exemplary embodiment is described next. First, the color conversion process 1 performed in a high luminance mode at a time of full scanning is described with reference to a flowchart shown in FIG. 13 and schematic illustrations shown in FIGS. 14A to 14D.

Figure 13:
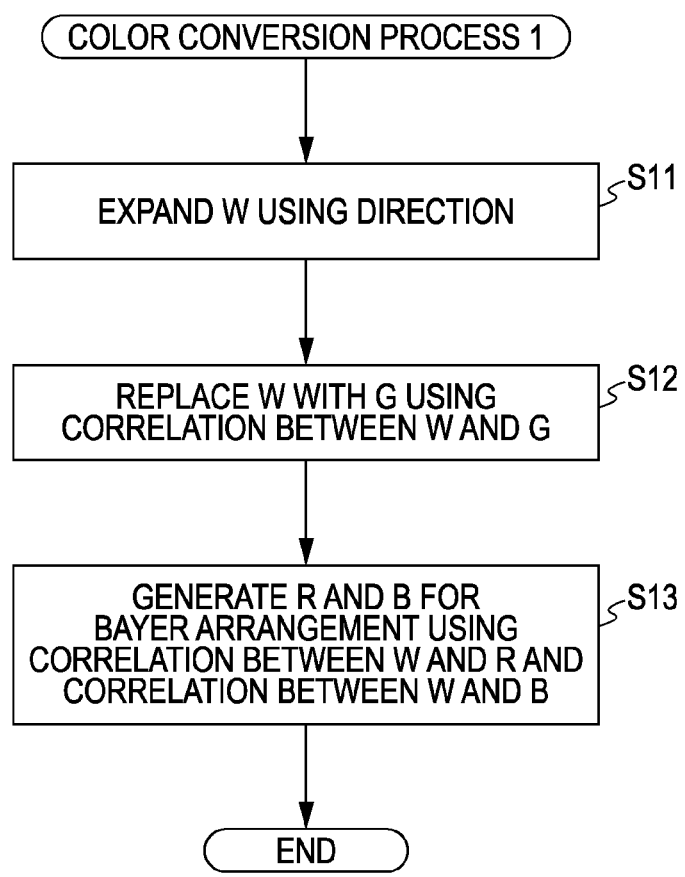
FIG. 13 is a flowchart illustrating an exemplary process flow of a color conversion process 1 performed in a high luminance mode at a time of full scanning in the case of the color coding according to the first example of the first exemplary embodiment and a first example of a second exemplary embodiment.
Figure 14A:
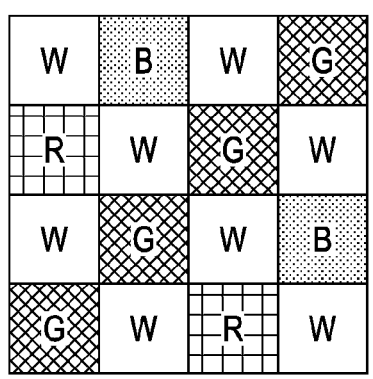
FIGS. 14A to 14D are schematic illustrations of the color conversion process 1 performed in a high luminance mode at a time of full scanning in the case of the color coding according to the first example of the first exemplary embodiment and a first example of a second exemplary embodiment.

As illustrated by the flowchart shown in FIG. 13, the color conversion process 1 in a high luminance mode is realized by sequentially performing the processing in steps S11, S12, and S13. FIG. 14A illustrates a 4×4 pixel color arrangement of the color coding according to the first example.

Figure 14B:
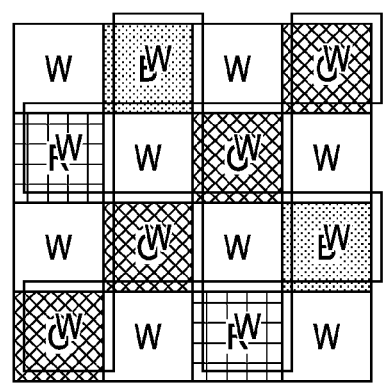

In step S11, as shown in FIG. 14B, the components of white (W) pixels arranged in a checkerboard pattern are expanded into pixels of all colors by determining the direction of resolution. As used herein, the term "direction of resolution" refers to a direction in which pixel signals are present. In FIG. 14B, "W" surrounded by a square frame represents a component of a W pixel after the component of the W pixel is expanded into each of all colors.

In order to expand a component of a W pixel into pixels of other colors, signal processing based on a widely used directional correlation can be applied. For example, in signal processing based on a directional correlation, a plurality of color signals corresponding to a given pixel is acquired, and the correlation value in the vertical direction and/or the horizontal direction is obtained (refer to, for example, Japanese Patent No. 2931520).

Figure 14C:
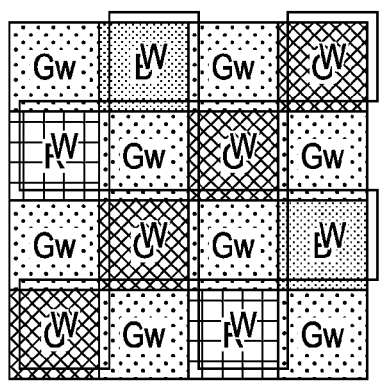

In step S12, as shown in FIG. 14C, a W pixel is replaced with a G pixel using a correlation between a W pixel and a G pixel. As can be seen from the above-described color arrangements of various color coding, a W pixel is adjacent to a G pixel. In terms of a correlation between a W pixel and a G pixel in a certain area, the W pixel and the G pixel have a strong correlation since either one of the W pixel and the G pixel has a color serving as a primary component of a luminance signal. Thus, the correlation value (the correlation coefficient) is nearly 1. By determining the direction of resolution using the color correlation and changing the output level of a W pixel to the level equivalent to the output level of a G pixel, the W pixel is replaced with the G pixel.

Figure 14D:
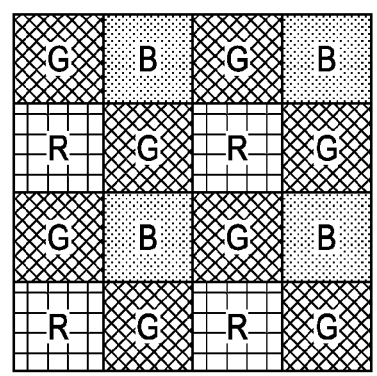

In step S13, an R pixel and a B pixel are generated for the Bayer arrangement shown in FIG. 14D using a correlation between the W pixel and the R pixel and a correlation between the W pixel and the B pixel. Since a W pixel includes R, G, and B color components, the correlation between the W pixel and the R pixel and the correlation between the W pixel and the B pixel can be obtained. For the signal processing, an existing technique in which a luminance signal to be replaced with G in a four-color arrangement is generated for every pixel by interpolation can be used (refer to, for example, Japanese Unexamined Patent Application Publication No. 2005-160044).

Figure 15:
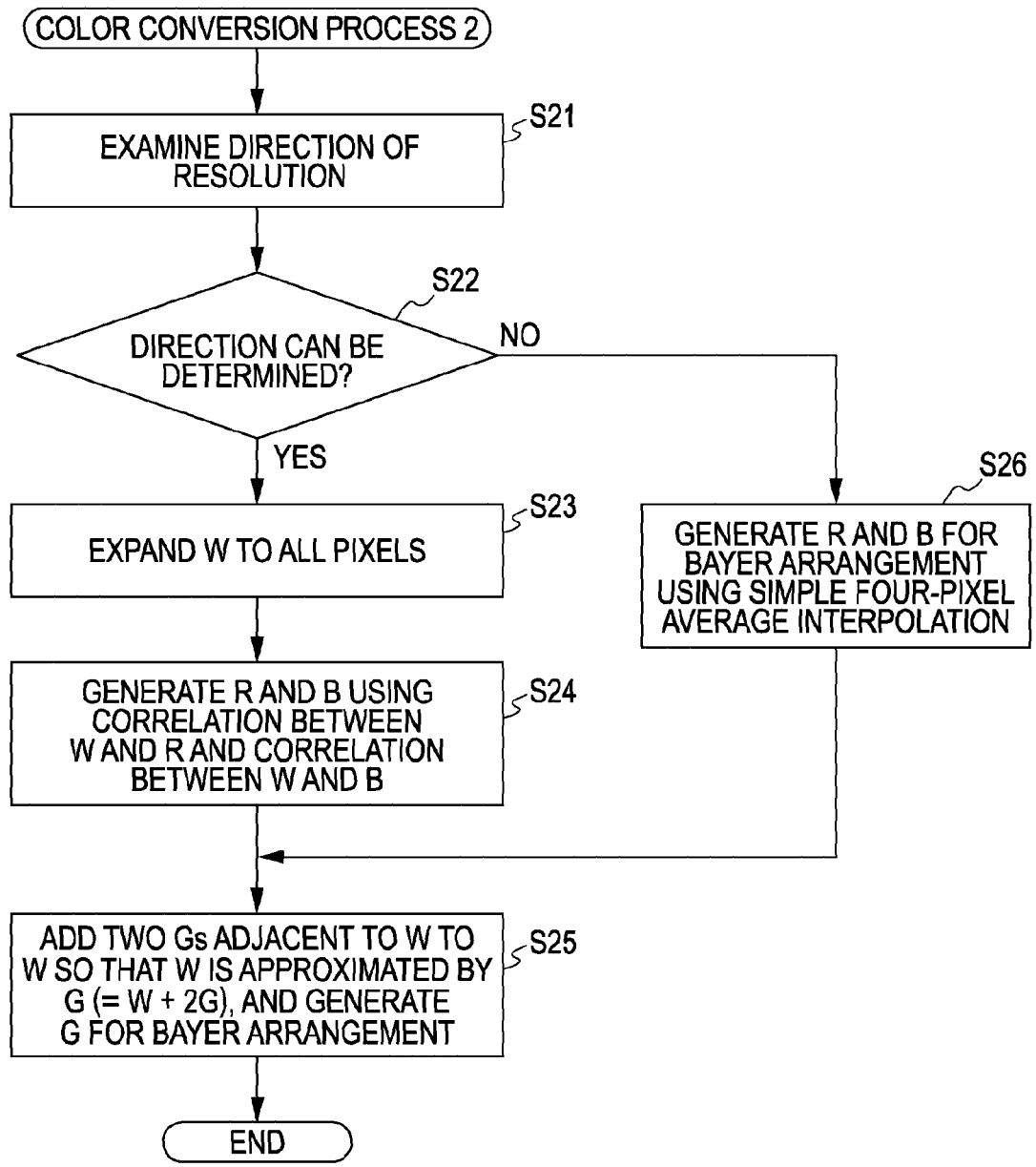
FIG. 15 is a flowchart illustrating an exemplary process flow of a color conversion process 2 performed in a low luminance mode at a time of full scanning in the case of the color coding according to the first example of the first exemplary embodiment and a first example of a second exemplary embodiment.

Subsequently, the color conversion process 2 performed in a low luminance mode at a time of full scanning is described with reference to a flowchart shown in FIG. 15 and schematic illustrations shown in FIGS. 16A to 16D.

Figure 16A:
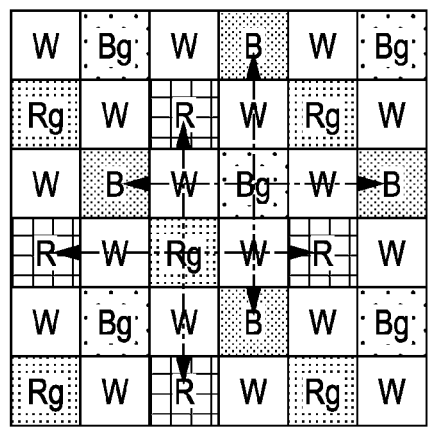
FIGS. 16A to 16D are schematic illustrations of the color conversion process 2 performed in the low luminance mode at a time of full scanning in the case of the color coding according to the first example of the first exemplary embodiment and a first example of a second exemplary embodiment.

First, as shown in FIG. 16A, the direction of resolution is examined by using signal processing based on the above-described widely used technique (step S21). Thereafter, it is determined whether the direction of resolution can be determined (step S22). If the direction of resolution can be determined, the components of the W pixels arranged in a checkerboard pattern are expanded into pixels of all colors (step S23).

Figure 16B:
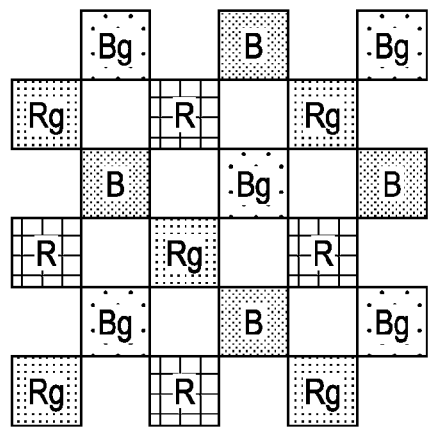
Figure 16C:
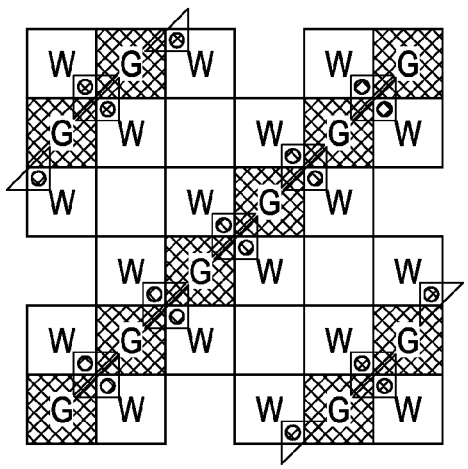
Figure 16D:
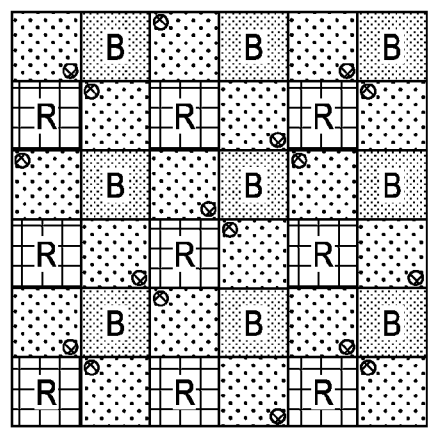

Subsequently, as shown in FIG. 16B, R pixels and B pixels are generated using the above-described widely used technique, the correlation between a W pixel and an R pixel, and the correlation between a W pixel and a B pixel (step S24). Thereafter, as shown in FIG. 16C, the signals of two R pixels adjacent to the W pixel are added to the signal of the W pixel so that the signal of the W pixel is approximated by G (=W+2G). In this way, as shown in FIG. 16D, each of the G pixels is generated for the Bayer arrangement (step S25).

However, if, in step S22, the direction of resolution is not determined, each of the R and B pixels is generated for the Bayer arrangement by using simple four-pixel averaging interpolation using four pixels adjacent to the W pixel in the vertical direction and the horizontal direction (step S26).

As described above, by using the color conversion process 1 and color conversion process 2 in accordance with the luminance of the incident light, signals corresponding to a color arrangement in which W filters are arranged in a checkerboard pattern can be converted into signals corresponding to the RGB Bayer arrangement on the sensor chip 11, and the signals can be output.

Two color conversion processes performed at a time of pixel addition for moving image capturing are described next. Hereinafter, one of the two color conversion processes is referred to as a "pixel addition process 1", and the other color conversion process is referred to as a "pixel addition process 2".

First, the pixel addition process 1 is described with reference to a flowchart shown in FIG. 17 and schematic illustrations shown in FIGS. 18A to 18D.

Figure 18A:
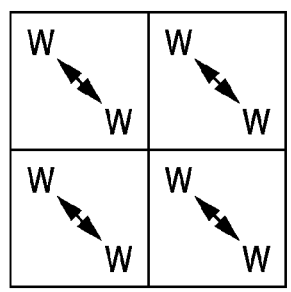
FIGS. 18A to 18D are schematic illustrations of the pixel addition process 1 in the case of the color coding according to the first example of the first exemplary embodiment.

Addition is performed on two W pixels diagonally adjacent to each other (step S31). More specifically, as shown in FIG. 18A, addition is performed on a pixel of interest and a pixel located to the lower right of the pixel of interest (i.e., a pixel to the right by one column and below by one row). This addition can be performed in the pixel structure shown in FIG. 3 by providing the transfer pulse $\phi$TRF to the transfer transistors 22 of the two pixels which are the targets of addition (the transfer transistors 22-1 and 22-4 in this example) at the same time. In this way, two-pixel addition can be performed in the FD unit 26. Hereinafter, such pixel addition is referred to as "FD addition".

Figure 18B:
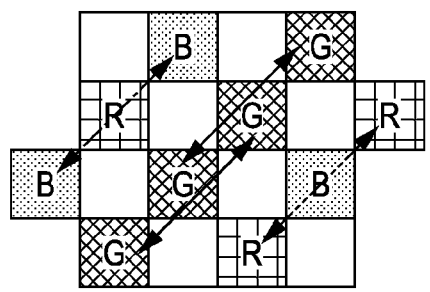

Subsequently, for each of R, G, and B pixels, addition is performed on two pixels arranged with one pixel therebetween in the opposite diagonal direction (step S32). More specifically, as shown in FIG. 18B, addition is performed on a pixel of interest and a pixel located to the lower left of the pixel of interest with one pixel therebetween (i.e., a pixel to the right by two columns and below by two rows). For each of R, G, and B pixels, when the column processing unit 14 shown in FIG. 1 has an A/D conversion function, this addition can be performed during A/D conversion.

Figure 19:
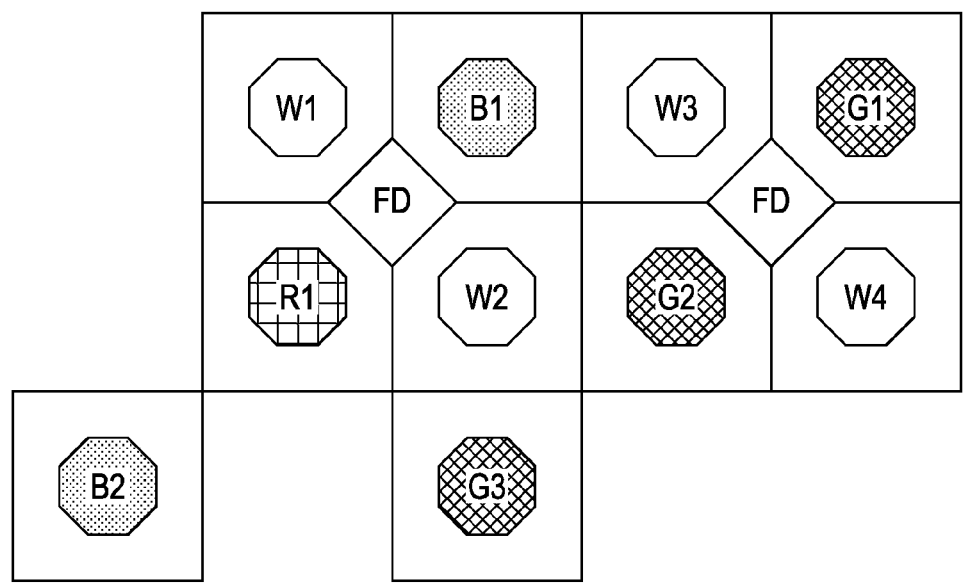
FIG. 19 illustrates FD addition and counter addition.

More specifically, in the color arrangement shown in FIG. 19, the signals of pixels B1 and G1 are read independently. After the signals are A/D-converted, the signals of pixels B2 and G3 are continuously read and A/D-converted. In this way, two-pixel addition can be performed. In order to perform pixel addition during A/D conversion performed by the column processing unit 14, an existing technique for converting an analog pixel signal into a digital pixel signal using a counter can be used (refer to, for example, Japanese Unexamined Patent Application Publication No. 2006-033454).

Hereinafter, this pixel addition performed using a counter of an A/D converter is referred to as "counter addition". When counter addition is performed and if the gain is changed on a line-by-line basis, the addition ratio can be varied. Similarly, counter addition can be performed on R pixels. Note that, in the above-described two-pixel addition for the W pixels, FD addition is performed between the pixels W1 and W2 and between the pixels W3 and W4.

Figure 18C:
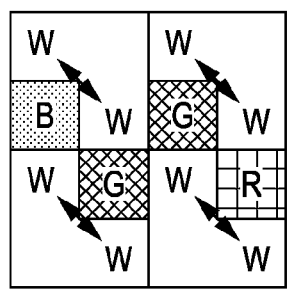
Figure 18D:
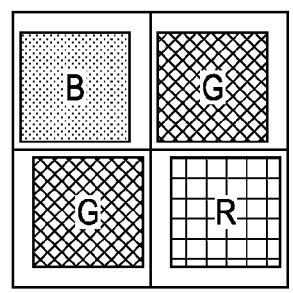

Thereafter, as shown in FIG. 18C, the components of the W pixel are fitted into the R, G, and B pixels (step S33). Subsequently, as shown in FIG. 18D, four pixels for the RGB Bayer arrangement are generated (step S34).

Figure 20:
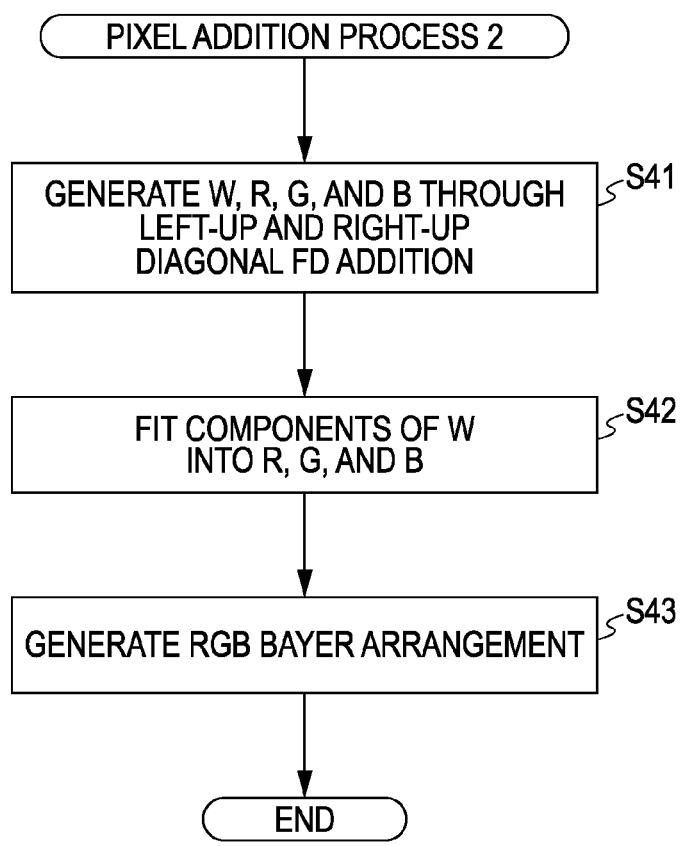
FIG. 20 is a flowchart illustrating an exemplary process flow of a pixel addition process 2 performed in the case of the color coding according to the first example of the first exemplary embodiment and the first example of the second exemplary embodiment.

Subsequently, the pixel addition process 2 is described with reference to a flowchart shown in FIG. 20 and schematic illustrations shown in FIGS. 21A to 21D.

Figure 21A:
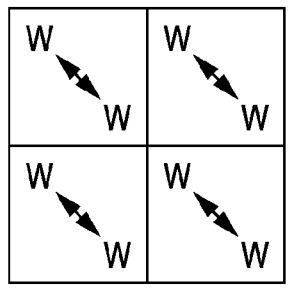
FIGS. 21A to 21D are schematic illustrations of the pixel addition process 2 performed in the case of the color coding according to the first example of the first exemplary embodiment and the first example of the second exemplary embodiment.
Figure 21B:
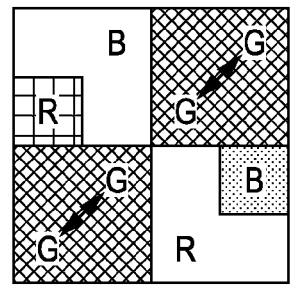

First, for W pixels and G pixels, FD addition is performed between two pixels arranged in the upper left-bottom right diagonal directions and the upper right-bottom left diagonal directions, respectively. Thus, W, R, G, and B pixels are generated (step S41). More specifically, for the W pixels, as shown in FIG. 21A, FD addition is performed between a pixel of interest and a pixel located at the lower right of the pixel of interest (i.e., a pixel to the right by one column and below by one row). For the G pixels, as shown in FIG. 21B, FD addition is performed between a pixel of interest and a pixel located at the lower left of the pixel of interest (i.e., a pixel to the left by one column and below by one row).

Note that, among eight pixels of a 4×4 pixel block, a pair of R and B signals is not used. That is, R pixels and B pixels are read in a thinning-out manner without performing pixel addition. Accordingly, the sensitivity of R and B is decreased, as compared with that in the pixel addition process 1. Consequently, a color S/N ratio is low.

Figure 21C:
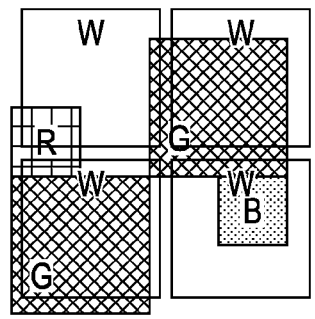
Figure 21D:
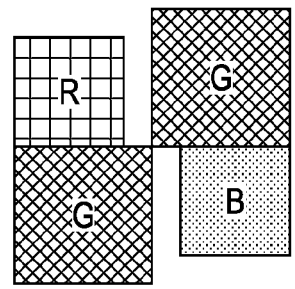

Thereafter, as shown in FIG. 21C, the components of the W pixel are fitted into the R, G, and B pixels (step S42). Subsequently, as shown in FIG. 21D, four pixels for the RGB Bayer arrangement are generated (step S43). In the case of the pixel addition process 2, the centroid location of the Bayer arrangement is slightly shifted from that in the pixel addition process 1.

Figure 22:
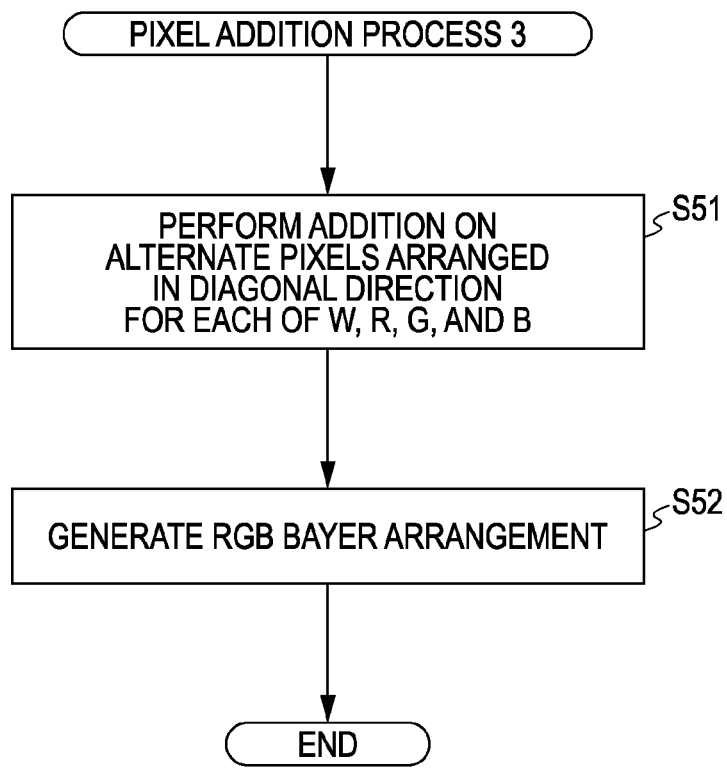
FIG. 22 is a flowchart illustrating an exemplary process flow of a pixel addition process 3 performed in the case of the color coding according to the first example of the first exemplary embodiment.
Figure 23A:
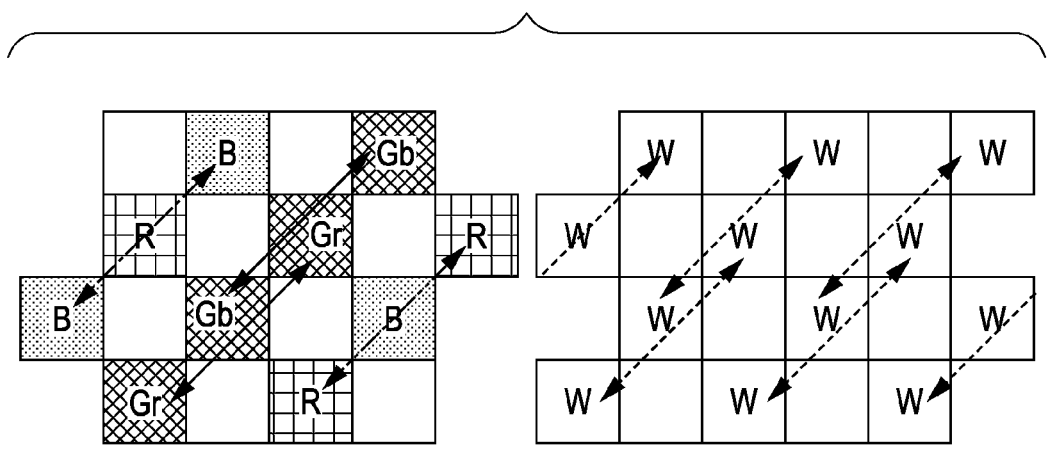
FIGS. 23A to 23C are schematic illustrations of the pixel addition process 3 performed in the case of the color coding according to the first example of the first exemplary embodiment.
Figure 23B:
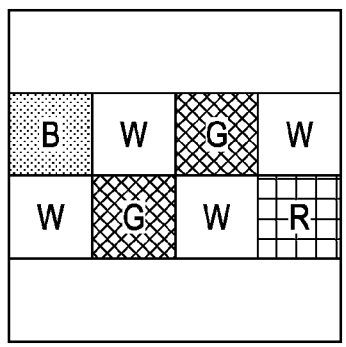
Figure 23C:
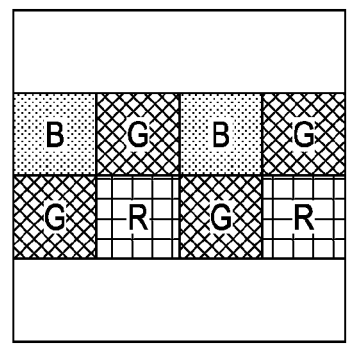

Subsequently, the pixel addition process 3 is described with reference to a flowchart shown in FIG. 22 and schematic illustrations shown in FIGS. 23A to 23C.

First, for each of W, R, G, and B pixels, addition is performed between two pixels arranged in a diagonal direction with a pixel therebetween (step S51). Thus, as shown in FIG. 23B, a color arrangement including a row of R, W, G, W, . . . and the next row of W, G, W, R, . . . is obtained after the addition. Thereafter, as shown in FIG. 23C, in a manner the same as that in the process at a time of full scanning, R and B pixels are generated for the Bayer arrangement using the correlation between a W pixel and an R pixel and the correlation between a W pixel and an R pixel (step S52).

As described above, by using one of the pixel addition process 1, the pixel addition process 2, and the pixel addition process 3 when a moving image is captured, signals corresponding to a color arrangement in which W filters are arranged in a checkerboard pattern can be converted into signals corresponding to the RGB Bayer arrangement on the sensor chip 11, and the signals can be output.

Color conversion processes for color coding according to the second to ninth examples are described below. In many cases, the process sequence is similar to that of the first example.

Color Coding According to Second Example of First Exemplary Embodiment

Figure 24A:
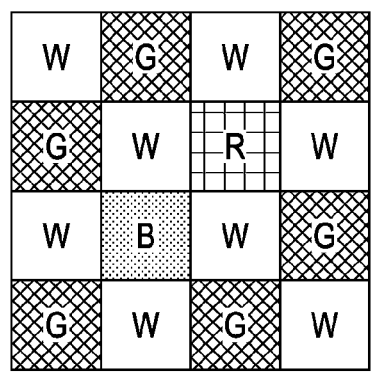
FIGS. 24A to 24D are schematic illustrations of a color conversion process performed at a time of full scanning in the case of the color coding according to the second example of the first exemplary embodiment.
Figure 24B:
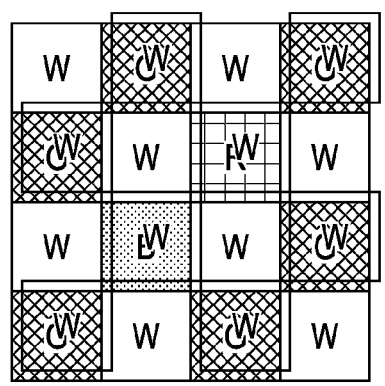
Figure 24C:
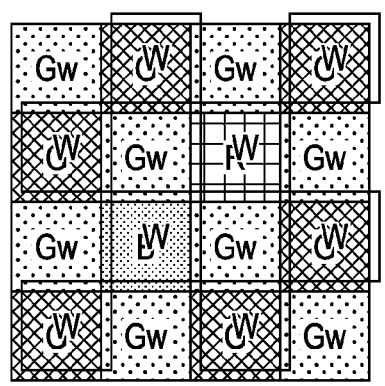
Figure 24D:
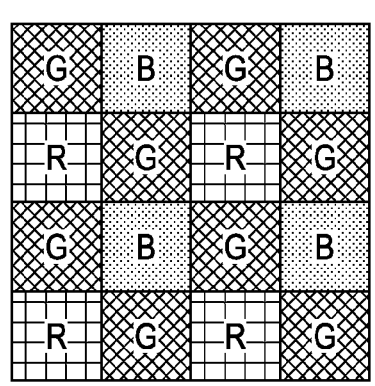

A color conversion process at a time of full scanning is described with reference to schematic illustrations shown in FIGS. 24A to 24D. In a color arrangement of a 4×4 pixel block according to the second example of the first exemplary embodiment shown in FIG. 24A, the components of W pixels arranged in a checkerboard pattern are expanded into pixels of all colors using the direction of resolution, as shown in FIG. 24B. Subsequently, as shown in FIG. 24C, the W pixels are replaced with G pixels using a correlation between a W pixel and a G pixel. Thereafter, as shown in FIG. 24D, R and B pixels are generated for the RGB Bayer arrangement using a correlation between a W pixel and an R pixel and a correlation between a W pixel and a B pixel.

Figure 25A:
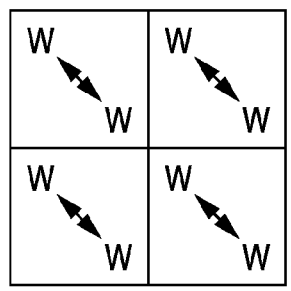
FIGS. 25A to 25D are schematic illustrations of a pixel addition process performed in the case of the color coding according to the second example of the first exemplary embodiment.
Figure 25B:
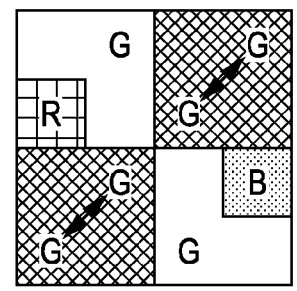
Figure 25C:
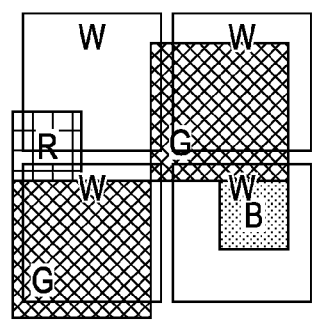
Figure 25D:
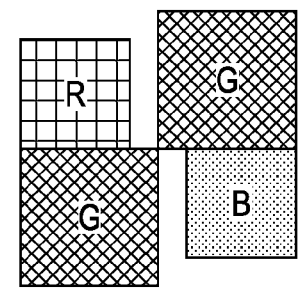

The pixel addition process is described next with reference to schematic illustrations shown in FIGS. 25A to 25D. As shown in FIGS. 25A and 25B, for a W pixel and a G pixel, FD addition is performed between two pixels located in the bottom right-upper left diagonal directions and bottom left-upper right diagonal directions, respectively. Thus, W, R, G, and B pixels are generated. Thereafter, as shown in FIG. 25C, the components of the W pixels are fitted into the R, G, and B pixels. Thus, as shown in FIG. 25D, four pixels for the RGB Bayer arrangement are generated.

Color Coding According to Third Example of First Exemplary Embodiment

Figure 26A:
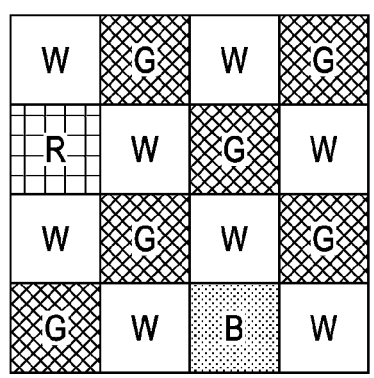
FIGS. 26A to 26D are schematic illustrations of a color conversion process performed at a time of full scanning in the case of the color coding according to a third example of the first exemplary embodiment.
Figure 26B:
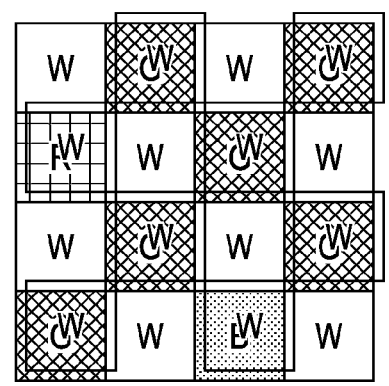
Figure 26C:
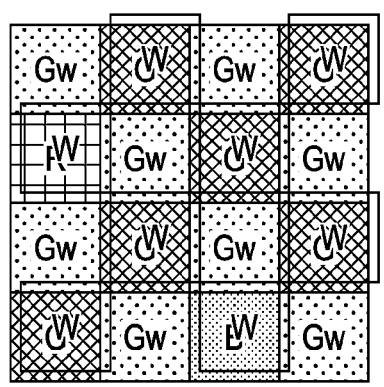
Figure 26D:
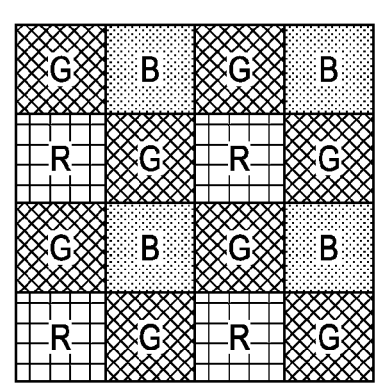

A color conversion process at a time of full scanning is described with reference to schematic illustrations shown in FIGS. 26A to 26D. In a color arrangement of a 4×4 pixel block according to the third example of the first exemplary embodiment shown in FIG. 26A, the components of W pixels arranged in a checkerboard pattern are expanded into pixels of all colors using the direction of resolution, as shown in FIG. 26B. Subsequently, as shown in FIG. 26C, the W pixels are replaced with G pixels using a correlation between a W pixel and a G pixel. Thereafter, as shown in FIG. 26D, R and B pixels are generated for the RGB Bayer arrangement using a correlation between a W pixel and an R pixel and a correlation between a W pixel and a B pixel.

Figure 27A:
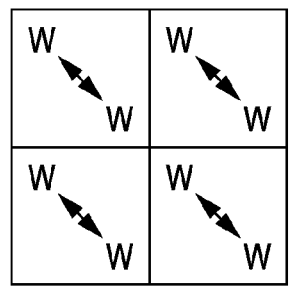
FIGS. 27A to 27E are schematic illustrations of a pixel addition process performed in the case of the color coding according to the third example of the first exemplary embodiment.
Figure 27B:
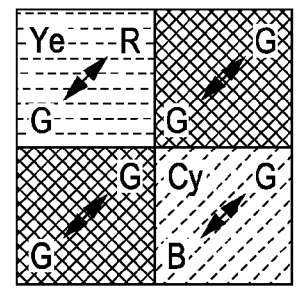
Figure 27C:
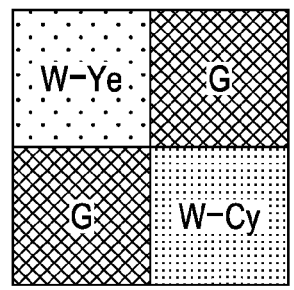
Figure 27D:
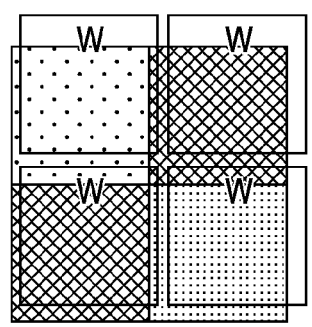
Figure 27E:
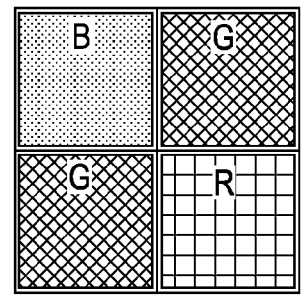

The pixel addition process is described next with reference to schematic illustrations shown in FIGS. 27A to 27E. As shown in FIGS. 27A and 27B, for W, R, G, and B pixels, left-up and right-up diagonal FD addition is performed. Thus, W, Cy (cyan), G, and Ye (yellow) colors are generated. Thereafter, as shown in FIG. 27C, the Bayer arrangement is generated by computing $B=W-Ye$ and $R=W-Cy$. At that time, although the S/N ratios of the B and R colors is degraded due to the subtraction operations, the reproducibility of the colors is increased. Thereafter, as shown in FIG. 27D, the components of the W pixels are fitted into the R, G, and B pixels. Thus, as shown in FIG. 27E, four pixels for the RGB Bayer arrangement are generated.

Color Coding According to Fourth Example of First Exemplary Embodiment

Figure 28A:
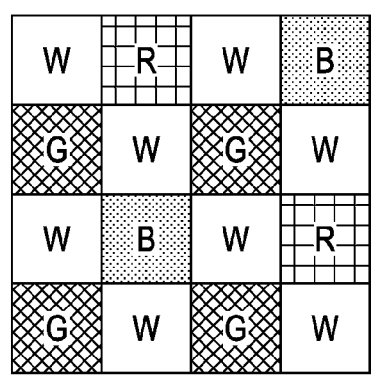
FIGS. 28A to 28D are schematic illustrations of a color conversion process performed at a time of full scanning in the case of the color coding according to a fourth example of the first exemplary embodiment.
Figure 28B:
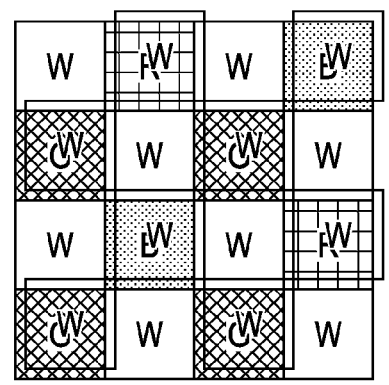
Figure 28C:
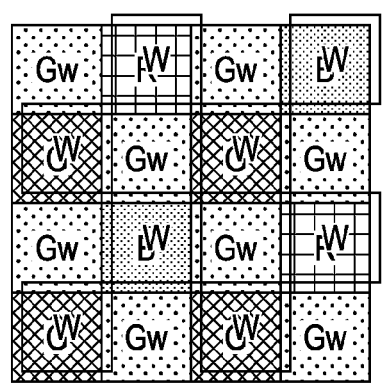
Figure 28D:
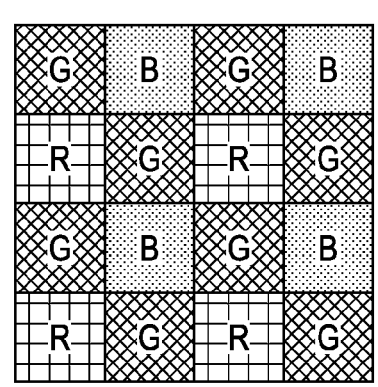

A color conversion process at a time of full scanning is described first with reference to schematic illustrations shown in FIGS. 28A to 28D. In a color arrangement of a 4×4 pixel block according to the fourth example of the first exemplary embodiment shown in FIG. 28A, the components of W pixels arranged in a checkerboard pattern are expanded into pixels of all colors using the direction of resolution, as shown in FIG. 28B. Subsequently, as shown in FIG. 28C, the W pixels are replaced with G pixels using a correlation between a W pixel and a G pixel. Thereafter, as shown in FIG. 28D, R and B pixels are generated for the RGB Bayer arrangement using a correlation between a W pixel and an R pixel and a correlation between a W pixel and a B pixel.

Figure 29A:
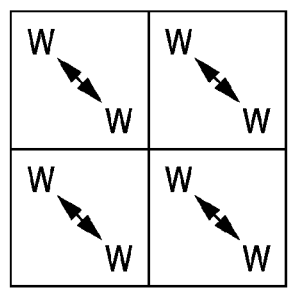
FIGS. 29A to 29F are schematic illustrations of a first type of pixel addition process performed in the case of the color coding according to the fourth example of the first exemplary embodiment.
Figure 29B:
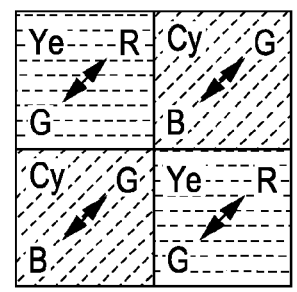
Figure 29C:
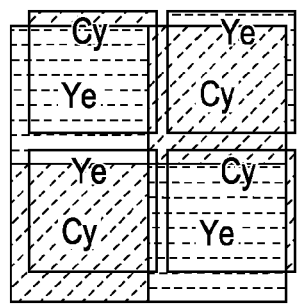
Figure 29D:
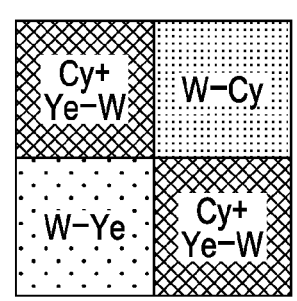
Figure 29E:
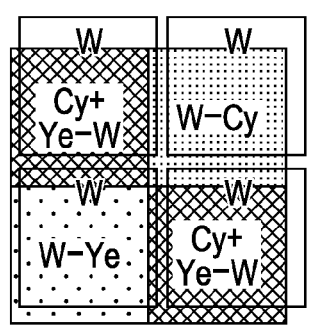
Figure 29F:
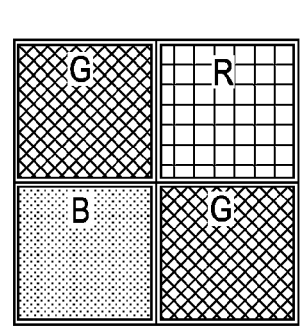

The four types of pixel addition can be used. The first type of pixel addition is described next with reference to schematic illustrations shown in FIGS. 29A to 29F. As shown in FIGS. 29A and 29B, for R and B pixels, addition is performed on alternate pixels arranged in the upper left-bottom right diagonal directions and the upper right-bottom left diagonal directions. Thus, W, Cy, and Ye colors are generated. Thereafter, as shown in FIG. 29C, each of the Cy and Ye components is expanded into all pixels. Subsequently, as shown in FIG. 29D, the following equations $G=Cy+Ye-W$, $B=W-Ye$, and $R=W-Cy$ are computed. As shown in FIG. 29E, the components of the W pixels are then fitted into the R, G, and B pixels. Thus, as shown in FIG. 29F, four pixels for the RGB Bayer arrangement are generated.

Figure 30A:
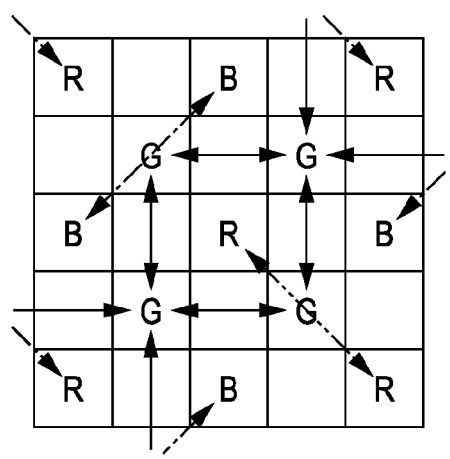
FIGS. 30A to 30D are schematic illustrations of a second type of pixel addition process performed in the case of the color coding according to the fourth example of the first exemplary embodiment.
Figure 30B:
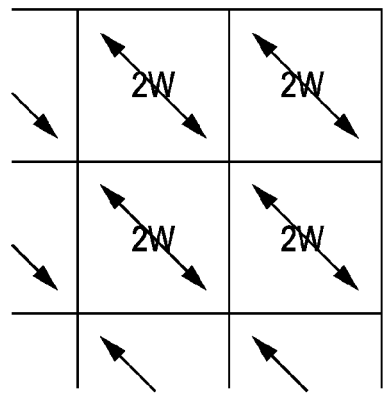
Figure 30C:
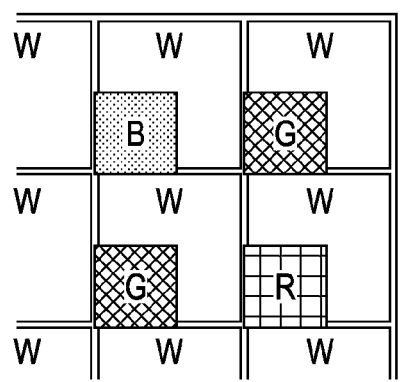
Figure 30D:
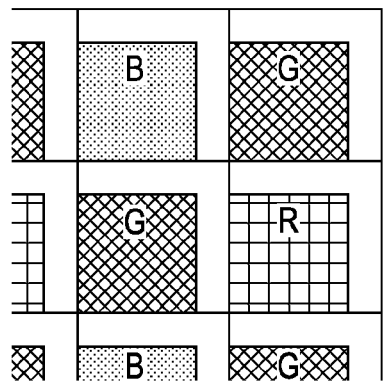

The second type of pixel addition is described next with reference to schematic illustrations shown in FIGS. 30A to 30D. As shown in FIG. 30A, for R pixels and B pixels, addition is performed between two alternate pixels arranged in the upper left-bottom right diagonal directions and in the upper right-bottom left diagonal directions, respectively. For G pixels, an average value of the G value located at the center and four G pixels located immediately above and beneath the center pixel and to the left and right of the center pixel is computed. For W pixels, as shown in FIG. 30B, diagonal FD addition is performed. As shown in FIG. 30C, the components of the W pixels are then fitted into the R, G, and B pixels. Thus, as shown in FIG. 30D, four pixels for the RGB Bayer arrangement are generated.

Figure 31A:
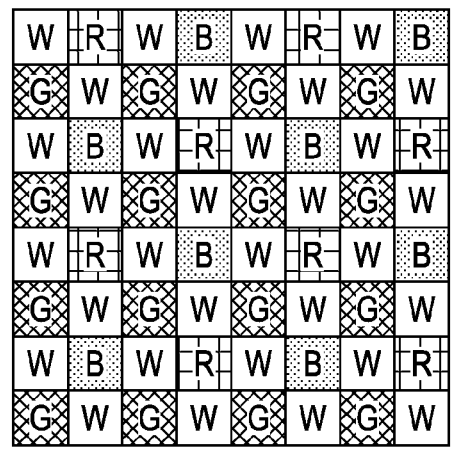
FIGS. 31A to 31C are schematic illustrations of a third type of pixel addition process performed in the case of the color coding according to the fourth example of the first exemplary embodiment.
Figure 31B:
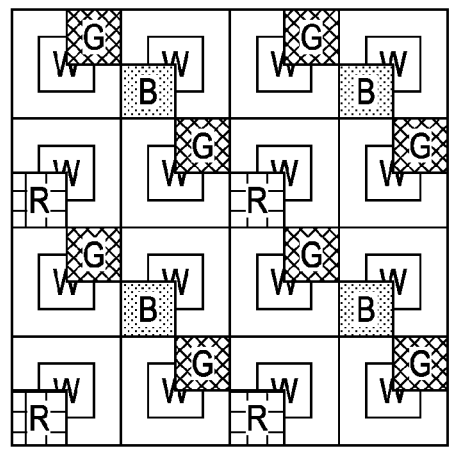
Figure 31C:
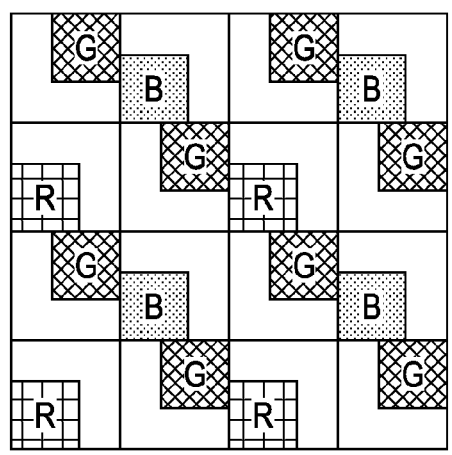

The third type of pixel addition is described next with reference to schematic illustrations shown in FIGS. 31A to 31C. As shown in FIG. 31A, for W pixels, addition is performed between two diagonally adjacent pixels. For each of R, G, and B pixels, addition is performed between two alternate pixels arranged in a diagonal direction. Accordingly, a color arrangement as shown in FIG. 31B is obtained. Subsequently, the components of the W pixels are then fitted into the R, G, and B pixels. Thus, as shown in FIG. 31C, four pixels for the RGB Bayer arrangement are generated.

Figure 32A:
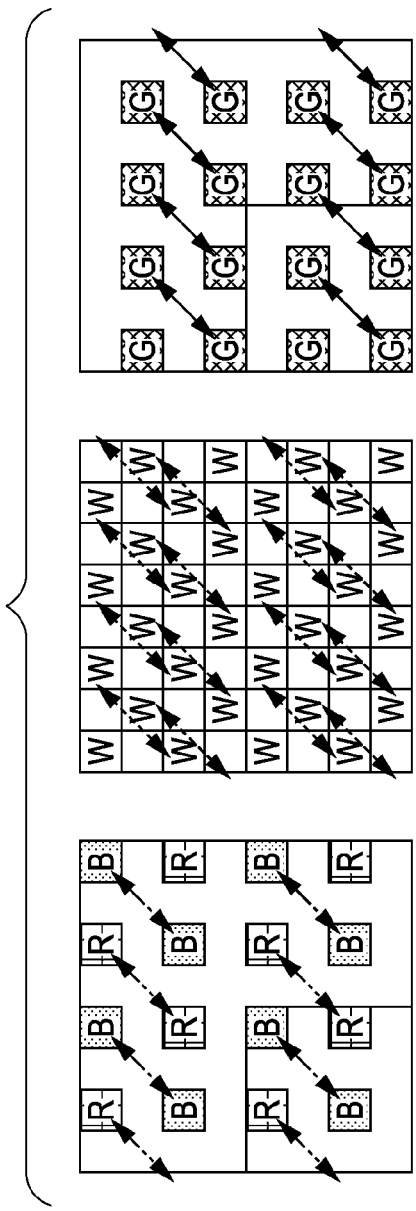
FIGS. 32A to 32D are schematic illustrations of a fourth type of pixel addition process performed in the case of the color coding according to the fourth example of the first exemplary embodiment.
Figure 32D:
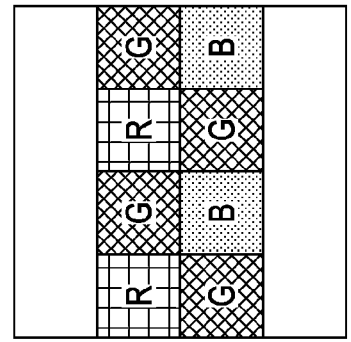
Figure 32C:
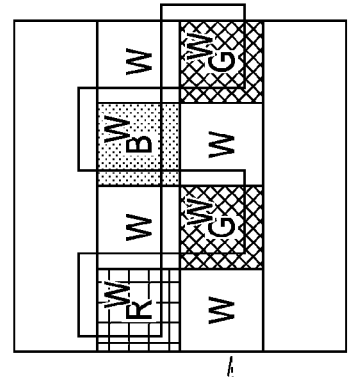
Figure 32B:
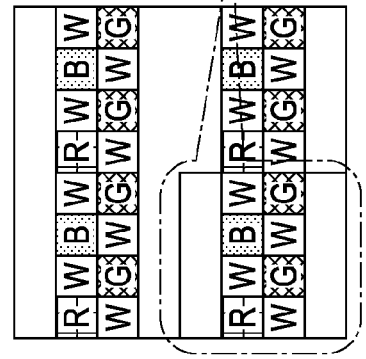

The fourth type of pixel addition is described next with reference to schematic illustrations shown in FIGS. 32A to 32D. As shown in FIG. 32A, for each of W, R, G, and B pixels, diagonal two-pixel FD addition with one pixel therebetween is performed. Thereafter, by combining the signals of the W pixels arranged in a two-row-based checkerboard pattern, a color arrangement including a W checkerboard pattern can be obtained, as shown in FIG. 32B. Subsequently, as in the process performed at a time of full scanning, the W pixels are replaced with G pixels using a correlation between a W pixel and a G pixel, as shown in FIG. 32C. Thereafter, as shown in FIG. 32D, R and B pixels are generated for the RGB Bayer arrangement using a correlation between a W pixel and an R pixel and a correlation between a W pixel and a B pixel.

Color Coding According to Fifth Example of First Exemplary Embodiment

Figure 33A:
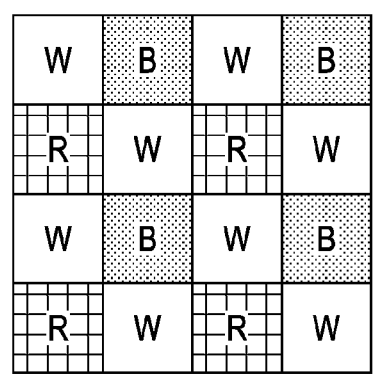
FIGS. 33A to 33D are schematic illustrations of a color conversion process performed at a time of full scanning in the case of the color coding according to a fifth example of the first exemplary embodiment.
Figure 33B:
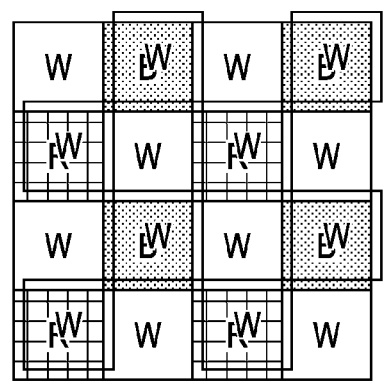
Figure 33C:
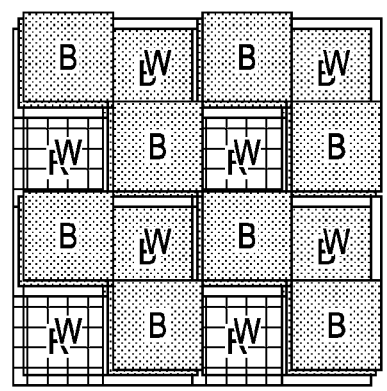
Figure 33D:
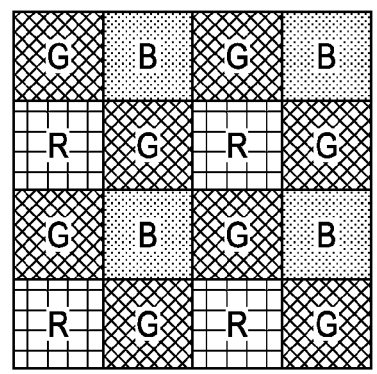

A color conversion process at a time of full scanning is described first with reference to schematic illustrations shown in FIGS. 33A to 33D. In a color arrangement of a 4×4 pixel block according to the fifth example of the first exemplary embodiment shown in FIG. 33A, the components of W pixels arranged in a checkerboard pattern are expanded into pixels of all colors using the direction of resolution, as shown in FIG. 33B. Subsequently, as shown in FIG. 33C, the components of each of R and B pixels are expanded into all pixels using a correlation between a W pixel and an R pixel and a correlation between a W pixel and a B pixel. Thereafter, the following equation: G=W−R−B is computed. The components of the W pixels are fitted into all pixels. Thus, as shown in FIG. 33D, four pixels for the RGB Bayer arrangement are generated.

Figure 34A:
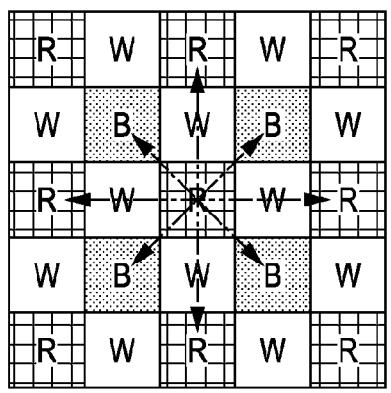
FIGS. 34A to 34E are schematic illustrations of a pixel addition process performed in the case of the color coding according to the fifth example of the first exemplary embodiment.
Figure 34B:
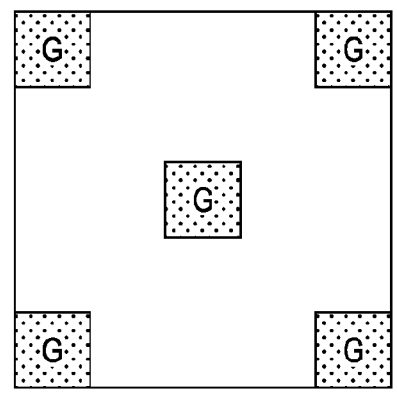
Figure 34C:
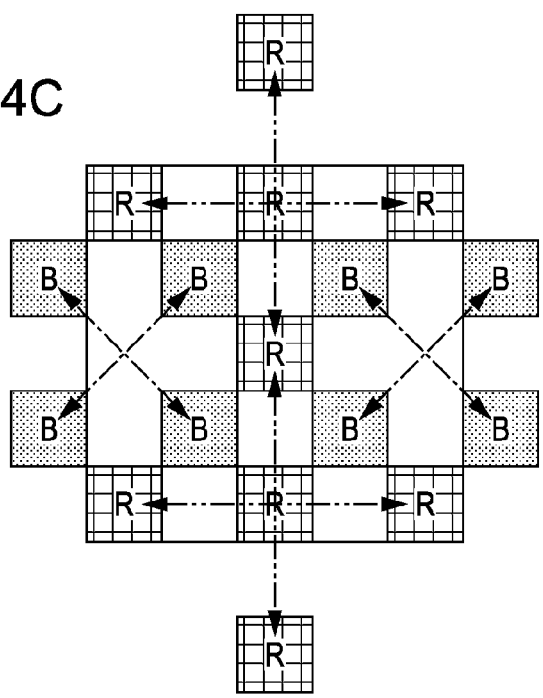
Figure 34D:
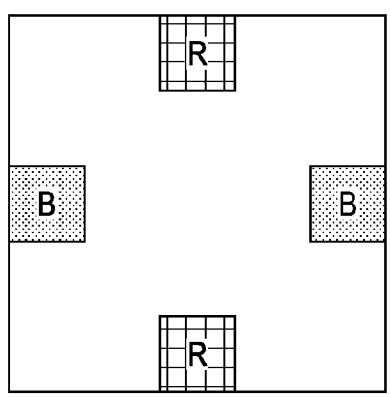
Figure 34E:
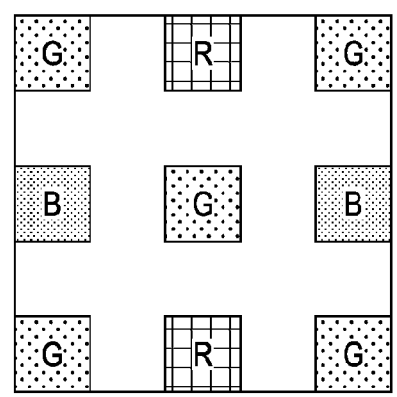

The pixel addition is described next with reference to schematic illustrations shown in FIGS. 34A to 34E. As shown in FIG. 34A, the centroid locations of R, G, and B pixels are aligned. The signals of R pixels are summed. The signals of G pixels are summed, and the signals of B pixels are summed. Subsequently, as shown in FIG. 34B, G signals are generated by computing the following equation: G=W−R−B. Thereafter, as shown in FIG. 34C, diagonal direction four-pixel addition is performed for the B pixels, and up-and-down left-and-right five-pixel addition is performed for the R pixels. Thus, the R pixels and the B pixels are generated. Finally, as shown in FIG. 34D, four pixels for the RGB Bayer arrangement are generated.

Color Coding According to Sixth Example of First Exemplary Embodiment

Figure 35A:
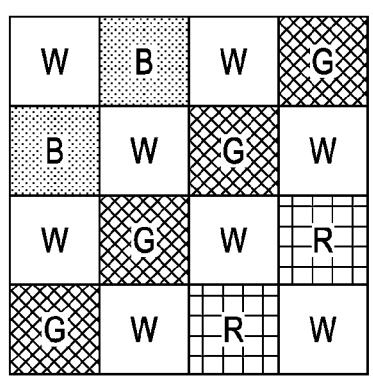
FIGS. 35A to 35D are schematic illustrations of a color conversion process 1 performed in the case of the color coding according to a sixth example of the first exemplary embodiment.
Figure 35B:
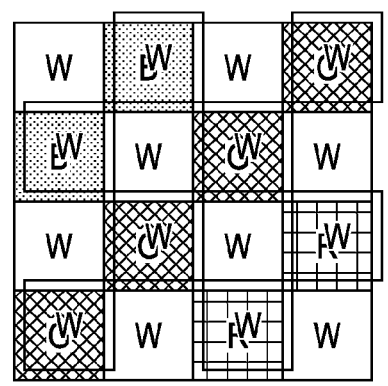
Figure 35C:
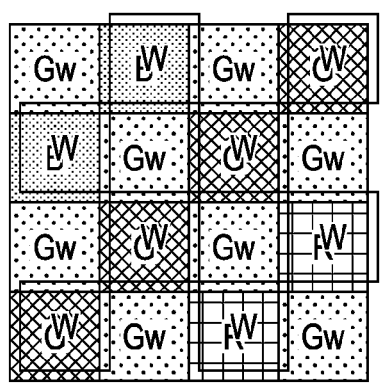
Figure 35D:
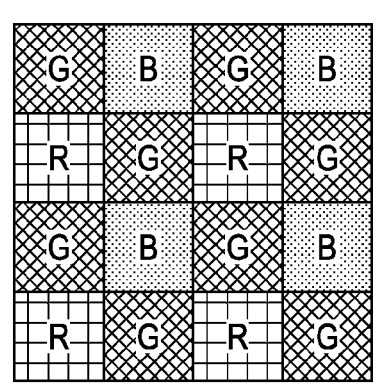

A color conversion process 1 at a time of full scanning is described first with reference to schematic illustrations shown in FIGS. 35A to 35D. In a color arrangement of a 4×4 pixel block according to the sixth example of the first exemplary embodiment shown in FIG. 35A, the components of W pixels arranged in a checkerboard pattern are expanded into pixels of all colors using the direction of resolution, as shown in FIG. 35B. Subsequently, as shown in FIG. 35C, the W pixels are replaced with G pixels using a correlation between a W pixel and a G pixel. Thereafter, as shown in FIG. 35D, R and B pixels are generated for the RGB Bayer arrangement using a correlation between a W pixel and an R pixel and a correlation between a W pixel and a B pixel.

Figure 36A:
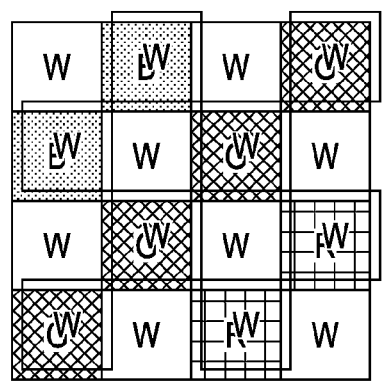
FIGS. 36A to 36D are schematic illustrations of a color conversion process 2 performed in the case of the color coding according to the sixth example of the first exemplary embodiment.
Figure 36B:
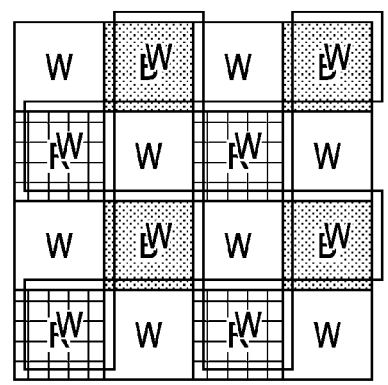
Figure 36C:
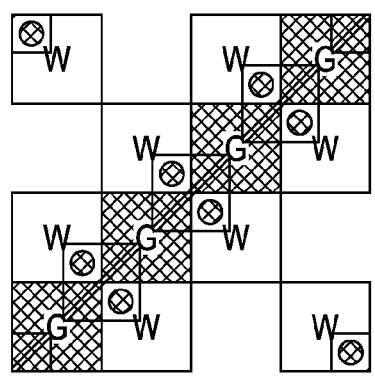
Figure 36D:
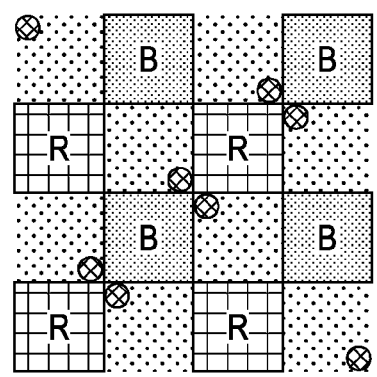

A color conversion process 2 at a time of full scanning is described next with reference to schematic illustrations shown in FIGS. 36A to 36D. Like the color conversion process 1, in a color arrangement of a 4×4 pixel block according to the sixth example of the first exemplary embodiment, the components of W pixels arranged in a checkerboard pattern are expanded into pixels of all colors using the direction of resolution, as shown in FIG. 36A. Subsequently, as shown in FIG. 36B, R and B pixels are generated using a correlation between a W pixel and an R pixel and a correlation between a W pixel and a B pixel. Thereafter, as shown in FIG. 36C, the signals of two G pixels adjacent to the W pixel are added to the signal of the W pixel so as to be approximated to G (=W+2G). In this way, as shown in FIG. 36D, each of the R and B pixels is generated for the Bayer arrangement. At that time, if the direction is found, the addition ratio can be dynamically changed.

Figure 37A:
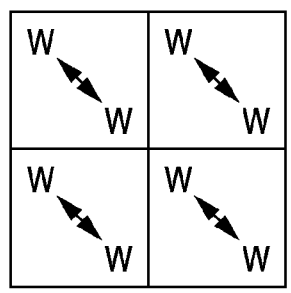
FIGS. 37A to 37D are schematic illustrations of a pixel addition process 1 performed in the case of the color coding according to the sixth example of the first exemplary embodiment.
Figure 37B:
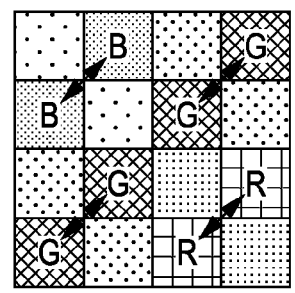
Figure 37C:
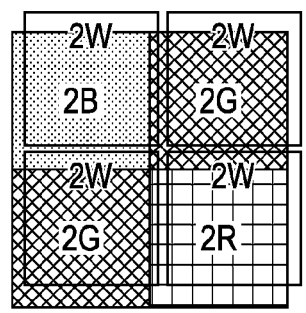
Figure 37D:
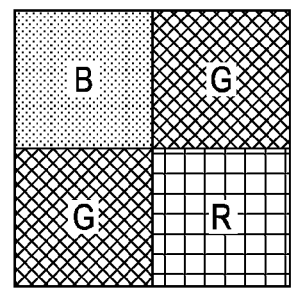

The pixel addition process 1 is described next with reference to FIGS. 37A to 37D. As shown in FIGS. 37A and 37B, left-up and right-up diagonal FD addition is performed for a W pixel and each of R, G, and B pixels. Thus, W, R, G, and B pixels are generated. Thereafter, as shown in FIG. 37C, the components of the W pixel are fitted into each of the pixels. In this way, as shown in FIG. 37D, four pixels for the RGB Bayer arrangement are generated.

Figure 38A:
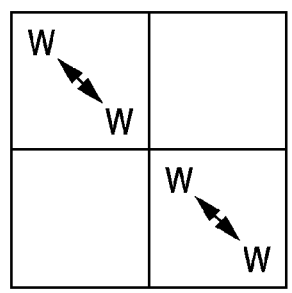
FIGS. 38A to 38D are schematic illustrations of a pixel addition process 2 performed in the case of the color coding according to the sixth example of the first exemplary embodiment.
Figure 38B:
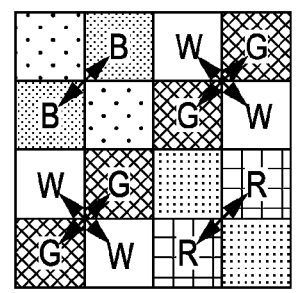
Figure 38C:
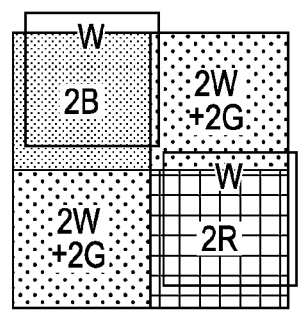
Figure 38D:
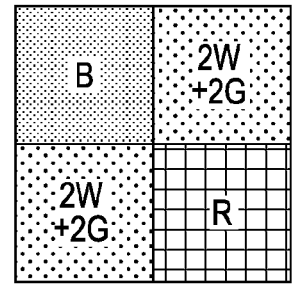

A pixel addition process 2 is described next with reference to FIGS. 38A to 38D. As shown in FIGS. 38A and 38B, left-up and right-up diagonal FD addition is performed for a W pixel and each of R, G, and B pixels. Thus, W, R, G, and B pixels are generated. Thereafter, as shown in FIG. 38C, the components of the W pixel are fitted into each of the R and B pixels. In this way, as shown in FIG. 38D, four pixels for the RGB Bayer arrangement are generated.

Color Coding According to Seventh Example of First Exemplary Embodiment

Figure 39A:
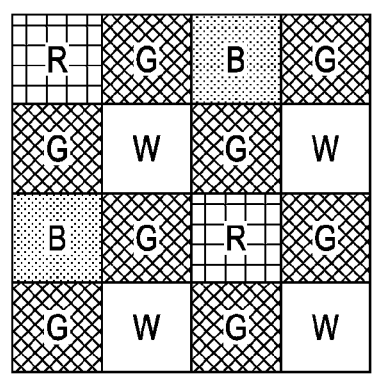
FIGS. 39A to 39D are schematic illustrations of a color conversion process performed at a time of full scanning in the case of the color coding according to a seventh example of the first exemplary embodiment.
Figure 39B:
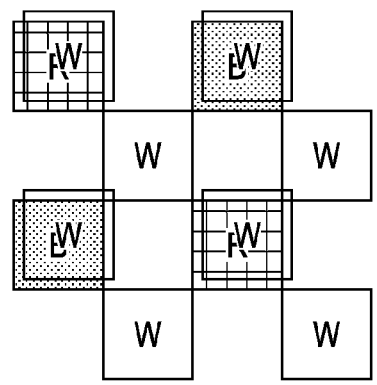
Figure 39C:
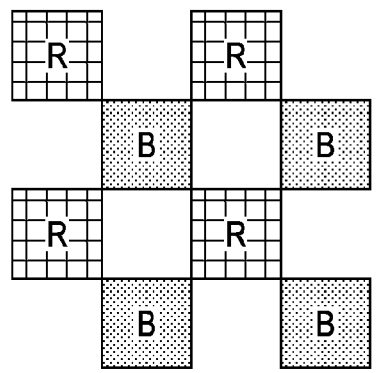
Figure 39D:
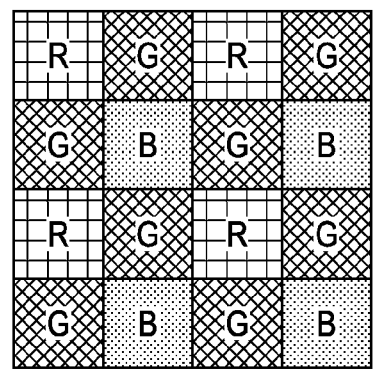

A color conversion process at a time of full scanning is described first with reference to schematic illustrations shown in FIGS. 39A to 39D. In a color arrangement of a 4×4 pixel block according to the seventh example of the first exemplary embodiment shown in FIG. 39A, the components of G pixels arranged in a checkerboard pattern are expanded into R and B pixels using the direction of resolution, as shown in FIG. 39B. Subsequently, as shown in FIG. 39C, the W pixels are replaced with the R and B pixels using a correlation between a W pixel and an R pixel and a correlation between a W pixel and a B pixel. Thus, as shown in FIG. 39D, four pixels for the RGB Bayer arrangement are generated.

A pixel addition process is described next with reference to schematic illustrations shown in FIGS. 40A to 40E. As shown in FIG. 40A, for R pixels and B pixels, addition is performed between two alternate pixels arranged in the upper left-bottom right diagonal directions and in the upper right-bottom left diagonal directions, respectively. Thus, as shown in FIGS. 40B, 2R and 2B pixels are generated. Thereafter, as shown in FIG. 40C, diagonal diamond-shape addition is performed on G pixels. Thus, as shown in FIG. 40D, 4G pixels are generated. Subsequently, Gw, Rw, and Bw are added to the W pixels using a correlation between a W pixel and an R pixel, a correlation between a W pixel and a B pixel, and a correlation between a W pixel and a B pixel. In this way, as shown in FIG. 40E, four pixels for the RGB Bayer arrangement are generated.

Color Coding According to Eighth Example of First Exemplary Embodiment

Figure 41A:
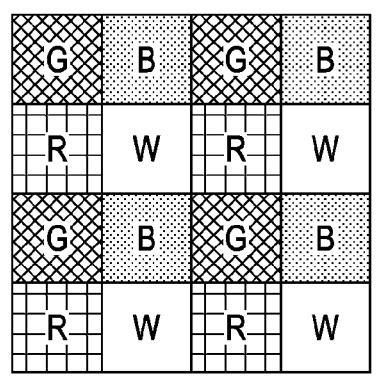
FIGS. 41A to 41D are schematic illustrations of a color conversion process performed at a time of full scanning in the case of the color coding according to an eighth example of the first exemplary embodiment.
Figure 41B:
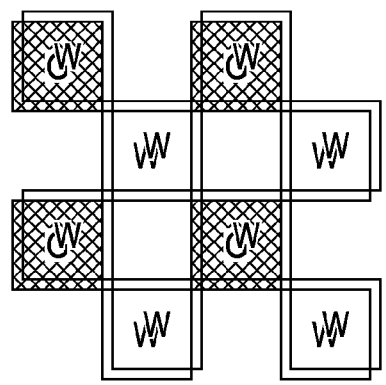
Figure 41C:
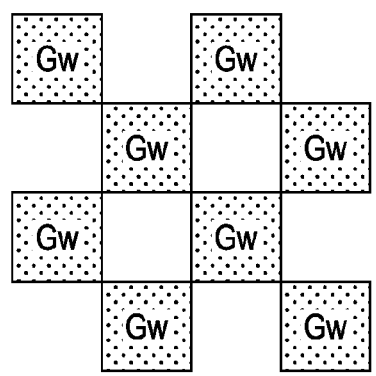
Figure 41D:
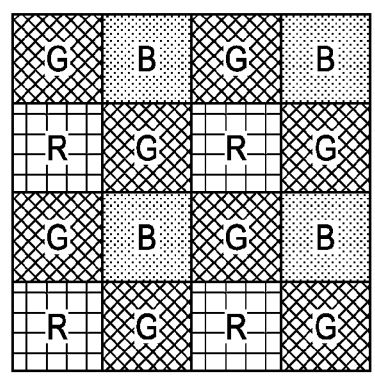

A color conversion process at a time of full scanning is described with reference to schematic illustrations shown in FIGS. 41A to 41D. In a color arrangement of a 4×4 pixel block according to the eighth example of the first exemplary embodiment shown in FIG. 41A, the component of W pixels are expanded into the G and W pixels so as to be arranged in a checkerboard pattern using the direction of resolution, as shown in FIG. 41B. Subsequently, as shown in FIG. 41C, the components of the W pixels are fitted into the G pixels. Thus, as shown in FIG. 41D, four pixels for the RGB Bayer arrangement are generated.

Figure 42A:
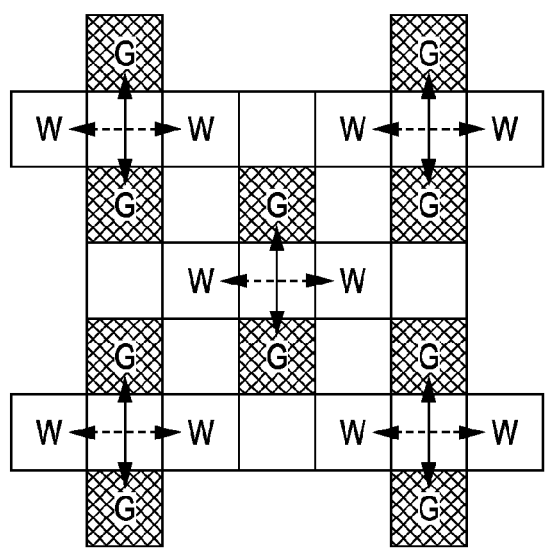
FIGS. 42A to 42D are schematic illustrations of a pixel addition process performed in the case of the color coding according to the eighth example of the first exemplary embodiment.
Figure 42B:
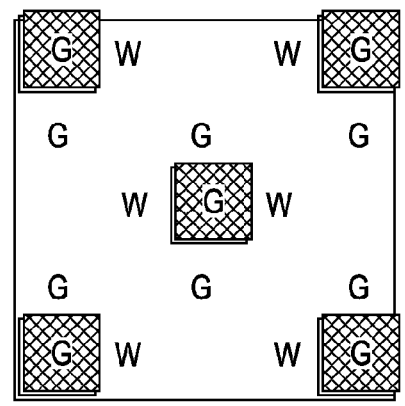
Figure 42C:
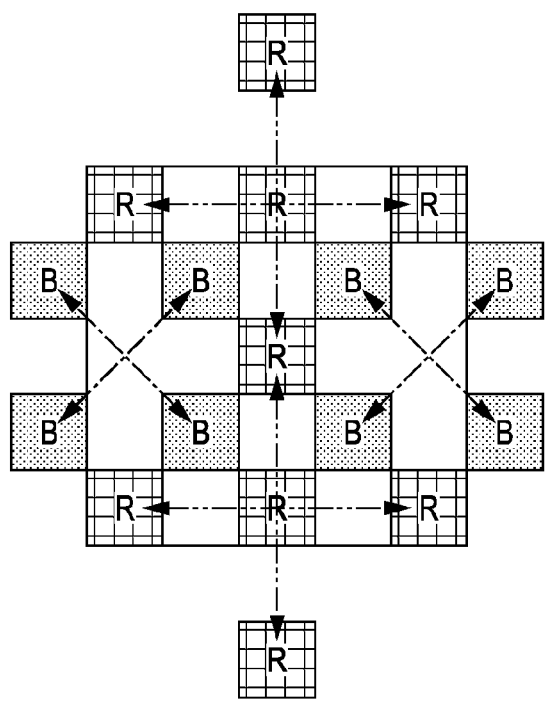
Figure 42D:
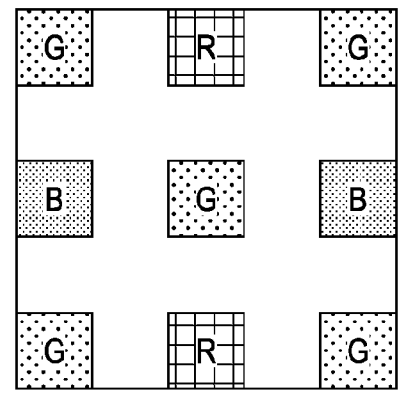

The pixel addition process is described next with reference to schematic illustrations shown in FIGS. 42A to 42D. As shown in FIG. 42A, the centroid locations of G and W pixels are aligned. The signals of G pixels are summed, and the signals of W pixels are summed. Subsequently, as shown in FIG. 42B, the components of the W pixels are fitted into the G pixels. Thus, G=G+Gw is generated. Thereafter, as shown in FIG. 42C, diagonal direction four-pixel addition is performed for the B pixels, and up-and-down left-and-right five-pixel addition is performed for the R pixels. Thus, as shown in FIG. 42D, four pixels for the RGB Bayer arrangement are generated.

Color Coding According to Ninth Example of First Exemplary Embodiment

Figure 43A:
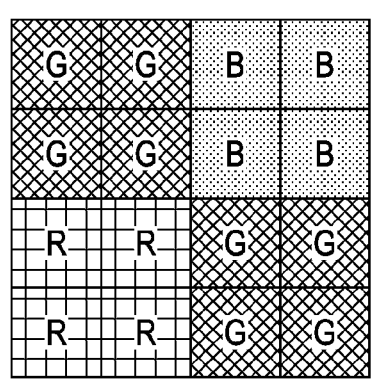
FIGS. 43A to 43C are schematic illustrations of a color conversion process performed at a time of full scanning in the case of the color coding according to a ninth example of the first exemplary embodiment.
Figure 43B:
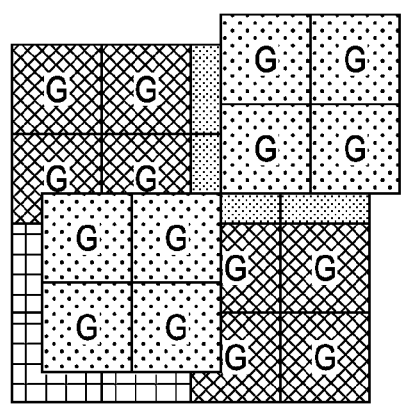
Figure 43C:
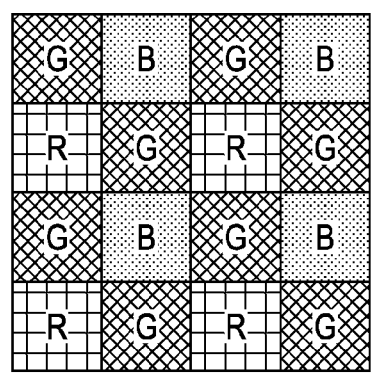

A color conversion process at a time of full scanning is described with reference to schematic illustrations shown in FIGS. 43A to 43C. In a color arrangement of a 4×4 pixel block according to the ninth example of the first exemplary embodiment shown in FIG. 43A, the components of the G pixels are expanded into R and B pixels using the direction of resolution, as shown in FIG. 43B. Subsequently, as shown in FIG. 43C, four pixels for the RGB Bayer arrangement are generated using a correlation between a G pixel and an R pixel and a correlation between a G pixel and a B pixel.

Figure 44A:
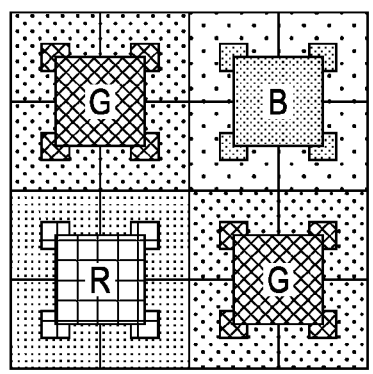
FIGS. 44A to 44B are schematic illustrations of a pixel addition process performed in the case of the color coding according to the ninth example of the first exemplary embodiment.
Figure 44B:
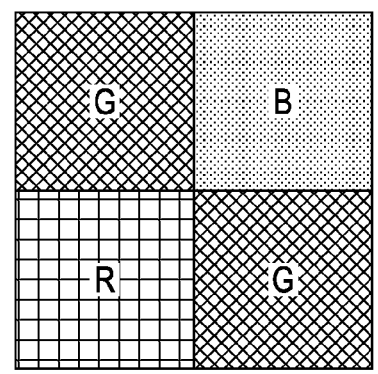

The pixel addition process is described next with reference to schematic illustrations shown in FIGS. 44A and 44B. As shown in FIG. 44A, FD addition is performed on the signals of four pixels of a 2×2 pixel block of the same color. Finally, as shown in FIG. 44B, four pixels for the RGB Bayer arrangement are generated.

2. Second Exemplary Embodiment

A second exemplary embodiment is described next with reference to the accompanying drawings.

System Configuration

FIG. 1 is a schematic illustration of an exemplary system configuration of a CMOS image sensor, which is an example of a solid-state imaging device (an X-Y addressing solid-state imaging device) according to a second exemplary embodiment based on the first exemplary embodiment.

As shown in FIG. 1, each of CMOS image sensors 10, 10A, 10B, . . . includes a semiconductor substrate (hereinafter also referred to as a "sensor chip") 11, a pixel array unit 12, a vertical drive unit 13, a column processing unit 14, a horizontal drive unit 15, a conversion processing unit 16, a system control unit 17, and a color filter array (a color filter unit) 30. As shown in FIG. 2, a unit pixel 20 includes a photodiode 21, a transfer transistor 22, a reset transistor 23, an amplifying transistor 24, and a selection transistor 25, and a floating diffusion (FD) unit 26. A reference numeral "40" denotes a DSP circuit.

According to the present embodiment, in the CMOS image sensor 10A, the pixel array unit 12 is formed on the semiconductor substrate (the sensor chip) 11. In addition, a peripheral circuit unit is integrated onto the semiconductor substrate 11 having the pixel array unit 12 formed thereon. For example, the peripheral circuit unit includes the vertical drive unit 13, the column processing unit 14, the horizontal drive unit 15, the conversion processing unit 16, and the system control unit 17.

The pixel array unit 12 includes a plurality of unit pixels (not shown), each including a photoelectric conversion element, two-dimensionally arranged in an array. The unit pixel (hereinafter also simply referred to as a "pixel") photoelectrically converts visible light incident thereon into electrical charge in accordance with the intensity of the visible light. The color filter array 30 is provided on the pixel array unit 12 on the side of a light receiving surface (a light incident surface). One of the key features of the present exemplary embodiment is the color coding of the color filter array 30. The color coding of the color filter array 30 is described in more detail below.

Furthermore, in the pixel array unit 12, a pixel drive line 18 is disposed in the left-right direction of FIG. 1 (a direction in which the pixels of a pixel row are arranged or the horizontal direction) for each of the rows of the pixel array. Similarly, a vertical signal line 19 is disposed in the up-down direction of FIG. 1 (a direction in which the pixels of a pixel column are arranged or the vertical direction) for each of the columns of the pixel array. In FIG. 1, while only one pixel drive line 18 is illustrated, the number of the pixel drive lines 18 is not limited to 1. One end of the pixel drive line 18 is connected to an output terminal corresponding to one of the rows of the vertical drive unit 13.

For example, the vertical drive unit 13 includes a shift register and an address decoder. Although the detailed configuration thereof is not shown in FIG. 1, the vertical drive unit 13 includes a readout scanning system and a sweeping scanning system. The readout scanning system sequentially scans the unit pixels from which signals are read by a row-by-row basis.

In contrast, prior to the readout scanning operation of the readout row performed by the readout scanning system by the time determined by a shutter speed, the sweeping scanning system performs sweeping scanning so that unnecessary electrical charge is swept (reset) out of the photoelectric conversion elements of the unit pixels in the readout row. By sweeping (resetting) the unnecessary electrical charge using the sweeping scanning system, a so-called electronic shutter operation is performed. That is, in the electronic shutter operation, the light electrical charge of the photoelectric conversion element is discarded, and a new exposure operation (accumulation of light electrical charge) is started.

A signal read through a readout operation performed by the readout scanning system corresponds to the amount of light made incident after the immediately previous readout operation or electronic shutter operation is performed. In addition, a period of time from a readout time point of the immediately previous readout operation or a sweeping time point of the electronic shutter operation to the readout time point of the current readout operation corresponds to an accumulation time (an exposure time) of the light electrical charge in the unit pixel.

A signal output from each of the unit pixels in the pixel row selected and scanned by the vertical drive unit 13 is supplied to the column processing unit 14 via the corresponding one of the vertical signal lines 19. For each of the pixel columns of the pixel array unit 12, the column processing unit 14 performs predetermined signal processing on the analog pixel signal output from the pixel in the selected row.

An example of the signal processing performed by the column processing unit 14 is a correlated double sampling (CDS) process. In the CDS process, the reset level and the signal level output from each of the pixels in the selected row are retrieved, and the difference between the levels is computed. Thus, a signal of the pixels in the selected row is obtained. In addition, fixed pattern noise of the pixels is removed. The column processing unit 14 may have an analog-to-digital (A/D) conversion function for converting the analog pixel signal into a digital format.

For example, the horizontal drive unit 15 includes a shift register and an address decoder. The horizontal drive unit 15 sequentially selects and scans a circuit portion corresponding to a pixel column of the column processing unit 14. Each of the pixel columns is sequentially processed by the column processing unit 14 through the selection scanning operation performed by the horizontal drive unit 15 and is sequentially output.

The conversion processing unit 16 performs computation and converts signals corresponding to the color arrangement of the color filter array (the color filter unit) 30 and output from the pixels of the pixel array unit 12 via the column processing unit 14 into signals corresponding to the Bayer arrangement. Another of the key features of the present embodiment is that the conversion processing unit 16 is mounted on the substrate on which the pixel array unit 12 is formed, that is, the sensor chip 11, a color conversion process is performed in the sensor chip 11, and a signal corresponding to the Bayer arrangement is output from the sensor chip 11. The color conversion process performed by the conversion processing unit 16 is described in more detail below.

As widely used, the term "Bayer arrangement" represents a color arrangement in which a color serving as a primary color information component of a luminance signal for high resolution is arranged in a checkerboard pattern, and the other two colors serving as color information components of the luminance signal for not-so-high resolution are arranged in the other area of the checkerboard pattern. In a basic color coding form of the Bayer arrangement, green (G) that has high contribution of the luminance signal is arranged in a checkerboard pattern, and red (R) and blue (B) are arranged in the other area of the checkerboard pattern.

The system control unit 17 receives a clock provided from outside the sensor chip 11 and data for indicating an operating mode. In addition, the system control unit 17 outputs data representing internal information of the CMOS image sensor 10. Furthermore, the system control unit 17 includes a timing generator that generates a variety of timing signals. The system control unit 17 controls driving of the vertical drive unit 13, the column processing unit 14, the horizontal drive unit 15, and the conversion processing unit 16 using the variety of timing signals generated by the timing generator.

Circuit Configuration of Unit Pixel

FIG. 2 is an exemplary circuit diagram of a unit pixel 20. As shown in FIG. 2, the unit pixel 20 illustrated in the exemplary circuit diagram includes a photoelectric conversion element (e.g., a photodiode 21) and four transistors (e.g., a transfer transistor 22, a reset transistor 23, an amplifying transistor 24, and a selection transistor 25).

In this example, N-channel MOS transistors are used for the transfer transistor 22, the reset transistor 23, the amplifying transistor 24, and the selection transistor 25. However, the combination of a conductive type using the transfer transistor 22, the reset transistor 23, the amplifying transistor 24, and the selection transistor 25 is only an example, and the combination is not limited thereto.

For example, as the pixel drive line 18, three drive lines, that is, a transfer line 181, a reset line 182, and a selection line 183 are provided to each of the unit pixels 20 in the same pixel row. One end of the transfer line 181, one end of the reset line 182, and one end of the selection line 183 are connected to an output terminal corresponding to one of the pixel rows of the vertical drive unit 13.

An anode electrode of the photodiode 21 is connected to a negative power supply (e.g., the ground). The photodiode 21 photoelectrically converts received light into photocharges (photoelectrons in this exemplary embodiment) in accordance with the amount of received light. A cathode electrode of the photodiode 21 is connected to the gate electrode of the amplifying transistor 24 via the transfer transistor 22. A node 26 electrically connected to the gate electrode of the amplifying transistor 24 is referred to as a "floating diffusion (FD) unit".

The transfer transistor 22 is connected between the cathode electrode of the photodiode 21 and the FD unit 26. When a transfer pulse φTRF having an active high level (e.g., a Vdd level) (hereinafter referred to as a "high active transfer pulse") is supplied to a gate electrode of the transfer transistor 22 via the transfer line 181, the transfer transistor 22 is turned on. Thus, the transfer transistor 22 transfers the photocharges photoelectrically converted by the photodiode 21 to the FD unit 26.

A drain electrode of the reset transistor 23 is connected to a pixel power supply Vdd. The source electrode of the reset transistor 23 is connected to the FD unit 26. Before the signal charge is transferred from the photodiode 21 to the FD unit 26, a high active reset pulse φRST is supplied to a gate electrode of the reset transistor 23 via the reset line 182. When the reset pulse φRST is supplied to the reset transistor 23, the reset transistor 23 is turned on. Thus, the reset transistor 23 resets the FD unit 26 by discharging the electrical charge of the FD unit 26 to the pixel power supply Vdd.

The gate electrode of the amplifying transistor 24 is connected to the FD unit 26. A drain electrode of the amplifying transistor 24 is connected to the pixel power supply Vdd. After the FD unit 26 is reset by the reset transistor 23, the amplifying transistor 24 outputs the potential of the FD unit 26 in the form of a reset signal (a reset level) Vreset. In addition, after the signal charge is transferred by the transfer transistor 22, the amplifying transistor 24 outputs the potential of the FD unit 26 in the form of a light accumulation signal (a signal level) Vsig.

For example, a drain electrode of the selection transistor 25 is connected to the source electrode of the amplifying transistor 24. The source electrode of the selection transistor 25 is connected to the vertical signal line 17. When a high active selection pulse φSEL is supplied to the gate electrode of the selection transistor 25 via the selection line 163, the selection transistor 25 is turned on. Thus, the selection transistor 25 causes the unit pixel 20 to enter a selected mode so that a signal output from the amplifying transistor 24 is relayed to the vertical signal line 17.

Note that a circuit configuration in which the selection transistor 25 is connected between the pixel power supply Vdd and the drain of the amplifying transistor 24 may be employed.

It should be noted that the pixel structure of the unit pixel 20 is not limited to the above-described four-transistor pixel structure. For example, the unit pixel 20 may have a three-transistor pixel structure in which the functions of the amplifying transistor 24 and the selection transistor 25 are performed by one transistor. Thus, any configuration of a pixel circuit can be employed.

In general, in order to increase a frame rate when a moving image is captured, pixel addition in which signals output from a plurality of neighboring pixels are summed and read out is performed. The pixel addition is performed in a pixel, signal lines, the column processing unit 14, or a downstream signal processing unit. In the present embodiment, for example, a pixel structure in which four pixels arranged so as to be adjacent to one another in the vertical direction and the horizontal direction is described.

FIG. 3 is a circuit diagram of an exemplary configuration of a circuit that allows pixel addition for four neighboring pixels to be performed in the pixels. The same numbering will be used in describing FIG. 3 as was utilized above in describing FIG. 2, where appropriate.

In FIG. 3, the photodiodes 21 of the four pixels arranged so as to be adjacent to one another in the vertical direction and the horizontal direction are denoted as photodiodes 21-1, 21-2, 21-3, and 21-4. Four transfer transistors 22-1, 22-2, 22-3, and 22-4 are provided to the photodiodes 21-1, 21-2, 21-3, and 21-4, respectively. In addition, the one reset transistor 23, the one amplifier transistor 24, and the one selection transistor 25 are used.

That is, one of the electrodes of the transfer transistor 22-1, one of the electrodes of the transfer transistor 22-2, one of the electrodes of the transfer transistor 22-3, and one of the electrodes of the transfer transistor 22-4 are connected to the cathode electrode of the photodiode 21-1, the cathode electrode of the photodiode 21-2, the cathode electrode of the photodiode 21-3, and the cathode electrode of the photodiode 21-4, respectively. The other electrode of the transfer transistor 22-1, the other electrode of the transfer transistor 22-2, the other electrode of the transfer transistor 22-3, and the other electrode of the transfer transistor 22-4 are commonly connected to the gate electrode of the amplifier transistor 24. In addition, the FD unit 26 that is shared by the photodiodes 21-1, 21-2, 21-3, and 21-4 is electrically connected to the gate electrode of the amplifier transistor 24. The drain electrode of the reset transistor 23 is connected to the pixel power supply Vdd, and the source electrode of the reset transistor 23 is connected to the FD unit 26.

In the above-described pixel structure that supports the pixel addition for four neighboring pixels, by providing the transfer pulse φTRF to the four transfer transistors 22-1, 22-2, 22-3, and 22-4 at the same time, pixel addition for four neighboring pixels can be performed. That is, the signal charges transferred from the photodiodes 21-1, 21-2, 21-3, and 21-4 to the FD unit 26 by the four transfer transistors 22-1, 22-2, 22-3, and 22-4 are summed by the FD unit 26.

In contrast, by providing the transfer pulse φTRF to the four transfer transistors 22-1, 22-2, 22-3, and 22-4 at different points of time, the signals can be output on a pixel-by-pixel basis. That is, when a moving image is captured, the frame rate can be increased by performing pixel addition. In contrast, when a still image is captured, the resolution can be increased by independently reading the signals of all of the pixels.

Color Coding of Color Filter Array

The color coding of the color filter array 30 which is one of the features of the present exemplary embodiment is described next.

According to the present exemplary embodiment, the color filter array 30 employs color coding in which filters of a first color serving as one of primary color information components of a luminance signal are arranged in a checkerboard pattern. In addition, filters of a second color of the primary color information components for a series of four pixels form a group, and the groups are arranged so as to form a stripe pattern in one of a diagonal direction, a vertical direction, and a horizontal direction. In the present embodiment, the filters of a first color and a second color of the primary colors of a luminance signal are, for example, a W filter and a G filter.

The filters of W and G colors which are primary components of a luminance signal have sensitivities higher than those of filters of other colors (more specifically, R and B filters). In particular, the W filter has sensitivity about twice that of the G filter. Accordingly, by arranging the W and G filters (in particular, the W filters) in a checkerboard pattern, the sensitivity (the S/N ratio) can be increased. However, since a W filter contains various color information, a false color which is different from the original color of a subject tends to appear. In contrast, although a G filter has sensitivity lower than that of a W filter, a G filter produces few false colors. That is, there is a trade-off between the sensitivity and generation of a false color.

When W filters are arranged in a checkerboard pattern for the primary color, R, G, and B filters are arranged in the other areas of the checkerboard pattern for the other color information components. In contrast, when G filters are arranged in a checkerboard pattern for the primary color, R and B filters are arranged in the other areas of the checkerboard pattern for the other color information components.

In this way, by using, for the color filter array 30, color coding in which W filters for the primary color of a luminance signal are arranged in a checkerboard pattern, the sensitivity of the CMOS image sensor 10 can be increased, since the W filter has a sensitivity higher than a filter of another color. In contrast, by using, for the color filter array 30, color coding in which G filters for the primary color of a luminance signal are arranged in a checkerboard pattern, the color reproducibility of the CMOS image sensor 10 can be increased, since the G filter produces few false colors.

In addition, in the CMOS image sensor 10A according to the present embodiment, when the color filter array 30 using either one of the color coding methods is used, a signal corresponding to the color arrangement is converted into a signal corresponding to the Bayer arrangement by the sensor chip 11. At that time, since the color serving as the primary component of a luminance signal is arranged in a checkerboard pattern, signals of other colors of pixels adjacent to the color in the vertical direction and the horizontal direction can be restored using the signal of the color serving as the primary component of a luminance signal. Consequently, the efficiency of color conversion performed by the conversion processing unit 16 can be increased.

In addition, by outputting the signal corresponding to the Bayer arrangement from the sensor chip 11, an existing DSP for the Bayer arrangement can be used as a downstream signal processing unit. Basically, the DSP for the Bayer arrangement generates a luminance signal Y and two color difference signals U(B−Y) and V(R−Y) using the signal output from the sensor chip 11 and corresponding to the Bayer arrangement.

In this way, since an existing DSP for the Bayer arrangement can be used, development of a new DSP that is significantly costly is not necessary even when the color coding of the color filter array 30 is changed. Accordingly, a camera module including a DSP can be produced at a low cost. As a result, the widespread use of the color filter array 30 using, in particular, a W filter can be expected.

Examples of Color Coding of Color Filter Array

Examples of color coding that facilitate conversion from a signal corresponding to a color arrangement in which filters of a color serving as a primary component of a luminance signal are arranged in a checkerboard pattern to a signal corresponding to an RGB Bayer arrangement are described in detail below.

First Example of Second Exemplary Embodiment

Figures 45, 46:
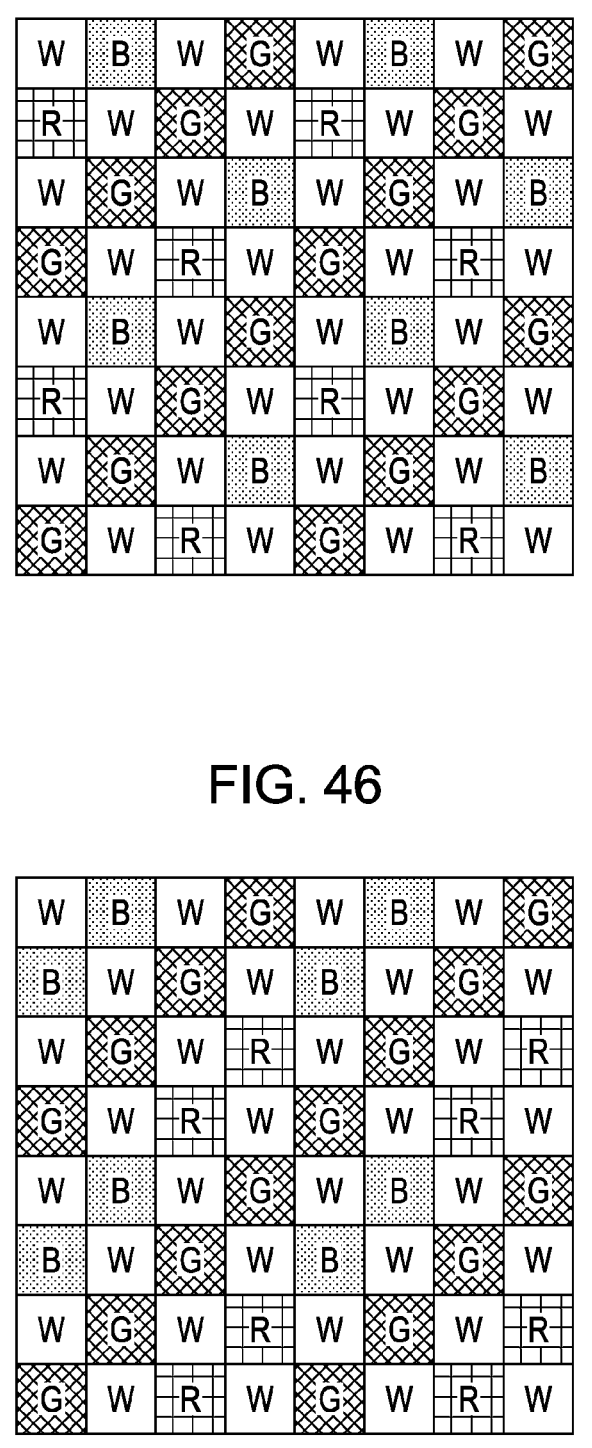

FIG. 45 is a color arrangement diagram illustrating color coding according to a first example of the second exemplary embodiment. As shown in FIG. 45, in the color coding according to the first example of the second exemplary embodiment, W filters are arranged in a checkerboard pattern. In addition, R filters are arranged in a checkerboard pattern at a two-pixel pitch in the vertical direction and the horizontal direction. Similarly, B filters are arranged in a checkerboard pattern at a two-pixel pitch in the vertical direction and the horizontal direction. Furthermore, one of the R filters is diagonally shifted from one of the B filters by one pixel. In addition, G filters are arranged in the other area of the checkerboard pattern.

More specifically, in an array including four pixels in each of the vertical direction and the horizontal direction, W filters are arranged in a checkerboard pattern. R filters are arranged in the second row and first column and in the fourth row and third column. B filters are arranged in the first row and second column and in the third row and fourth column. This array is the checkerboard pattern having a two-pixel pitch. In addition, G filters are arranged in the other area of the checkerboard pattern. At that time, the G filters form a diagonal stripe pattern.

Second Example of Second Exemplary Embodiment

FIG. 46 is a color arrangement diagram illustrating color coding according to a second example of the second exemplary embodiment. As shown in FIG. 46, in the color coding according to the second example of the second exemplary embodiment, W filters are arranged in a checkerboard pattern. R filters are squarely arranged in a checkerboard pattern at a four-pixel pitch in the vertical direction and the horizontal direction. Similarly, B filters are squarely arranged in a checkerboard pattern at a four-pixel pitch in the vertical direction and the horizontal direction. In addition, the R filters and the B filters are diagonally shifted from each other by two pixels. In addition, G filters are arranged in the other area in the checkerboard pattern.

More specifically, in an array including four pixels in each of the vertical direction and the horizontal direction, W filters are arranged in a checkerboard pattern. R filters are disposed in the third row and fourth column. B filters are disposed in the first row and second column and in the second row and first column. This array is the square array having a four-pixel pitch in the vertical direction and the horizontal direction. In addition, G filters are arranged in the other area of the checkerboard pattern. At that time, the G filters form a diagonal stripe pattern.

The color coding methods according to the above-described first and second examples use a color arrangement in which W filters having a color serving as a primary component of a luminance signal that maximizes the output level are arranged in a checkerboard pattern. Since the W filters that include R, G, and B color components are arranged in a checkerboard pattern, the conversion accuracy of a signal corresponding to the RGB Bayer arrangement can be increased.

The key feature of these color coding methods is that if the W filters are replaced with G filters during the color conversion process described below, the locations of the R and B filters are partially coincident with those of R and B filters of the Bayer arrangement. In addition, for the locations at which colors are not coincident, information regarding pixels of the W filters can be used. Thus, R and B pixel information can be restored. As a result, conversion efficiency can be significantly increased.

In addition, the key feature of the color coding methods according to the first and second examples of the second exemplary embodiment is that the W filters are arranged in a checkerboard pattern, and a series of four G filters arranged in a diagonal direction repeatedly appears so that a diagonal stripe pattern is formed. In such color coding methods, by adding the signal of a pixel of a G filter adjacent to a pixel of a W filter to the signal of the W filter and using the sum as a primary component of a luminance signal, the intensity of the luminance signal can be increased. Accordingly, the sensitivity (the S/N ratio) can be increased. In particular, in the color coding method according to the first example, the R filters are arranged in a checkerboard pattern at a two-pixel pitch in the vertical direction and in the horizontal direction. In addition, each of the R filters is diagonally shifted from one of the B filters by one pixel. Accordingly, the efficiency of conversion into a signal corresponding to the Bayer arrangement can be increased.

In the color coding methods according to the first and second examples of the second embodiment, a series of four G filters arranged in a diagonal direction repeatedly appears so that a diagonal stripe pattern is formed. Accordingly, in such color coding methods, by adding the signal of a G pixel or the signals of G pixels adjacent to a W pixel to the signal of the W pixel and using the sum signal as a primary component of a luminance signal, a high sensitivity (a high S/N ratio) can be provided without a decrease in resolution. This advantage can be provided not only when a series of four G filters arranged in a diagonal direction repeatedly appears so that a diagonal stripe pattern is formed, but also when a series of four G filters arranged in the vertical direction or the horizontal direction repeatedly appears so that a stripe pattern is formed.

Sensitivity Ratio W:G:R:B

A sensitivity ratio W:G:R:B is described next. In color coding including W filters, a W filter pixel that has a high output signal level is saturated earlier than a pixel of other color filters. Accordingly, it is necessary that a sensitivity balance among W, G, R, and B pixels be sustained, that is, the sensitivity ratio W:G:R:B be adjusted by decreasing the sensitivity of the W filter pixel and increasing the sensitivities of the other color filter pixel relative to the sensitivity of the W filter pixel.

In order to adjusting the sensitivity ratio, widely used exposure control techniques can be used. More specifically, by adjusting the size of an on-chip microlens provided outside the color filter array 30 for each of the pixels of the color filter array 30, the balance among the amounts of light made incident on individual colors is sustainable (refer to, for example, Japanese Unexamined Patent Application Publication No. 9-116127). By using this technique and decreasing the size of an on-chip microlens for a W color than that for one of the other colors, the sensitivity of the W filter pixel can be decreased. In this way, the sensitivity of one of the other color filter pixel can be relatively increased.

Alternatively, an exposure light control technique in which, in color coding including a W filter, the difference between the sensitivities can be reduced by removing an on-chip microlens for a W pixel, and a color S/N can be improved by increasing the color sensitivity can be used (refer to, for example, Japanese Unexamined Patent Application Publication No. 2007-287891). By using this technique, the sensitivity of the W filter pixel can be decreased. In this way, the sensitivity of one of the other color filter pixel can be relatively increased.

Still alternatively, a technique for preventing the improper color balance by performing shutter exposure control in which the exposure time of a G filter pixel is decreased compared with that for an R or B filter pixel can be used (refer to, for example, Japanese Unexamined Patent Application Publication No. 2003-60992). By combining such a shutter exposure control technique with control of light-receiving area, the sensitivity of the W filter pixel can be decreased. In this way, the sensitivity of one of the other color filter pixel can be relatively increased. Furthermore, in particular, the occurrence of a colored outline of a moving subject can be eliminated. As a result, an achromatizing process performed by an external signal processing unit (a DSP) is not necessary.

Note that the above-described three exposure control techniques used for adjusting the sensitivity ratio are only examples. The exposure control technique is not limited thereto.

For example, the size of the on-chip microlens for a W pixel is set in such a manner that the output levels of the W, G, B, and R pixels are substantially in the proportion 2:1:0.5:0.5.

For 1.1-μm pixels, when the size of an on-chip microlens for a W pixel is varied by ±0.1 μm, the area is doubled and halved. Therefore, the sensitivity is doubled or halved. Accordingly, the output level of a W pixel having an area the same as that of a G pixel and having an output level double that of the G pixel can be adjusted so that the output levels are the same. Even when the size of the on-chip microlens is varied by ±0.05 μm, the area is ±1.42 times the original area and, therefore, the sensitivity of the W pixel can be reduced to 1.42 times that of the G pixel. In such a case, the further adjustment of the sensitivity may be performed by shutter exposure control.

Color Conversion Process

A process for converting the signals into signals corresponding to the RGB Bayer arrangement (i.e., a color conversion process) performed by the conversion processing unit 16 is described in more detail next.

The following two types of color conversion process are provided: a color conversion process performed when a still image is captured (at a time of full scanning in which all of the pixels are scanned) and a color conversion process performed when a moving image is captured (at a time of pixel addition in which signals of a plurality of pixels neighboring a pixel is added to the signal of the pixel). In the case of color coding according to the first and second examples, a color conversion process with a high sensitivity can be performed. Accordingly, a low luminance mode can be used and, therefore, the color conversion process performed at a time of full scanning can be divided into two color conversion processes.

One of the two color conversion processes is performed when the luminance of incident light is higher than a predetermined reference luminance. This color conversion process is referred to as a "color conversion process 1". The other color conversion process is performed when the luminance of incident light is lower than or equal to the predetermined reference luminance. This color conversion process is referred to as a "color conversion process 2". In addition, the color conversion process performed at a time of pixel addition can be divided into a plurality of color conversion processes in accordance with the combinations of the pixels to be added.

Color Coding According to First Example of Second Exemplary Embodiment

A color conversion process performed for the color coding according to the first example of the second exemplary embodiment is described next. First, the color conversion process 1 performed in a high luminance mode at a time of full scanning is described with reference to a flowchart shown in FIG. 13 and schematic illustrations shown in FIGS. 14A to 14D.

As illustrated by the flowchart shown in FIG. 13, the color conversion process 1 in a high luminance mode is realized by sequentially performing the processing in steps S11, S12, and S13. FIG. 14A illustrates a 4×4 color arrangement of the color coding according to the first example.

In step S11, as shown in FIG. 14B, the components of white (W) pixels arranged in a checkerboard pattern are expanded into pixels of all colors by determining the direction of resolution. As used herein, the term "direction of resolution" refers to a direction in which pixel signals are present. In FIG. 14B, "W" surrounded by a transparent square represents a component of a W pixel after the component of the W pixel is expanded into each of all colors.

In order to expand a component of a W pixel into pixels of other colors, signal processing based on a widely used directional correlation can be applied. For example, in signal processing based on a directional correlation, a plurality of color signals corresponding to a given pixel is acquired, and the correlation value in the vertical direction and/or the horizontal direction is obtained (refer to, for example, Japanese Patent No. 2931520).

In step S12, as shown in FIG. 14C, a W pixel is replaced with a G pixel using a correlation between a W pixel and a G pixel. As can be seen from the above-described color arrangements of various color coding, a W pixel is adjacent to a G pixel. In terms of correlation between a W pixel and a G pixel in a certain area, the W pixel and the G pixel have a strong correlation since either one of the W pixel and the G pixel has a color serving as a primary component of a luminance signal. Thus, the correlation value (correlation coefficient) is nearly 1. By determining the direction of resolution using the color correlation and changing the output level of a W pixel to the level equivalent to the output level of a G pixel, the W pixel is replaced with the G pixel.

In step S13, an R pixel and a B pixel are generated for the Bayer arrangement shown in FIG. 14D using correlation between the W pixel and the R pixel and correlation between the W pixel and the B pixel. Since a W pixel includes R, G, and B color components, the correlation between the W pixel and the R pixel and the correlation between the W pixel and the B pixel can be obtained. For the signal processing, an existing technique in which a luminance signal to be replaced with G in a four-color arrangement is generated for every pixel by interpolation can be used (refer to, for example, Japanese Unexamined Patent Application Publication No. 2005-160044).

Subsequently, the color conversion process 2 performed in a low luminance mode at a time of full scanning is described with reference to a flowchart shown in FIG. 15 and schematic illustrations shown in FIGS. 16A to 16D.

First, as shown in FIG. 16A, the direction of resolution is examined by using signal processing based on the above-described directional correlation (step S21). Thereafter, it is determined whether the direction of resolution can be determined (step S22). If the direction of resolution can be determined, the components of the W pixels arranged in a checkerboard pattern are expanded into pixels of all colors (step S23).

Subsequently, as shown in FIG. 16B, R pixels and B pixels are generated using the correlation between a W pixel and an R pixel and the correlation between a W pixel and a B pixel (step S24). Thereafter, as shown in FIG. 16C, the signals of two R pixels adjacent to the W pixel are added to the signal of the W pixel so as to be approximated to G (=W+2G). In this way, as shown in FIG. 16D, each of the R and B pixels is generated for the Bayer arrangement (step S25).

However, if, in step S22, the direction of resolution is not determined, each of the R and B pixels is generated for the Bayer arrangement by using simple four-pixel averaging interpolation using four pixels adjacent to the W pixel in the vertical direction and the horizontal direction (step S26).

As described above, by using the color conversion process 1 and color conversion process 2 in accordance with the luminance of the incident light, signals corresponding to a color arrangement in which W filters are arranged in a checkerboard pattern can be converted into signals corresponding to the RGB Bayer arrangement on the sensor chip 11, and the signals can be output.

Two color conversion processes performed at a time of pixel addition for moving image capturing are described next. Hereinafter, one of the two color conversion processes is referred to as a "pixel addition process 1", and the other color conversion process is referred to as a "pixel addition process 2".

Figure 47:
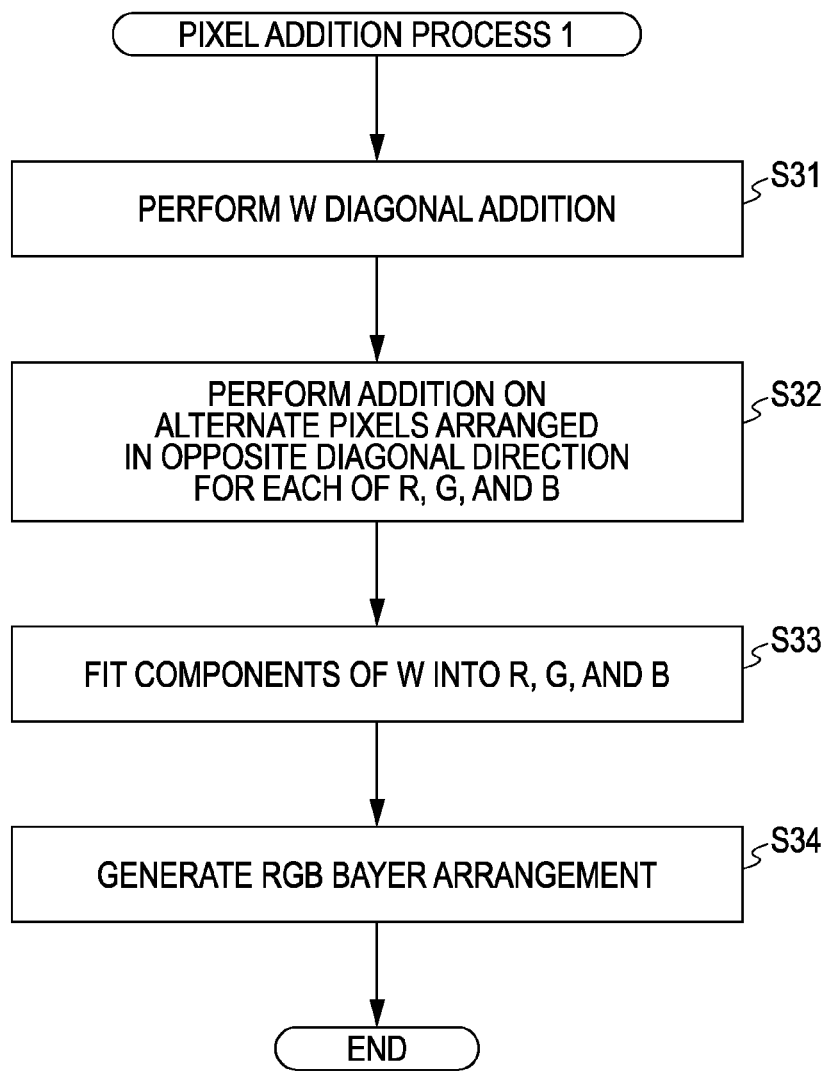
FIG. 47 is a flowchart illustrating an exemplary process flow of a pixel addition process 1 in the case of the color coding according to the first example of the second exemplary embodiment.

First, the pixel addition process 1 is described with reference to a flowchart shown in FIG. 47 and schematic illustrations shown in FIGS. 48A to 48D.

Figure 48A:
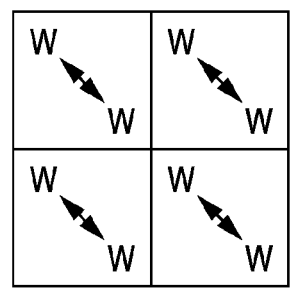
FIGS. 48A to 48D are schematic illustrations of the color conversion process 1 in the case of the color coding according to the first example of the second exemplary embodiment.

Addition is performed on two W pixels diagonally adjacent to each other (step S31). More specifically, as shown in FIG. 48A, addition is performed on a pixel of interest and a pixel located to the lower right of the pixel of interest (i.e., a pixel to the right by one column and below by one row). This addition can be performed in the pixel structure shown in FIG. 3 by providing the transfer pulse φTRF to the transfer transistors 22 of the two pixels which are the targets of addition (the transfer transistors 22-1 and 22-4 in this example) at the same time. In this way, two-pixel addition can be performed in the FD unit 26. Hereinafter, such pixel addition is referred to as "FD addition".

Figure 48B:
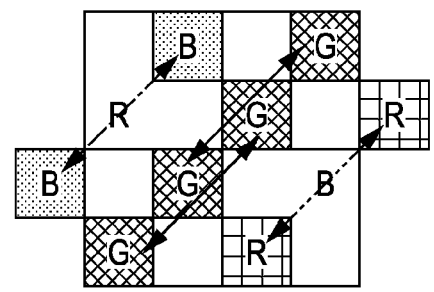

Subsequently, for each of R, G, and B pixels, addition is performed on two pixels arranged in the opposite diagonal direction and having one pixel therebetween (step S32). More specifically, as shown in FIG. 48B, addition is performed on a pixel of interest and a pixel located to the lower left of the pixel of interest with one pixel there between (i.e., a pixel to the right by two columns and below by two rows). For each of R, G, and B pixels, when the column processing unit 14 shown in FIG. 1 has an A/D conversion function, this addition can be performed during A/D conversion.

More specifically, in the color arrangement shown in FIG. 19, the signals of pixels B1 and G1 are read independently. After the signals are A/D-converted, the signals of pixels B2 and G3 are continuously read and A/D-converted. In this way, two-pixel addition can be performed. In order to perform pixel addition during A/D conversion performed by the column processing unit 14, an existing technique for converting an analog pixel signal into a digital pixel signal using a counter can be used (refer to, for example, Japanese Unexamined Patent Application Publication No. 2006-033454).

Hereinafter, this pixel addition performed using a counter of an A/D converter is referred to as "counter addition". When counter addition is performed and if the gain is changed on a line-by-line basis, the addition ratio can be varied. Similarly, counter addition can be performed on R pixels. Note that, in the above-described two-pixel addition for the W pixels, FD addition is performed between the pixels W1 and W2 and between the pixels W3 and W4.

Figure 48C:
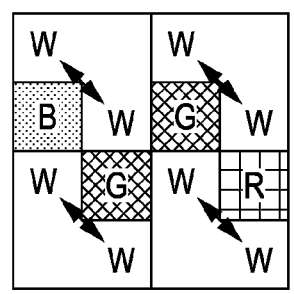
Figure 48D:
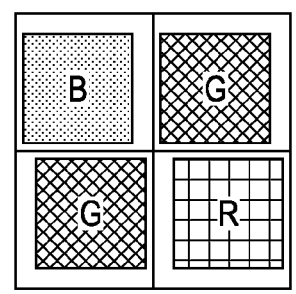

Thereafter, as shown in FIG. 48C, the components of the W pixel are fitted into the R, G, and B pixels (step S33). Subsequently, as shown in FIG. 48D, four pixels for the RGB Bayer arrangement are generated (step S34).

Subsequently, the pixel addition process 2 is described with reference to a flowchart shown in FIG. 20 and schematic illustrations shown in FIGS. 21A to 21D.

First, for W pixels and G pixels, FD addition is performed between two pixels arranged in the upper left-bottom right diagonal directions and the upper right-bottom left diagonal directions, respectively. Thus, W, R, G, and B pixels are generated (step S41). More specifically, for the W pixels, as shown in FIG. 21A, FD addition is performed between a pixel of interest and a pixel located at the lower right of the pixel of interest (i.e., a pixel to the right by one column and below by one row). For the G pixels, as shown in FIG. 21B, FD addition is performed between a pixel of interest and a pixel located at the lower left of the pixel of interest (i.e., a pixel to the left by one column and below by one row).

Note that, in eight pixels of a 4×4 block, a pair of R and B signals is not used. That is, R pixels and B pixels are read in a thinning-out manner without performing pixel addition. Accordingly, the sensitivity of R and B is decreased, as compared with that in the pixel addition process 1. Consequently, a color S/N ratio is low.

Thereafter, as shown in FIG. 21C, the components of the W pixel are fitted into the R, G, and B pixels (step S42). Subsequently, as shown in FIG. 21D, four pixels for the RGB Bayer arrangement are generated (step S43). In the case of the pixel addition process 2, the centroid location of the Bayer arrangement is slightly shifted from that in the pixel addition process 1.

As described above, by using one of the pixel addition process 1 and the pixel addition process 2 when a moving image is captured, signals corresponding to a color arrangement in which W filters are arranged in a checkerboard pattern can be converted into signals corresponding to the RGB Bayer arrangement on the sensor chip 11, and the signals can be output.

Color Coding According to Second Example of Second Exemplary Embodiment

A color conversion process for the color coding according to the second example of the second exemplary embodiment is described next. A series of processes for the color coding according to the second example of the second exemplary embodiment is based on that for the color coding according to the first example of the second exemplary embodiment.

Figure 49A:
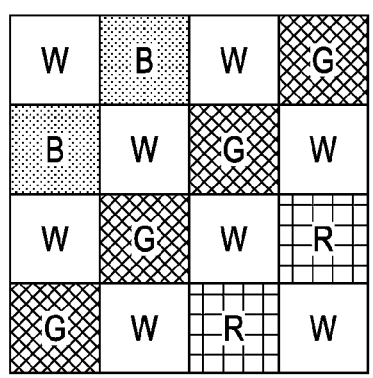
FIGS. 49A to 49D are schematic illustrations of a color conversion process 1 in the case of color coding according to a second example of the second exemplary embodiment.
Figure 49B:
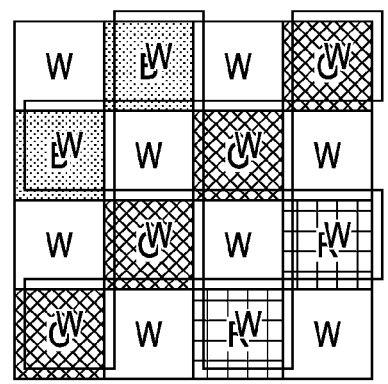
Figure 49C:
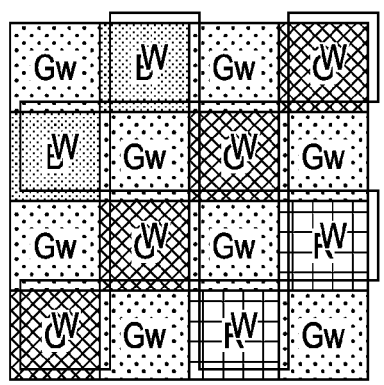
Figure 49D:
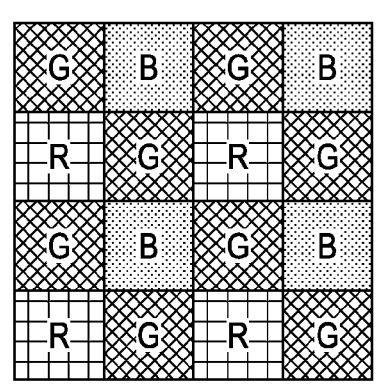

A color conversion process 1 at a time of full scanning is described with reference to schematic illustrations shown in FIGS. 49A to 49D. In a color arrangement of a 4×4 pixel block according to the second example shown in FIG. 49A, the components of W pixels arranged in a checkerboard pattern are expanded into pixels of all colors using the direction of resolution, as shown in FIG. 49B. Subsequently, as shown in FIG. 49C, the W pixels are replaced with G pixels using a correlation between a W pixel and a G pixel. Thereafter, as shown in FIG. 49D, R and B pixels are generated for the RGB Bayer arrangement using a correlation between a W pixel and an R pixel and a correlation between a W pixel and a B pixel.

Figure 50A:
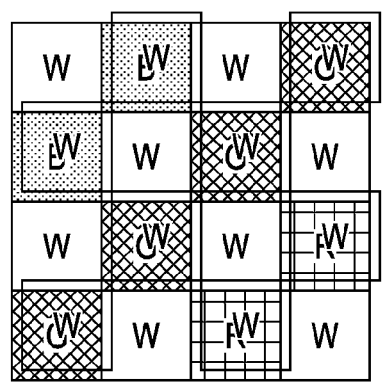
FIGS. 50A to 50D are schematic illustrations of a color conversion process 2 in the case of color coding according to the second example of the second exemplary embodiment.
Figure 50B:
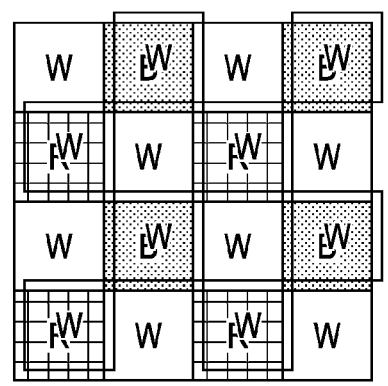
Figure 50C:
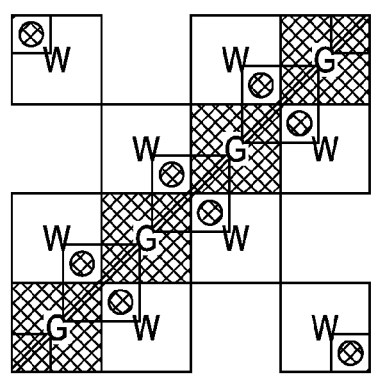
Figure 50D:
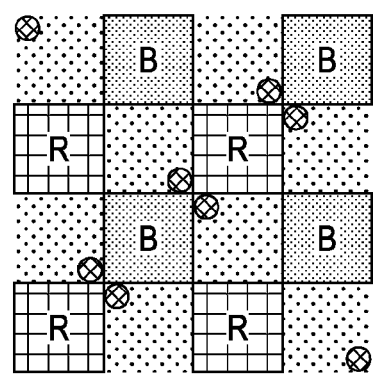

A color conversion process 2 at a time of full scanning is described next with reference to schematic illustrations shown in FIGS. 50A to 50D. As in the color conversion process 1, in a color arrangement of a 4×4 pixel block according to the second example, the components of W pixels arranged in a checkerboard pattern are expanded into pixels of all colors using the direction of resolution, as shown in FIG. 50A. Subsequently, as shown in FIG. 50B, R pixels and B pixels are generated using a correlation between a W pixel and an R pixel and a correlation between a W pixel and a B pixel. Thereafter, as shown in FIG. 50C, the signals of two G pixels adjacent to the W pixel are added to the signal of the W pixel so as to be approximated to G (=W+2G). In this way, as shown in FIG. 50D, each of the R and B pixels is generated for the Bayer arrangement. At that time, if the direction is found, the addition ratio can be dynamically changed.

Figure 51A:
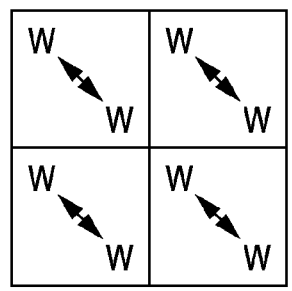
FIGS. 51A to 51D are schematic illustrations of a pixel addition process 1 in the case of the color coding according to the second example of the second exemplary embodiment.
Figure 51B:
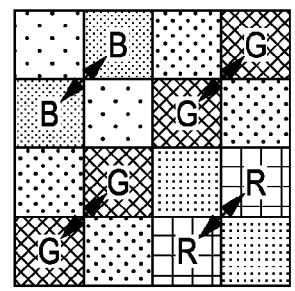
Figure 51C:
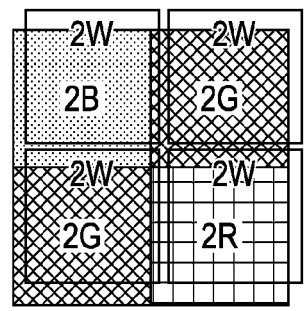
Figure 51D:
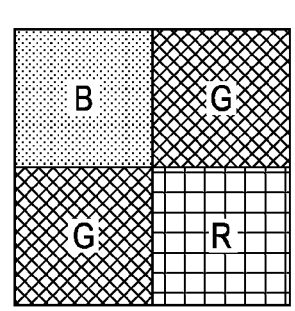

The pixel addition process 1 is described next with reference to FIGS. 51A to 51D. As shown in FIGS. 51A and 51B, left-up and right-up diagonal FD addition is performed for a W pixel and each of R, G, and B pixels. Thus, W, R, G, and B pixels are generated. Thereafter, as shown in FIG. 51C, the components of the W pixel are fitted into each of the pixels. In this way, as shown in FIG. 51D, four pixels for the RGB Bayer arrangement are generated.

Figure 52A:
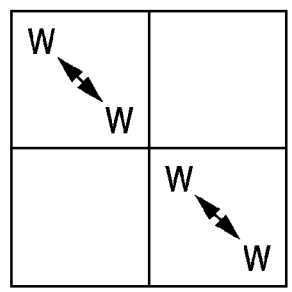
FIGS. 52A to 52D are schematic illustrations of a pixel addition process 2 for color coding according to the second example of the second exemplary embodiment.
Figure 52B:
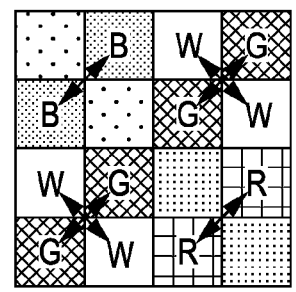
Figure 52C:
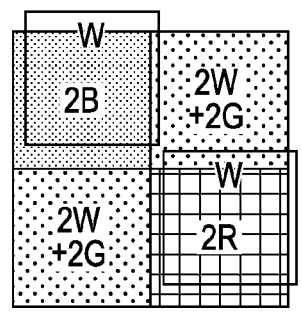
Figure 52D:
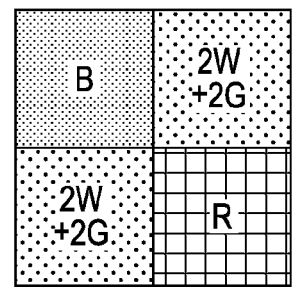

A color conversion process 2 is described next with reference to FIGS. 52A to 52D. As shown in FIGS. 52A and 52B, left-up and right-up diagonal FD addition is performed for a W pixel and each of R, G, and B pixels. Thus, W, R, G, and B pixels are generated. Thereafter, as shown in FIG. 51C, the components of the W pixel are fitted into each of the R and B pixels. In this way, as shown in FIG. 52D, four pixels for the RGB Bayer arrangement are generated.

As described above, by performing the above-described signal processing for the color coding according to the first and second examples in which W filters having a color serving as a primary component of a luminance signal are arranged in a checkerboard pattern and G filters are diagonally arranged so as to form a stripe pattern, the following advantage can be provided. That is, by adding the signal of a G pixel adjacent to a W pixel to the signal of the W pixel and performing signal processing using the sum as a primary component of the luminance signal, the intensity of the luminance signal can be increased. Accordingly, the sensitivity can be increased with a minimal decrease in resolution.

Third Exemplary Embodiment

System Configuration

FIG. 53 is a schematic illustration of an exemplary system configuration of a CMOS image sensor, which is an example of a solid-state imaging device (an X-Y addressing solid-state imaging device) according to a third exemplary embodiment. The same numbering will be used in describing FIG. 53 as was utilized above in describing FIG. 1, where appropriate.

In the above-described CMOS image sensor 10A according to the second exemplary embodiment, the conversion processing unit 16 disposed on the sensor chip 11 converts signals corresponding to the color arrangement of the color filter array 30 into signals corresponding to the RGB Bayer arrangement. In contrast, in a CMOS image sensor 10B according to the present embodiment, W, R, G, and B signals corresponding to the color arrangement of the color filter array 30 are directly output from the sensor chip 11 in the form of raw data.

In addition, according to the present embodiment, the CMOS image sensor 10B allows a DSP circuit 40, which is an external circuit of the sensor chip 11, to perform a color conversion process on the raw data output from the sensor chip 11. The DSP circuit 40 converts the W, R, G, and B signals output from the sensor chip 11 into signals corresponding to the RGB Bayer arrangement. Thereafter, the DSP circuit 40 performs a widely used demosaic process. In the demosaic process, color information is added to the signal of each of the pixels that has only monochrome information by supplying missing color information using the signals of pixels surrounding the pixel, and a full-color image is generated.

In this way, the key feature of the CMOS image sensor 10B according to the present embodiment is that the W, R, G, and B signals corresponding to the color arrangement of the color filter array 30 are directly output from the sensor chip 11 and are converted into the signals corresponding to the RGB Bayer arrangement by the DSP circuit 40. Accordingly, since the configurations and operations of the pixel array unit 12, the vertical drive unit 13, the column processing unit 14, the horizontal drive unit 15, and the system control unit 17 are similar to those of the second exemplary embodiment, the descriptions thereof are not repeated.

Color Coding of Color Filter Array

Like the CMOS image sensor 10A according to the second exemplary embodiment, the CMOS image sensor 10B according to the present embodiment has color coding of the color filter array 30 that facilitates conversion into signals corresponding to the RGB Bayer arrangement.

That is, the color filter array 30 employs color coding in which filters of a first color (W or G) serving as one of primary color information components of a luminance signal are arranged in a checkerboard pattern. In addition, filters of a second color (G or W) of the primary color information components for a series of four pixels form a group, and the groups are arranged so as to form a stripe pattern in one of a diagonal direction, a vertical direction, and a horizontal direction. The advantage of the use of the color filter array 30 having such color coding is the same as that of the second exemplary embodiment.

Examples of Color Coding of Color Filter Array

Like the second exemplary embodiment, according to the third exemplary embodiment, first and second examples of color coding can be provided. The first and second examples facilitate conversion from a signal corresponding to a color arrangement in which filters of a color serving as a primary component of a luminance signal are arranged in a checkerboard pattern into a signal corresponding to an RGB Bayer arrangement.

That is, in the color coding according to the first example of the third exemplary embodiment, W filters are arranged in a checkerboard pattern. In addition, R filters are arranged in a checkerboard pattern at a two-pixel pitch in the vertical direction and the horizontal direction. Similarly, B filters are arranged in a checkerboard pattern at a two-pixel pitch in the vertical direction and the horizontal direction. Furthermore, each of the R filters is diagonally shifted from one of the B filters by one pixel. In addition, G filters are arranged in the other area of the checkerboard pattern (refer to FIG. 45). Still furthermore, in the color coding according to the second example of the third exemplary embodiment, W filters are arranged in a checkerboard pattern. R filters are squarely arranged at a four-pixel pitch in the vertical direction and the horizontal direction. Similarly, B filters are squarely arranged at a four-pixel pitch in the vertical direction and the horizontal direction. In addition, two of the R filters and two of the B filters are alternately arranged in a diagonal direction. In addition, G filters are arranged in the other area in the checkerboard pattern (refer to FIG. 46).

Color Conversion Process

A process performed by the DSP circuit 40 for converting signals that correspond to the color arrangement of the color filter array 30 and that are output from the sensor chip 11 in the form of raw data into signals corresponding to the RGB Bayer arrangement is described in more detail next.

Like the second exemplary embodiment, when the color conversion process is performed, the pixel sensitivity ratio of W:G:R:B is adjusted. In addition, like the second exemplary embodiment, the following two types of color conversion process are provided: a color conversion process performed at a time of full scanning and a color conversion process performed at a time of pixel addition. In addition, the following two types of color conversion process are provided: a color conversion process 1 performed in a high luminance mode in which the luminance of incident light is higher than a predetermined reference luminance and a color conversion process 2 performed in a low luminance mode in which the luminance of incident light is lower than or equal to the reference luminance.

Color Coding According to First Example of Third Exemplary Embodiment

Figure 54:
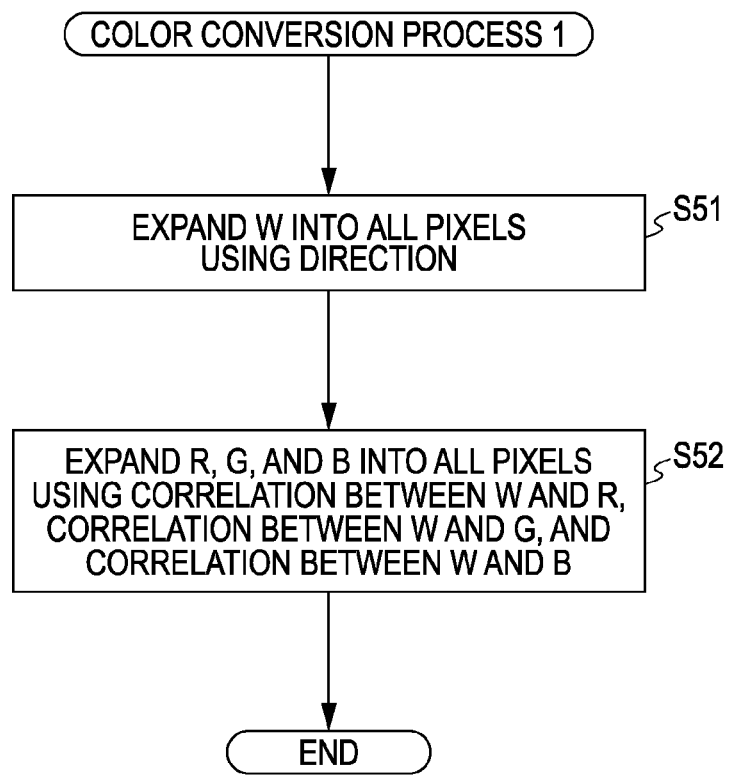
FIG. 54 is a flowchart illustrating an exemplary process flow of a color conversion process 1 performed in a high luminance mode at a time of full scanning in the case of the color coding according to the first example of the third exemplary embodiment.

A color conversion process performed in the case of color coding according to the first example of the third exemplary embodiment is described next. First, the color conversion process 1 performed in a high luminance mode at a time of full scanning is described with reference to a flowchart shown in FIG. 54 and schematic illustrations shown in FIGS. 55A to 55C.

FIG. 55A illustrates a 4×4 pixel color arrangement of the color coding according to the first example of the third exemplary embodiment. In the color coding according to the first example, as shown in FIG. 55B, the components of the W pixels are expanded into pixels of all colors by using the above-described existing signal process using directional correlation and determining the direction of resolution (step S51). Thereafter, as shown in FIG. 55C, by using the above-described existing technique and a correlation between a W pixel and an R pixel, a correlation between a W pixel and a G pixel, and a correlation between a W pixel and a B pixel, the R, G, and B components are expanded into all pixels (step S52).

Figure 56:
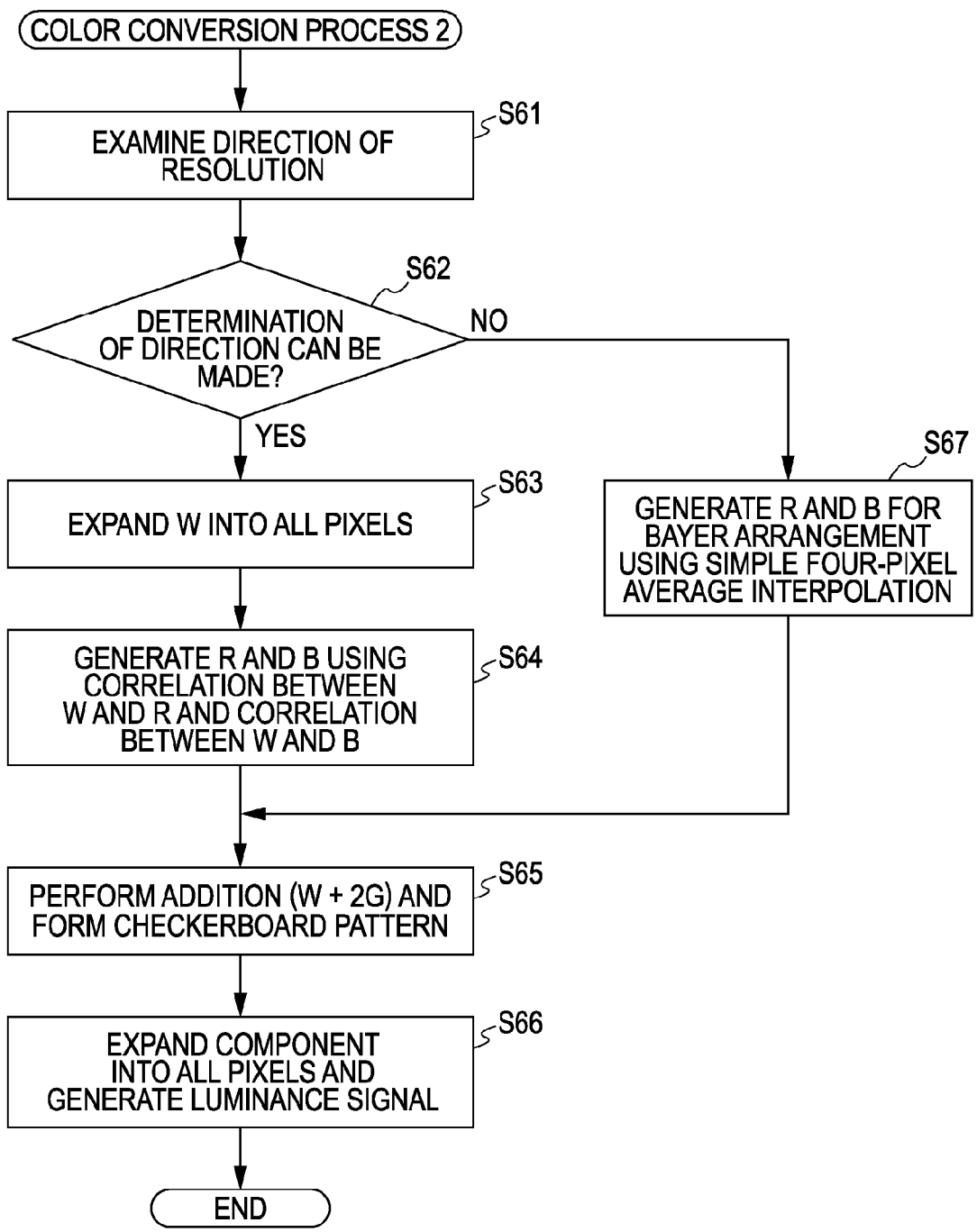
FIG. 56 is a flowchart illustrating an exemplary process flow of a color conversion process 2 performed in a low luminance mode at a time of full scanning in the case of the color coding according to the first example of the third exemplary embodiment.

Subsequently, the color conversion process 2 performed in a low luminance mode at a time of full scanning is described with reference to a flowchart shown in FIG. 56 and schematic illustrations shown in FIGS. 57A and 57B.

Figure 57A:
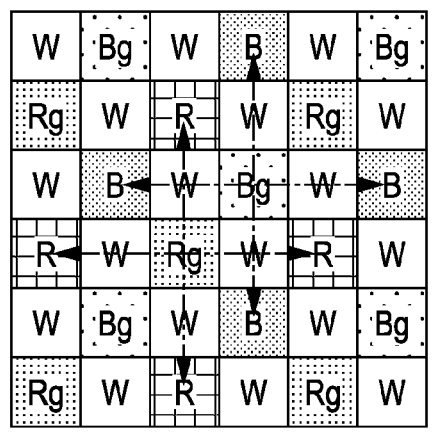
FIGS. 57A to 57C are schematic illustrations of the color conversion process 2 performed at a time of full scanning in the case of the color coding according to the first example of the third exemplary embodiment.

First, as shown in FIG. 57A, the direction of resolution is examined by using signal processing based on the above-described directional correlation (step S61). Thereafter, it is determined whether the direction of resolution can be determined (step S62). If the direction of resolution can be determined, the components of the W pixels arranged in a checkerboard pattern are expanded into pixels of all colors (step S63).

Figure 57B:
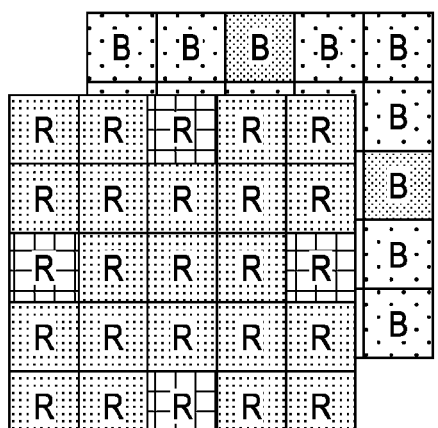

Subsequently, as shown in FIG. 57B, R pixels and B pixels are generated by using the above-described existing technique and the correlation between a W pixel and an R pixel and the correlation between a W pixel and a B pixel (step S64). However, if, in step S62, the direction of resolution is not determined, each of the R and B pixels is generated by using simple four-pixel averaging interpolation using four pixels adjacent to the W pixel in the vertical direction and the horizontal direction (step S67).

Figure 57C:
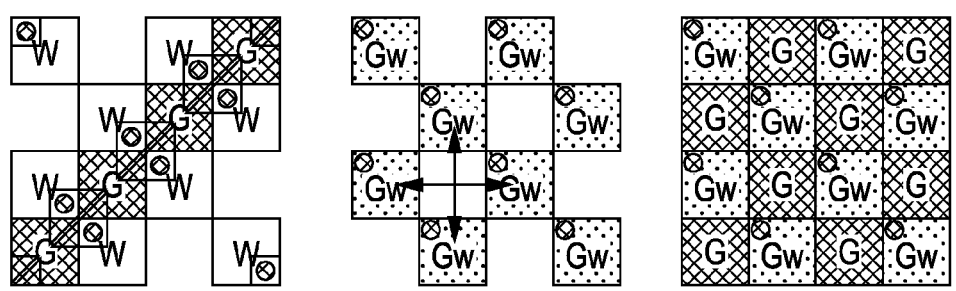

Subsequently, as shown in FIG. 57C, the signals of two G pixels adjacent to the W pixel are added to the signal of the W pixel (W+2G) while dynamically changing the ratio. Thus, a checkerboard pattern is formed (step S65). Thereafter, the components are expanded into all pixels by determining the direction. In this way, a luminance signal is generated (step S66).

As described above, by using one of the color conversion process 1 and the color conversion process 2 in accordance with the luminance of the incident light, the signals corresponding to a color arrangement in which W filters are arranged in a checkerboard pattern can be converted into signals corresponding to the RGB Bayer arrangement through signal processing performed by the DSP circuit 40 disposed outside the sensor chip 11.

Figure 58:
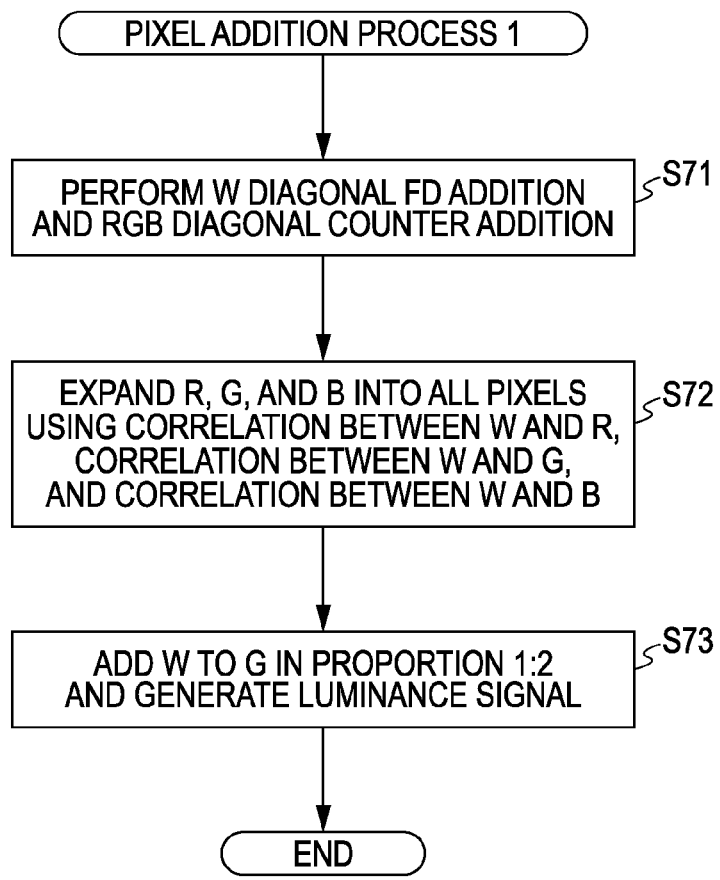
FIG. 58 is a flowchart illustrating an exemplary process flow of a pixel addition process 1 in the case of the color coding according to the first example of the third exemplary embodiment.

The color conversion processes 1 and 2 performed at a time of pixel addition for capturing a moving image are described next. First, the pixel addition process 1 is described with reference to a flowchart shown in FIG. 58 and schematic illustrations shown in FIGS. 59A to 59C.

Figure 59A:
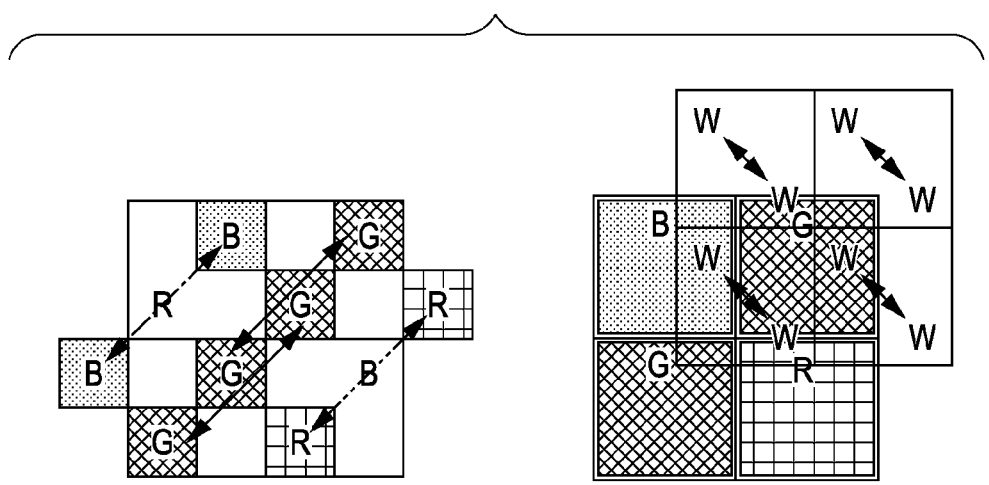
FIGS. 59A to 59C are schematic illustrations of the pixel addition process 1 performed in the case of the color coding according to the first example of the third exemplary embodiment.
Figure 59B:
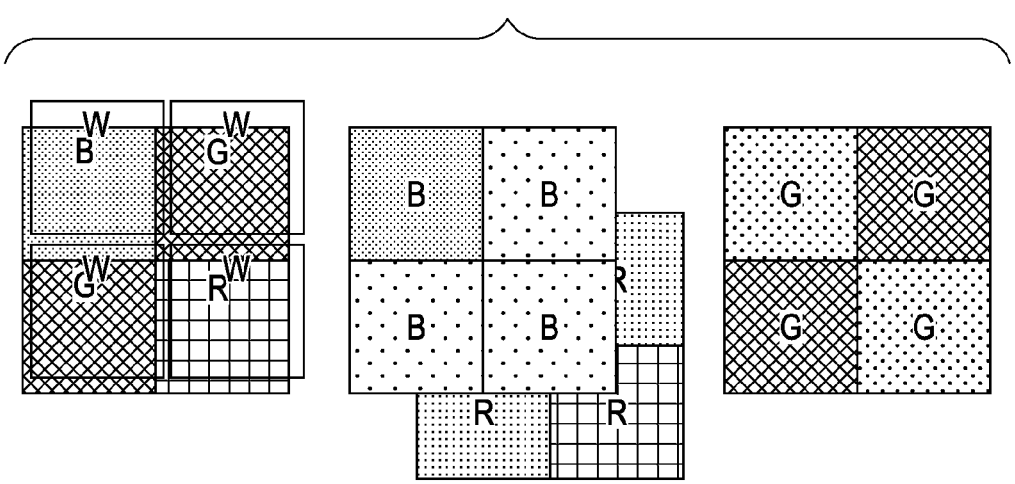
Figure 59C:
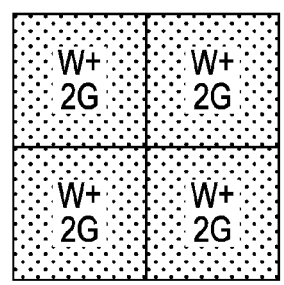

As shown in FIG. 59A, addition is performed on two W pixels diagonally adjacent to each other. In addition, for pixels of each of R, G, and B colors, counter addition is performed on two pixels arranged in a diagonal direction (step S71). Thereafter, as shown in FIG. 59B, R components, G components, and B components are expanded into all pixels using a correlation between a W pixel and an R pixel, a correlation between a W pixel and a G pixel, and a correlation between a W pixel and a B pixel (step S72). Subsequently, as shown in FIG. 59C, the signals of the W pixel and the G signal are added in proportion 1:2, and a (W+2G) signal is generated. The (W+2G) signals serve as luminance signals (step S73).

Figure 60:
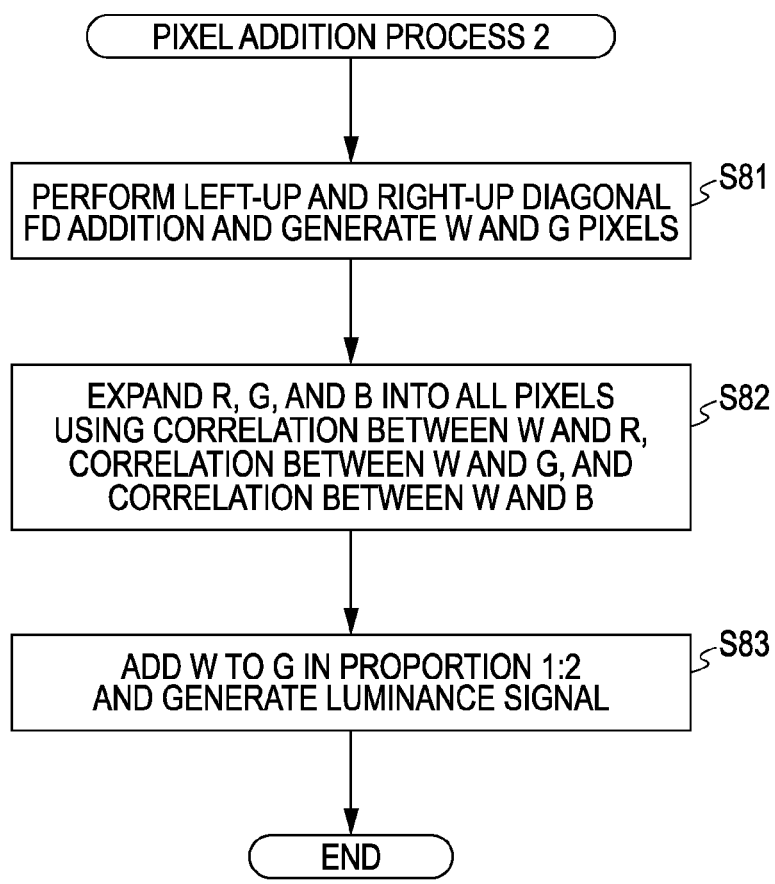
FIG. 60 is a flowchart illustrating an exemplary process flow of a pixel addition process 2 in the case of the color coding according to the first example of the third exemplary embodiment.

The pixel addition process 2 is described next with reference to a flowchart shown in FIG. 60 and schematic illustrations shown in FIGS. 61A to 61C.

First, as shown in FIG. 61A, for the W pixels and the G pixels, FD addition is performed between two pixels arranged in the upper left-bottom right diagonal directions and the upper right-bottom left diagonal direction, respectively. Thus, W and G pixels are generated (step S81). More specifically, for the G pixels, FD addition is performed between a pixel of interest and a pixel located at the lower left of the pixel of interest (i.e., a pixel to the left by one column and below by one row). For the W pixels, FD addition is performed between a pixel of interest and a pixel located at the lower right of the pixel of interest (i.e., a pixel to the right by one column and below by one row). The R and B pixels remain unchanged.

Subsequently, as shown in FIG. 61B, the R, G, and B components are expanded into all pixels using the correlation between a W pixel and an R pixel, the correlation between a W pixel and a G pixel, and the correlation between a W pixel and a B pixel (step S82). Thereafter, as shown in FIG. 61C, the signals of the W pixel and the G signal are added in proportion 1:2, and a (W+2G) signal is generated. The (W+2G) signals serve as luminance signals (step S83).

As described above, by using one of the pixel addition process 1 and the pixel addition process 2 when a moving image is captured, the signals corresponding to a color arrangement in which W filters are arranged in a checkerboard pattern can be converted into signals corresponding to the RGB Bayer arrangement through signal processing performed by the DSP circuit 40 disposed outside the sensor chip 11.

Color Coding According to Second Example of Third Exemplary Embodiment

A color conversion process for the color coding according to the second example of the third exemplary embodiment is described next. A series of processes for the color coding according to the second example of the third exemplary embodiment is generally based on that for the color coding according to the first example of the third exemplary embodiment.

Figures 62A, 62B:
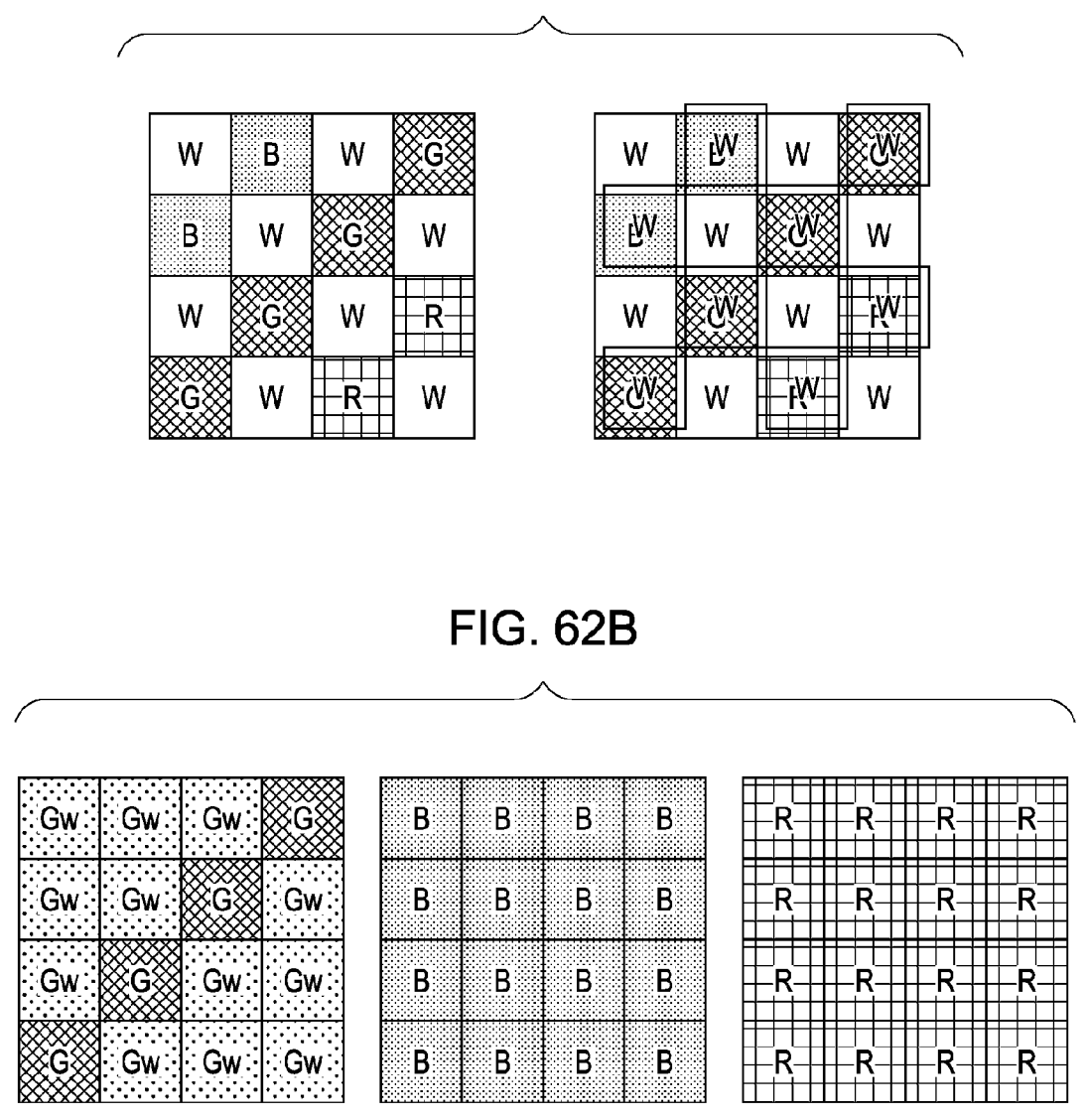

The color conversion process 1 performed at a time of full scanning is described with reference to schematic illustrations shown in FIGS. 62A and 62B. FIG. 62A illustrates a color arrangement of color coding of a 4×4 pixel block according to the second example of the third exemplary embodiment. In the color coding according to the second example of the third exemplary embodiment, as shown in FIG. 62B, the components of W pixels arranged in a checkerboard pattern are expanded into pixels of all colors using the direction of resolution. Subsequently, as shown in FIG. 62C, the R, G, and B components are expanded into all pixels using the correlation between a W pixel and an R pixel, the correlation between a W pixel and a G pixel, and the correlation between a W pixel and a B pixel.

Figure 63A:
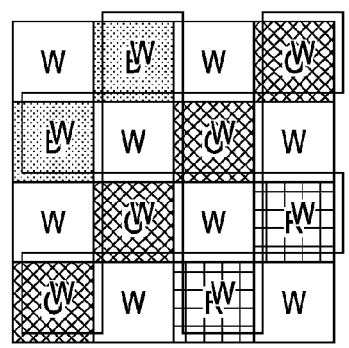
FIGS. 63A to 63C are schematic illustrations of a color conversion process 2 performed in the case of the color coding according to the second example of the third exemplary embodiment.

The color conversion process 2 performed at a time of full scanning is described next with reference to schematic illustrations shown in FIGS. 63A to 63C. As in the color conversion process 1, in the color arrangement of color coding of a 4×4 pixel block according to the second example, as shown in FIG. 63A, the components of W pixels arranged in a checkerboard pattern are expanded into pixels of all colors using the direction of resolution.

Figure 63B:
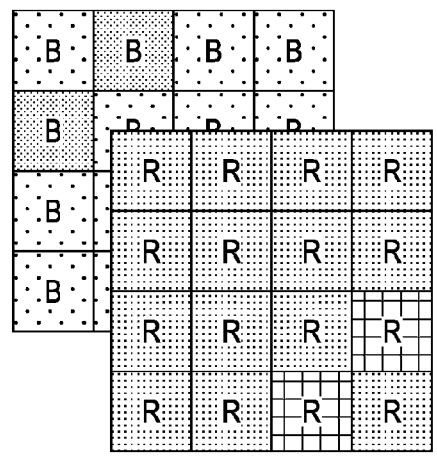
Figure 63C:
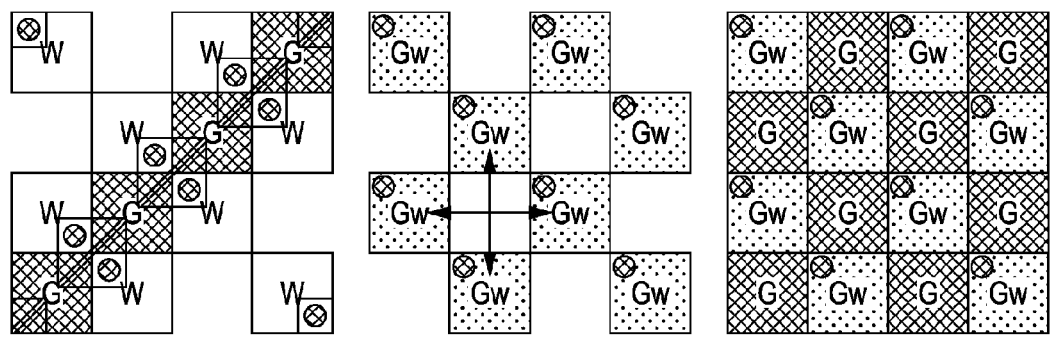

Subsequently, as shown in FIG. 63B, the R and B components are expanded into all pixels using the correlation between a W pixel and an R pixel and the correlation between a W pixel and a B pixel. Thereafter, as shown in FIG. 63C, by determining the direction using the W pixels, the signals of two G pixels adjacent to the W pixel are added to the signal of the W pixel while dynamically changing the ratio (W+2G). Thus, a checkerboard pattern is formed. Thereafter, the components of the G pixels are expanded into all pixels by further determining the direction. In this way, a luminance signal is generated.

The pixel addition process 1 is described next with reference to FIGS. 64A and 64B. As shown in FIG. 64A, for W pixels and G pixels, FD addition is performed between two pixels arranged in the upper left-bottom right diagonal directions and the upper right-bottom left diagonal directions, respectively. Thus, the signals of W, R, G, and B pixels are generated. Thereafter, as shown in FIG. 64B, the R, G, and B components are expanded into all of the pixels. Subsequently, in order to improve the S/N ratio, the components of the W pixels are fitted into all of the pixels. Thus, R, G, and B signals are generated.

Figure 65A:
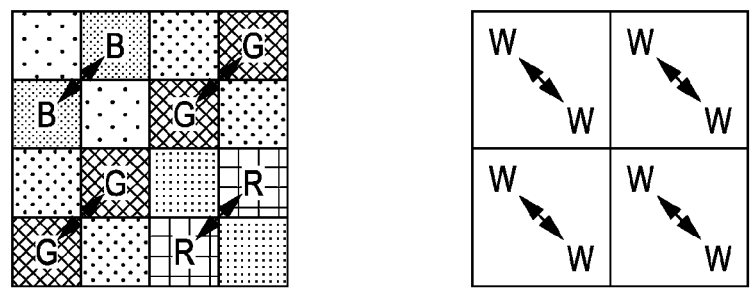
FIGS. 65A to 65C are schematic illustrations of a pixel addition process 2 performed in the case of the color coding according to the second example of the third exemplary embodiment.
Figure 65B:
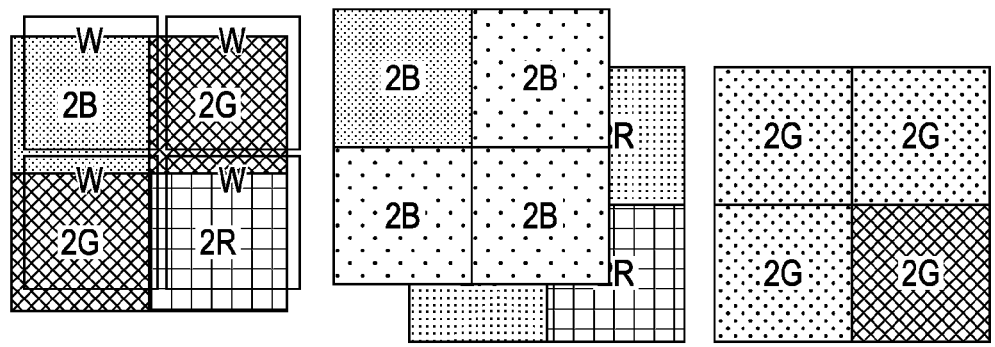
Figure 65C:
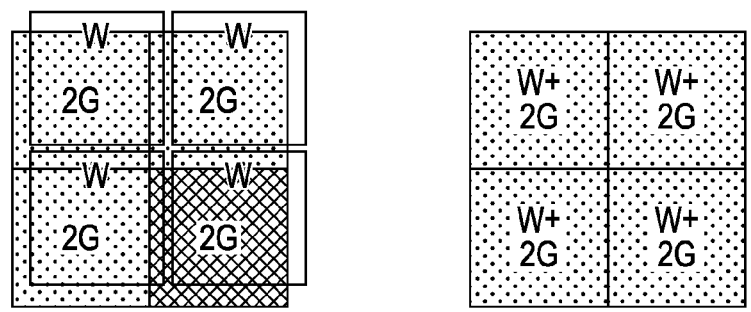

The pixel addition process 2 is described next with reference to FIGS. 65A to 65C. As shown in FIG. 65A, for W pixels and G pixels, FD addition is performed between two pixels arranged in the upper left-bottom right diagonal directions and the upper right-bottom left diagonal directions, respectively. Thus, the signals of W, R, G, and B pixels are generated. Thereafter, as shown in FIG. 65B, the R, G, and B components are expanded into all pixels using the correlation between a W pixel and an R pixel, the correlation between a W pixel and a G pixel, and the correlation between a W pixel and a B pixel. The signals of the W pixel and the G signal are then added in proportion 1:2, and a (W+2G) signal is generated. The (W+2G) signals serve as luminance signals.

As described above, according to the first and second examples, in the color coding having a color arrangement in which W filters of white serving as a primary color of a luminance signal are arranged in a checkerboard pattern and G filters are arranged so as to form a stripe pattern in a diagonal direction, the following advantage can be provided by performing the above-described signal processing. That is, in the DSP circuit 40 provided outside the sensor chip 11, by adding the signal of a G pixel adjacent to a W pixel to the signal of the W pixel and performing signal processing using the sum as a primary component of the luminance signal, the intensity of the luminance signal can be increased. Accordingly, the sensitivity can be increased with a minimal decrease in resolution.

3. Modifications

While the foregoing exemplary embodiments have been described with reference to a method in which the signals of two G pixels adjacent to a W pixel are simply added to the signal of the W pixel and the sum is used as a primary component of a luminance signal, the number of the G pixels used for addition is not limited to two. The number of the G pixels may be one. Note that 2-pixel addition in which the signal of one G pixel adjacent to a W pixel is added to the signal of the W pixel has an advantage over 3-pixel addition in which the signals of two G pixels adjacent to a W pixel are added to the signal of the W pixel in that it can reduce a decrease in resolution.

In addition, while the foregoing exemplary embodiments have been described with reference to signal processing in the case of a diagonal stripe pattern of a series of four pixels of G filters, the same advantage can be provided even in the case in which a series of four pixels of G filters is repeatedly arranged in the vertical direction or the horizontal direction so as to form a stripe pattern. Furthermore, the addition ratio of the signal of a filter of a first color to that of a second color is not limited to 1:1. Any addition ratio that balances the resolution with the sensitivity can be used.

Figures 66, 67:
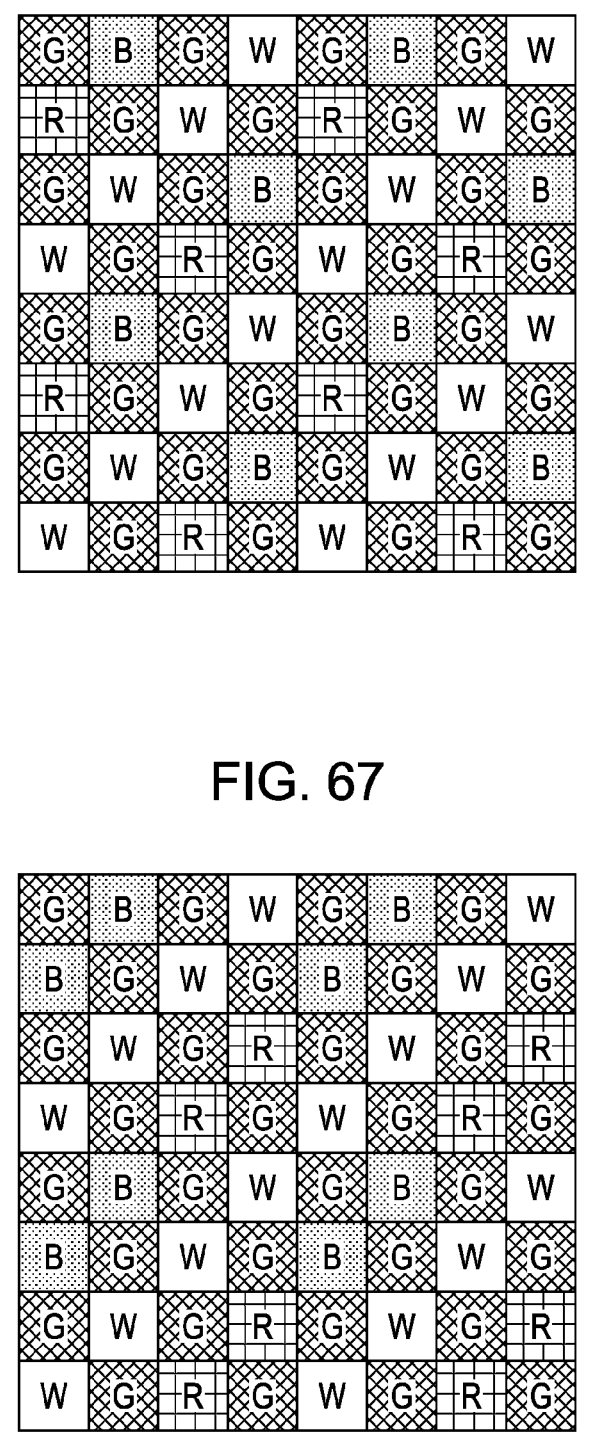

Still furthermore, while the foregoing exemplary embodiments have been described with reference to the color coding in which the first color serving as a primary color of a luminance signal is white (W) and the second color is green (G), the same advantage can be provided even for the color coding in which the first color is green and the second color is white. Such color coding according to the first example and second example is shown in FIGS. 66 and 67, respectively.

Example of Application

Imaging Apparatus

Figure 68:
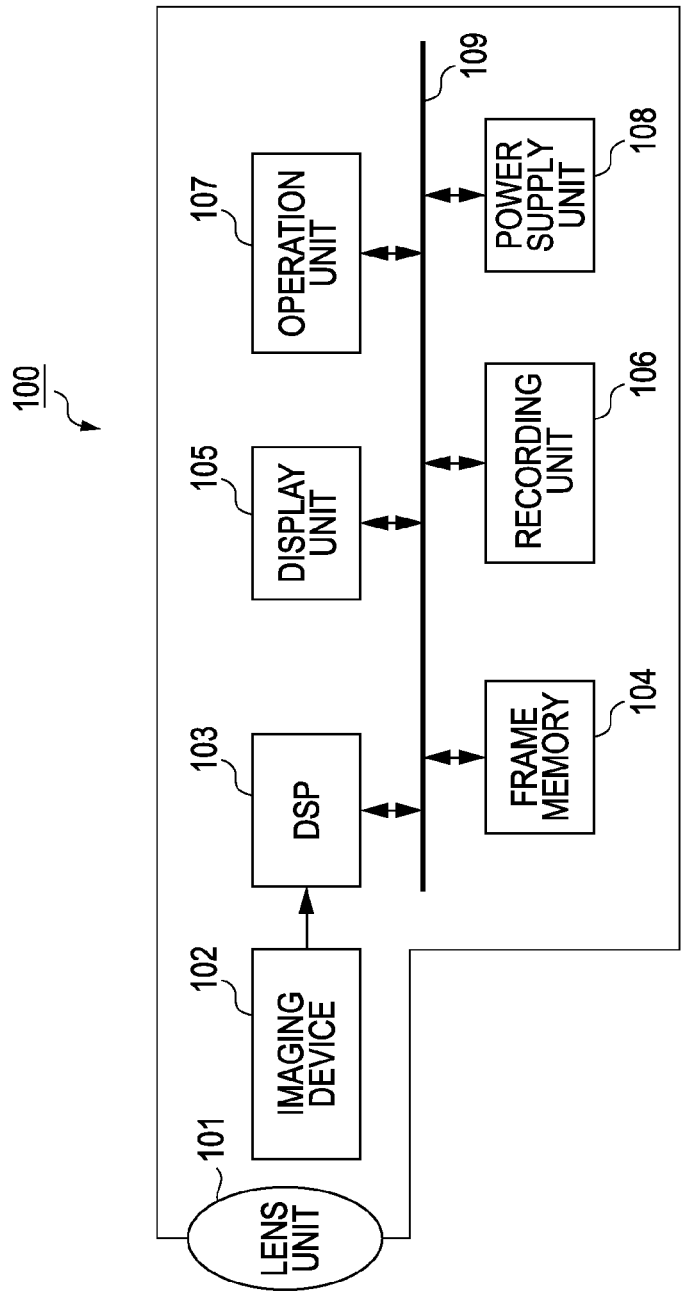
FIG. 68 is a block diagram of an exemplary configuration of an imaging apparatus according to an embodiment of the present invention.

FIG. 68 is a block diagram of an exemplary configuration of an imaging apparatus according to an embodiment of the present invention.

As shown in FIG. 68, according to the embodiment of the present invention, an imaging apparatus 100 includes an optical system including a lens unit 101, an image pickup device 102, a DSP circuit 103 serving as a camera signal processing circuit, a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are connected to one another via a bus line 109.

The lens unit 101 receives incident light (imaging light) output from a subject and forms an image on an imaging surface of the image pickup device 102. The image pickup device 102 converts the intensity of the incident light that is received by the lens unit 101 and that forms an image on the imaging surface into an electrical signal for each pixel. The electrical signals are output in the form of pixel signals. The CMOS image sensors 10A and 10B according to the first and second exemplary embodiments can be used as the image pickup device 102. In addition, the CMOS image sensor 10 according to all of the above-described exemplary embodiments (including the third exemplary embodiment) can be used as the image pickup device 102.

In the CMOS image sensors 10A, 10B, and 10, the color filter array employs color coding having a color arrangement in which a color serving as a primary color of a luminance signal is arranged in a checkerboard pattern, and a plurality of colors serving as color information components are arranged in the other area of the checkerboard pattern. In particular, the CMOS image sensors 10A and 10 convert signals corresponding to the color arrangement of the color filter array into signals corresponding to the Bayer arrangement through computation performed in the sensor chip 11.

Accordingly, although the CMOS image sensors 10A and 10 have the color filter array using color coding in which a color serving as a primary color of a luminance signal is arranged in a checkerboard pattern, the CMOS image sensors 10A and 10 output signals corresponding to the Bayer arrangement. Consequently, an existing DSP for the Bayer arrangement that generates a luminance signal Y and two color difference signals U (B−Y) and V (R−Y) using signals corresponding to the Bayer arrangement can be used as the DSP circuit 103.

Since, as described above, an existing DSP for the Bayer arrangement can be used, the development of a new DSP that is significantly costly is not necessary even when the color coding of a color filter array used in the image pickup device 102 is changed. The use of an existing DSP can contribute to cost reduction in the production of the imaging apparatus 100 including the DSP circuit 103 and, in particular, to widespread use of a color filter array having color coding using a W filter.

In contrast, in the case of the CMOS image sensor 10B, signals corresponding to a color arrangement in which a color serving as a primary color of a luminance signal is arranged in a checkerboard pattern are output to outside the chip, and the DSP circuit 103 (corresponding to the DSP circuit 40 shown in FIG. 52) converts the signals into signals corresponding to the Bayer arrangement. Accordingly, when the color coding of the color filter array is changed, the development of a new DSP circuit 103 is necessary and, therefore, the development cost is necessary. However, like the CMOS image sensor 10A, the CMOS image sensor 10B can increase the sensitivity with a minimal decrease in resolution. Accordingly, the CMOS image sensor 10B has an advantage in that it can increase the S/N ratio of an imaging signal while maintaining a high resolution.

The display unit 105 is a panel display unit, such as a liquid crystal display or an organic electroluminescence (EL) display. The display unit 105 displays a moving image or a still image captured by the image pickup device 102. The recording unit 106 records a moving image or a still image captured by the image pickup device 102 on a recording medium, such as a video tape or a digital versatile disk (DVD).

Under the control of a user, the operation unit 107 submits a variety of operation commands that control a variety of functions of the imaging apparatus. The power supply unit 108 supplies electrical power to the DSP circuit 103, the frame memory 104, the display unit 105, the recording unit 106, and the operation unit 107 when necessary.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
  a lens system operative to gather light; and
  a solid-state imaging device positioned to receive light from the lens system, the solid-state imaging device including:
    a pixel array unit, including:
      a light-receiving surface;
      a plurality of unit pixels; and
      a color filter array unit disposed on a light-incident side of the pixel array unit, the color filter array including a plurality of white light filters, a plurality of green light filters, a plurality of red light filters, and a plurality of blue light filters, and
    a conversion processing unit configured to receive output signals from the pixel array unit, wherein the color conversion processing unit is configured to receive the output signals from the pixel array unit corresponding to a color filter arrangement of the color filter array, wherein a first color conversion process is performed when a luminance of incident light is greater than a predetermined threshold, and wherein a second color conversion process is performed when a luminance of incident light is less than a predetermined threshold, and
  wherein first and second signals from first and second unit pixels corresponding to white light filters are applied to a floating diffusion region shared by the first and second unit pixels.

2. The imaging device of claim 1, wherein the first and second unit pixels are diagonally adjacent to each other.

3. The imaging device of claim 1, wherein the plurality of white light filters is arranged in a checkerboard pattern.

4. The imaging device of claim 1, wherein along a diagonal line of color filters in the color filter array unit, the color filters include a group of two blue color filters adjacent to a group of two red color filters.

5. The imaging device of claim 1, wherein along a second diagonal line of color filters in the color filter array unit, the color filters include at least two green color filters, and wherein along a third diagonal line of color filters in the color filter array unit, the color filters include at least two green color filters.

6. The imaging device of claim 1, wherein the first and second unit pixels share a selection transistor and an amplifying transistor.

7. The imaging device of claim 1, wherein in the first color conversion process, signals corresponding to white light filters are replaced with signals corresponding to green color pixels; signals corresponding to red pixels are generated according to a correlation between signals corresponding to white light filters and signals corresponding to red light filters; and signals corresponding to blue pixels are generated according to a correlation between signals corresponding to white light filters and signals corresponding to blue light filters.

8. The imaging device of claim 1, wherein in the second color conversion process, signals corresponding to red pixels are generated according to a correlation between signals corresponding to white light filters and signals corresponding to red light filters;

signals corresponding to blue pixels are generated according to a correlation between signals corresponding to white light filters and signals corresponding to blue light filters; and signals corresponding to green pixels are generated by adding a signal corresponding to a white light filter and signals corresponding to green light filters.

9. The imaging device of claim 1, wherein in the second color conversion process, each of the signals corresponding to red pixels and signals corresponding to green pixels is generated for the Bayer arrangement utilizing four-pixel averaging interpolation using four pixels adjacent to a white pixel in a vertical direction and a horizontal direction.

10. An electronic apparatus including the imaging device of claim 1.

11. An electronic imaging apparatus, comprising:
a lens system operative to gather light; and
a solid-state imaging device positioned to receive light from the lens system, the solid-state imaging device including:
   a pixel array unit, including:
      light-receiving surface;
      a plurality of unit pixels; and
      a color filter array unit disposed on a light-incident side of the pixel array unit, the color filter array unit including a plurality of white light filters, a plurality of green light filters, a plurality of red light filters, and a plurality of blue light filters, and
   a conversion processing unit configured to receive output signals from the pixel array unit corresponding to a color filter arrangement of the color filter array unit,
wherein first, second, and third signals from first, second, and third unit pixels corresponding to a white light filter and two green light filters are added together.

* * * * *